US007665008B2

(12) United States Patent
Xia et al.

(10) Patent No.: US 7,665,008 B2
(45) Date of Patent: Feb. 16, 2010

(54) METHOD AND APPARATUS FOR IMPLEMENTING A LOW DENSITY PARITY CHECK CODE IN A WIRELESS SYSTEM

(75) Inventors: Bo Xia, Tempe, AZ (US); Eric A. Jacobsen, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 706 days.

(21) Appl. No.: 10/815,133

(22) Filed: Mar. 31, 2004

(65) Prior Publication Data

US 2005/0166131 A1 Jul. 28, 2005

Related U.S. Application Data

(60) Provisional application No. 60/536,071, filed on Jan. 12, 2004.

(51) Int. Cl.
*H03M 13/00* (2006.01)

(52) U.S. Cl. ....................................... 714/758; 714/781

(58) Field of Classification Search ................. 714/758, 714/781

See application file for complete search history.

(56) References Cited

U.S. PATENT DOCUMENTS

| | | | | |
|---|---|---|---|---|
| 6,198,460 | B1 * | 3/2001 | Brankovic | 343/879 |
| 6,282,167 | B1 | 8/2001 | Michon et al. | |
| 6,683,855 | B1 * | 1/2004 | Bordogna et al. | 370/244 |
| 6,785,341 | B2 | 8/2004 | Walton et al. | |
| 6,831,902 | B1 * | 12/2004 | Dougherty et al. | 370/328 |
| 6,862,552 | B2 * | 3/2005 | Goldstein et al. | 702/179 |
| 2002/0183010 | A1 | 12/2002 | Catreux et al. | |
| 2003/0032390 | A1 | 2/2003 | Geile et al. | |
| 2004/0001535 | A1 | 1/2004 | Kannan et al. | |
| 2004/0062193 | A1 | 4/2004 | Ma et al. | |
| 2004/0132496 | A1 | 7/2004 | Kim et al. | |
| 2004/0151145 | A1 | 8/2004 | Hammerschmidt | |
| 2004/0190637 | A1 | 9/2004 | Maltsev et al. | |
| 2005/0128935 | A1 | 6/2005 | Tang et al. | |
| 2005/0152328 | A1 | 7/2005 | Sadri et al. | |

FOREIGN PATENT DOCUMENTS

| | | | |
|---|---|---|---|
| EP | 1267513 | A2 | 12/2002 |
| WO | WO-0076115 | A1 | 12/2000 |

(Continued)

OTHER PUBLICATIONS

Ben Lu, Xiaodong Wang, and Krishna R. Narayanan; LDPC-Based Space-Time Coded OFDM Systems Over Correlated Fading Channels: Performance Analysis and Receiver Design; IEEE Transactions on Communications, vol. 50, No. 1, Jan. 2002, pp. 74-88.*

(Continued)

*Primary Examiner*—Joseph D Torres
(74) *Attorney, Agent, or Firm*—The Law Offices of John C. Scott, LLC; John C. Scott

(57) ABSTRACT

A low density parity check (LDPC) code is used within a wireless apparatus to perform forward error correction (FEC) coding. In at least embodiment of the invention, a (2000, 1600) bit-length LDPC code is used.

23 Claims, 5 Drawing Sheets

FOREIGN PATENT DOCUMENTS

| | | | |
|---|---|---|---|
| WO | WO-0249306 | A2 | 6/2002 |
| WO | WO-2005069527 | A1 | 7/2005 |
| WO | WO-2005071876 | A1 | 8/2005 |

OTHER PUBLICATIONS

Futaki, H. , et al., "Performance of Low-Density Parity-Check (LDPC) Coded OFDM Systems", *IEEE International Conference on Communications, 1 of 5*, ICC 2002,(Apr. 28, 2002), 1696-1700.

Sollenberger, N. R., et al., "Receiver Structures for Multiple Access OFDM", *Vehicular Technology Conf., IEEE 49th Houston*, 1 (May 16, 1999),468-472.

Syed, M. J., et al., "LDPC-based Space-time Coded OFDM Systems Performances over Correlated Fading Channels", *Communications, APCC 2003. The 9th Asia-Pacific Conference 2* (Sep. 21, 2003),590-594.

Yang, M. , et al., "Design of Efficiently Encodable Moderate Length High-Rate Irregular LDPC Codes", *Proceedings of the Annual Conference on Communication Control and Computing*, Oct. 2, 2002 ,1415-1424.

"International Search Report PCT/US2005/000737", 14 pages.

"International Search Report PCT/US2005/000948", 19 pages.

* cited by examiner

METHOD AND APPARATUS FOR IMPLEMENTING A LOW DENSITY PARITY CHECK CODE IN A WIRELESS SYSTEM

The present application claims the benefit of U.S. Provisional Application Ser. No. 60/536,071, filed Jan. 12, 2004, entitled "A SYSTEM APPARATUS AND ASSOCIATED METHODS FOR HIGH THROUGHPUT WIRELESS NETWORKING."

A portion of the disclosure of this patent document contains material which is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

Technical Field

The invention relates generally to wireless communications and, more particularly, to error correction coding schemes for use in wireless systems.

Background

Wireless channels are often plagued by noise and/or interference effects that can compromise the quality of the communication flowing there through. One strategy for addressing these concerns involves the use of a forward error correction code to encode data before it is transmitted. The forward error correction code adds redundant information to the original data that allows errors in transmission to be corrected after signal reception. Structures and techniques are needed for reliably and efficiently implementing forward error correction in wireless systems.

DETAILED DESCRIPTION

Figure 1:
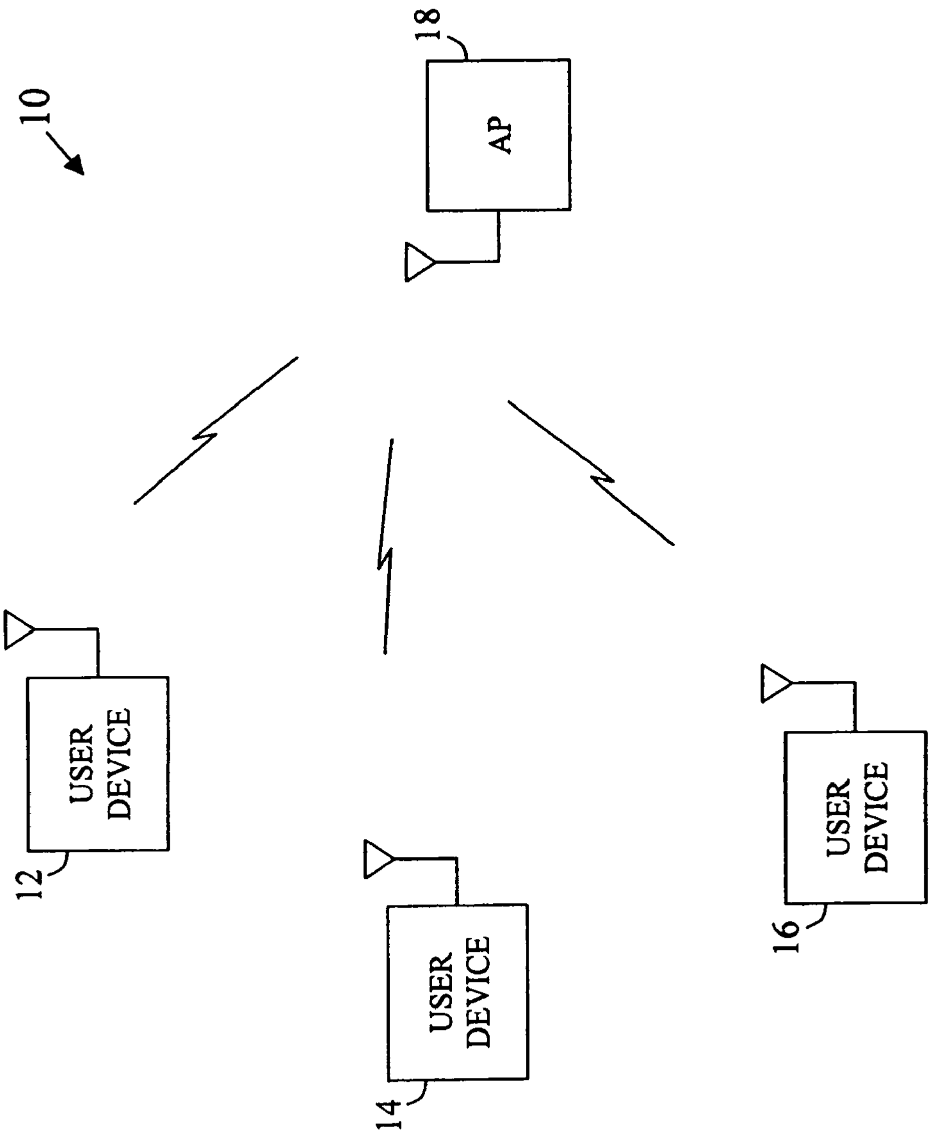
FIG. 1 is a block diagram illustrating an example wireless network arrangement in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating an example wireless network arrangement 10 in accordance with an embodiment of the present invention. As illustrated, one or more wireless user devices 12, 14, 16 are communicating with a wireless access point (AP) 18 via corresponding wireless links. The AP 18 provides access to a network for the user devices 12, 14, 16 (e.g., a private network, a public network, the Internet, a public switched telephone network, a local area network (LAN), a municipal area network (MAN), a wide area network (WAN), and/or others). The wireless user devices 12, 14, 16 may include any form of device that may be used to wirelessly access a network including, for example, a laptop, desktop, palmtop, or tablet computer having wireless networking capability, a personal digital assistant (PDA) having wireless networking capability, a cellular telephone or other handheld wireless communicator, a pager, and/or others. The wireless links between the wireless devices 12, 14, 16 and the access point 18 may experience noise and/or various interference effects that can compromise communication quality. To overcome such problems, forward error correction may be used. That is, a forward error correction (FEC) coder may be provided within a transmitting device to encode data before it is wirelessly transmitted. When the signal is received, a FEC decoder may be used to decode the signal. The FEC decoder is capable of detecting and correcting one or more errors in the received data. In this manner, errors caused by noise and/or interference effects in the channel may be overcome. In one aspect of the present invention, a low density parity check (LDPC) code is used as a FEC code within a wireless device.

Figure 2:
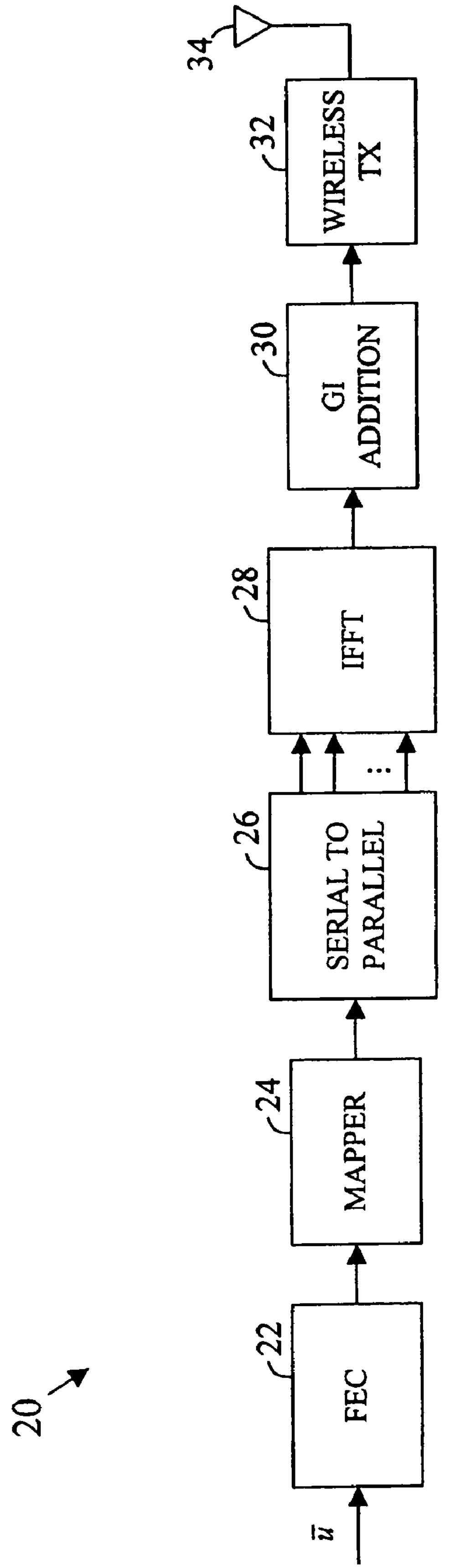
FIG. 2 is a block diagram illustrating an example orthogonal frequency division multiplexing (OFDM) transmitter chain that may be used within a wireless device in accordance with an embodiment of the present invention.

In at least one embodiment, features of the present invention are implemented within an orthogonal frequency division multiplexing (OFDM) based wireless system. FIG. 2 is a block diagram illustrating an example OFDM transmitter chain 20 that may be used within a wireless device (e.g., a wireless user device, a wireless access point, etc.) in accordance with an embodiment of the present invention. As illustrated, the transmitter chain 20 may include one or more of: a FEC coder 22, a mapper 24, a serial to parallel converter 26, an inverse fast Fourier transform (IFFT) unit 28, a guard interval (GI) addition unit 30, a wireless transmitter 32, and one or more transmit antennas 34. The FEC coder 22 receives user data at an input thereof and encodes the data using a forward error correction code. As will be described in greater detail, in at least one embodiment, the FEC coder 22 may utilize a special form of low density parity check (LDPC) code to perform the coding. The mapper 24 receives code words from the FEC coder 22 and maps the code words based upon a predetermined modulation constellation. Any form of modulation scheme may be used, including, for example, binary phase shift keying (BPSK), quadrature phase shift keying (QPSK), 16 symbol quadrature amplitude modulation (16-QAM), 64 symbol quadrature amplitude modulation (64-QAM), and/or others. The serial to parallel converter 26 transforms a serial stream of modulation symbols output by the mapper 24 into a parallel format for delivery to the IFFT 28. The IFFT 28 performs an inverse fast Fourier transform on the modulation symbols input thereto to convert the symbols from a frequency domain representation to a time domain representation. Although illustrated as an inverse fast Fourier transform in FIG. 2, it should be understood that any form of inverse discrete Fourier transform may be used in the transmitter chain 20.

The GI addition unit 30 adds a guard interval to the time domain signal representation output by the IFFT 28. Guard intervals are placed in transmitted signals to, among other things, increase the immunity of the signals to, for example, multipath effects in the channel. The wireless transmitter 32 is operative for performing functions such as, for example, upconverting the signal, power amplifying the signal, etc. before transmission. One or more transmit antennas 34 may be provided to facilitate signal transmission into the wireless channel. Any form of antenna(s) may be used including, for example, a dipole, a patch, a helix, an antenna array, and/or others. In at least one embodiment, antenna diversity techniques are implemented. In some other embodiments, multiple input, multiple output (MIMO) techniques are used. Other forms of wireless transducer may alternatively be used instead of antennas (e.g., a infrared (IR) diode in an IR-based wireless system, etc.).

It should be appreciated that the transmitter chain 20 of FIG. 2 is merely illustrative of one possible transmitter architecture that may utilize features of the invention. Many other architectures may alternatively be used. In at least one embodiment, a transmitter chain is used that is configured in accordance with an IEEE 802.11 wireless networking standard (ANSI/IEEE Std 802.11-1999 Edition and its progeny). Other wireless standards may alternatively or additionally be used.

As described above, in at least one embodiment of the invention, the FEC coder 22 may utilize a low density parity check (LDPC) code to perform the forward error correction coding. In a general analysis, an (n,k) LDPC code has k information bits and n coded bits with code rate r=k/n. A parity check matrix H of dimension (n−k)xn may be developed that fully describes the LDPC code. The parity check matrix H defines a set of equations:

$$\bar{v}\cdot H^t=0 \qquad \text{(Equation 1)}$$

for all code words v of the code, where $H^t$ is the transpose of parity check matrix H. An example parity check matrix H and the corresponding expanded parity check equations are shown below for an LDPC code (9,3):

$$H=\begin{bmatrix} 1 & & & 1 & & & 1 & & \\ & 1 & & & 1 & & & 1 & \\ & & 1 & & & 1 & & & 1 \\ 1 & & & & 1 & & & & 1 \\ & 1 & & & & 1 & 1 & & \\ & & 1 & 1 & & & & 1 & \end{bmatrix} \Longleftrightarrow \begin{cases} v_1+v_4+v_7=0 \\ v_2+v_5+v_8=0 \\ v_3+v_6+v_9=0 \\ v_1+v_5+v_9=0 \\ v_2+v_6+v_7=0 \\ v_3+v_4+v_8=0 \end{cases}.$$

where $V_k$ represents the bits of the codeword v. LDPC codes may be encoded via a generator matrix G. For a given information vector $\bar{u}$ to be encoded, the corresponding code word $\bar{v}$ may be generated as follows:

$$\bar{v}=\bar{u}\cdot G \qquad \text{(Equation 2)}$$

From equations 1 and 2, it follows that:

$$\bar{u}\cdot G\cdot H^t=0 \qquad \text{(Equation 3)}$$

Since $\bar{u}$ is an arbitrary vector, the following relationship applies:

$$G\cdot H^t=0 \qquad \text{(Equation 4)}$$

For a given parity check matrix H, there will typically be $2^k$ different G matrices that satisfy Equation 4, provided the rank of the H matrix is n−k. One of these generator matrices has the format:

$$G=[I_{k\times k}|P_{k\times(n-k)}] \qquad \text{(Equation 5)}$$

where $I_{k\times k}$ is a k×k identity matrix and $P_{k\times(n-k)}$ is a k×n−k matrix. A coder implementing the generator matrix of Equation 5 is known as a systematic encoder since the first k bits of the code word are identical to the k information bits.

The parity check matrix H for an LDPC code may be represented as having two sub-matrices, as follows:

$$H=[H_1|H_2] \qquad \text{(Equation 6)}$$

where sub-matrix $H_1$ has dimension (n−k)*k and sub-matrix $H_2$ has dimension (n−k)*(n−k). According to Equation 4, and assuming that $H_2$ is non-singular, it follows that:

$$I\cdot H_1^t+P\cdot H_2^t=0 \Rightarrow P=H_1^tH_2^{-t} \qquad \text{(Equation 7)}$$

and the codeword $\bar{v}$ is in the format:

$$\bar{v}=\bar{u}\cdot G=[\bar{u}|\bar{u}P]=[\bar{u}|\bar{u}H_1^tH_2^{-t}] \qquad \text{(Equation 8)}$$

For some LDPC codes, high encoding complexity may arise if a high density $H_2^{-t}$ matrix is used in Equation 8 above. However, in at least one embodiment of the present invention, the sub-matrix $H_2$ is implemented as f(D)=1+D, which allows $H_2^{-t}$ to be realized using a well known differential encoder. The encoding process in such an embodiment may be expressed as:

$$\bar{v}=[\bar{u}\mid \bar{u}H_1^tH_2^{-t}]=\left[\bar{u}\,\middle|\,\bar{u}H_1^t\frac{1}{1+D}\right]. \qquad \text{(Equation 9)}$$

where D is a unit delay.

Figure 3:
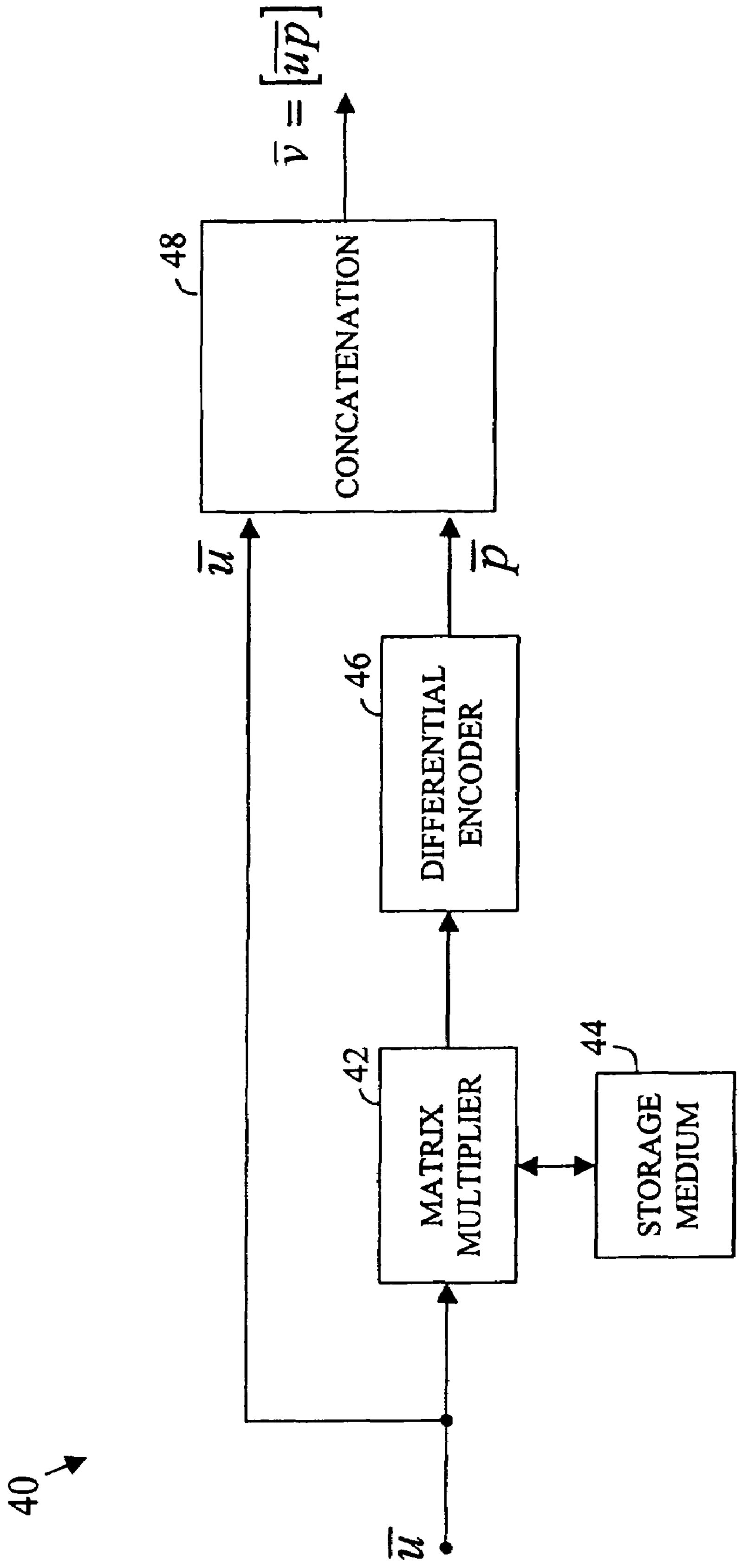
FIG. 3 is a block diagram illustrating an example LDPC encoder in accordance with an embodiment of the present invention.

FIG. 3 is a block diagram illustrating an example LDPC encoder 40 in accordance with an embodiment of the present invention. The LDPC encoder 40 may be implemented as part of, for example, the FEC unit 22 of FIG. 2 or FEC functionality within other wireless devices. As illustrated, the LDPC encoder 40 includes: a matrix multiplier 42, a storage medium 44, a differential encoder 46, and a concatenation unit 48. The storage medium 44 is operative for storing a representation of the sub-matrix $H_1$ (or the entire parity check matrix H) for use in LDPC encoding. The matrix representation stored on the storage medium 44 may be in conventional matrix form, in list file form (as in Appendix A), in transpose form, or in any other form that is descriptive of the content of the matrix. Although not shown, the information stored within the storage medium 44 may also be used to perform LDPC decoding within the corresponding wireless apparatus (i.e., during receive operations). Any type of storage medium may be used including, for example, a semiconductor memory, a read only memory (ROM), a random access memory (RAM), an erasable programmable read only memory (EPROM), an electrically erasable programmable read only memory (EEPROM), a flash memory, a magnetic or optical card, a magnetic disk, an optical disk, a CD-ROM, a magneto-optical disk, and/or other forms of machine readable storage. The storage medium 44 may be a dedicated storage unit (e.g., to store only the parity check matrix H, the sub-matrix $H_1^{-t}$, etc.) or it may also be used to store other information.

The matrix multiplier 42 receives an information vector $\bar{u}$ at an input thereof. The matrix multiplier 42 then performs a matrix multiplication of the vector $\bar{u}$ and the sub-matrix $H_1^t$. The result of the matrix multiplication is then delivered to the differential encoder 46 which performs a differential encoding operation thereon $$\left(\text{i.e., } \frac{1}{1+D}\right).$$

The matrix multiplier 42 and the differential encoder 46 may operate independently of one another or their operation may be pipelined (e.g., once a bit is output from the matrix multiplier 42 it is immediately used by the differential encoder 46). The output of the differential encoder 46 is vector $\bar{p}$. The concatenation unit 48 concatenates the original information vector $\bar{u}$ with the vector $\bar{p}$ to generate the codeword $\bar{v}$. The codeword $\bar{v}$ may then be delivered to a next processing stage within a wireless transmitter chain (e.g., mapper 24 in the transmitter chain 20 of FIG. 2).

In at least one embodiment of the present invention, a (2000, 1600) LDPC code is implemented within the transmitter chain of a wireless apparatus. A list file describing a parity check matrix H that is used in one such implementation is set out in Appendix A herein. The list file of Appendix A describes the data within the corresponding parity check matrix. The parity check matrix H of Appendix A (or a portion thereof) may be stored within, for example, the storage medium 44 of FIG. 3. In at least one embodiment, only the portion of the parity check matrix H of Appendix A that corresponds to sub-matrix $H_1$ (or the transpose thereof) is stored within the storage medium 44 (i.e., the columns having a weight of 4 in the matrix description of Appendix A). The sub-matrix $H_1$ of the parity check matrix H of Appendix A is relatively low-density with a uniform column weight of four. The LDPC code corresponding to the matrix H of Appendix A has been designed to provide good performance with variable-length data blocks, while still achieving a manageable implementation complexity. The codeword length has been selected to provide a good tradeoff between performance and complexity for use in wireless (and some wireline) applications. It should be appreciated that small variations may be made to the parity check matrix H of Appendix A with little or no degradation in performance. As used herein, a matrix is "substantially as described in the list file of Appendix A" if the matrix is the same as the matrix described in Appendix A or the matrix varies from the matrix described in Appendix A in a manner that produces little or no degradation in performance.

It should be understood that the parity check matrix H described in Appendix A is merely one example of a parity check matrix that may be used in accordance with embodiments of the present invention. In other embodiments, other parity check matrices may be used.

Figure 4:
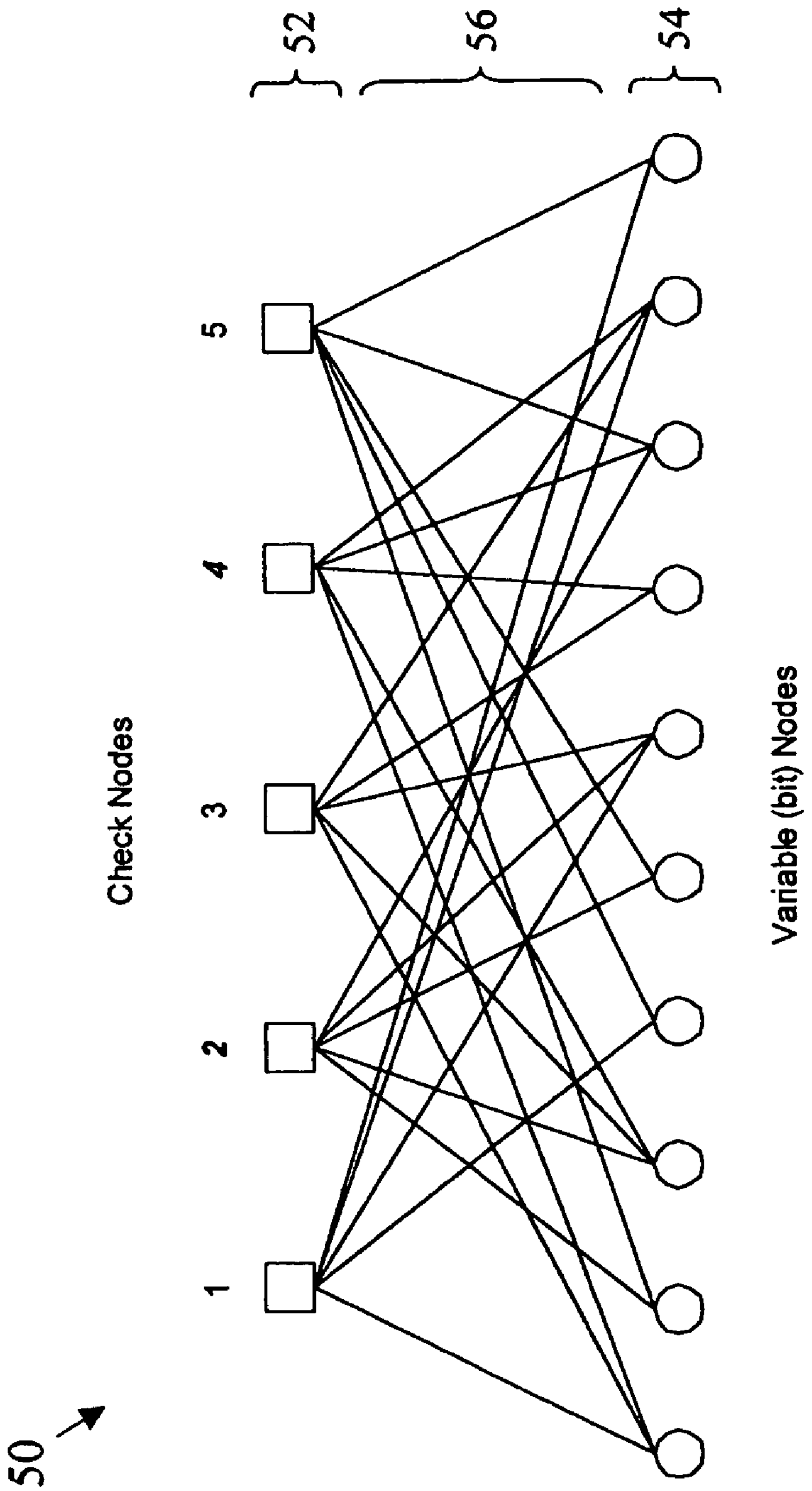
FIG. 4 is a diagram illustrating a Tanner graph that describes an example LDPC code.

As described above, the parity check matrix H of Appendix A is described using a list file. This method of matrix description will be discussed below. A parity check matrix H will typically include ones and zeros in locations throughout the matrix. The list file of Appendix A describes the locations of these one and zeros for the subject matrix. A full definition of an LDPC code can be accomplished through identification of the locations of the "edges" between the "variable nodes" (codeword bits) and "check nodes" (parity relationships). FIG. 4 is a diagram illustrating a Tanner graph 50 that describes an example LDPC code. The Tanner graph 50 illustrates the arrangement of the check nodes 52, the variable nodes 54, and the "edges" 56 connecting them for the corresponding code. The codeword is made up of the bits represented by the variable nodes 54. For the code of FIG. 4, each codeword has ten bits. Each check node 52 represents a parity relationship between the codeword bits represented by the variable nodes 54 connected to it by the edges 56. The number of edges 56 connected to a check node 52 is called the "degree" of the check node 52. Likewise, the number of edges 56 connected to a variable node 54 is called the "degree" of the variable node 54. For the illustrated code, all check nodes 52 are of degree eighteen, all variable nodes 54 related to the systematic information bits are of degree four, and all variable nodes 54 corresponding to parity bits are of degree two, except for the last, which is of degree one.

Since the organization of the edges in LDPC codes appears random, the edge locations must be explicitly defined by means of a list. A straightforward means of describing a code by means of such a list follows. The matrix $H=[H_1\ H_2]$ comprises a regular matrix $H_1$ with constant column weight 4 and a weight-2 lower-triangular-inverse matrix $H_2$ for efficient encoding purposes. An LDPC code lists file may contain three parts to fully describe a parity check matrix H (i.e., all of the ones of the matrix): (a) matrix size (column, row); (b) column weights (numbers of ones) of each column; and (c) locations of ones in each column. It should be noted that the convention for the indices is zero-based, with the index of the first element of each column being zero. An example H matrix for a (9,3) LDPC code follows:

$$H = \begin{bmatrix} 1 & 0 & 0 & 1 & 0 & 0 & 1 & 0 & 0 \\ 0 & 1 & 0 & 0 & 1 & 0 & 0 & 1 & 0 \\ 0 & 0 & 1 & 0 & 0 & 1 & 0 & 0 & 1 \\ 1 & 0 & 0 & 0 & 0 & 1 & 0 & 1 & 0 \\ 0 & 1 & 0 & 1 & 0 & 0 & 0 & 0 & 1 \\ 0 & 0 & 1 & 0 & 1 & 0 & 1 & 0 & 0 \end{bmatrix}$$

and the corresponding list file is:

```
9 6
2 2 2 2 2 2 2 2 2
0 3
1 4
2 5
0 4
1 5
2 3
0 5
1 3
```

The list file set out in Appendix A for the (2000, 1600) LDPC code follows the same basic approach.

Figure 5:
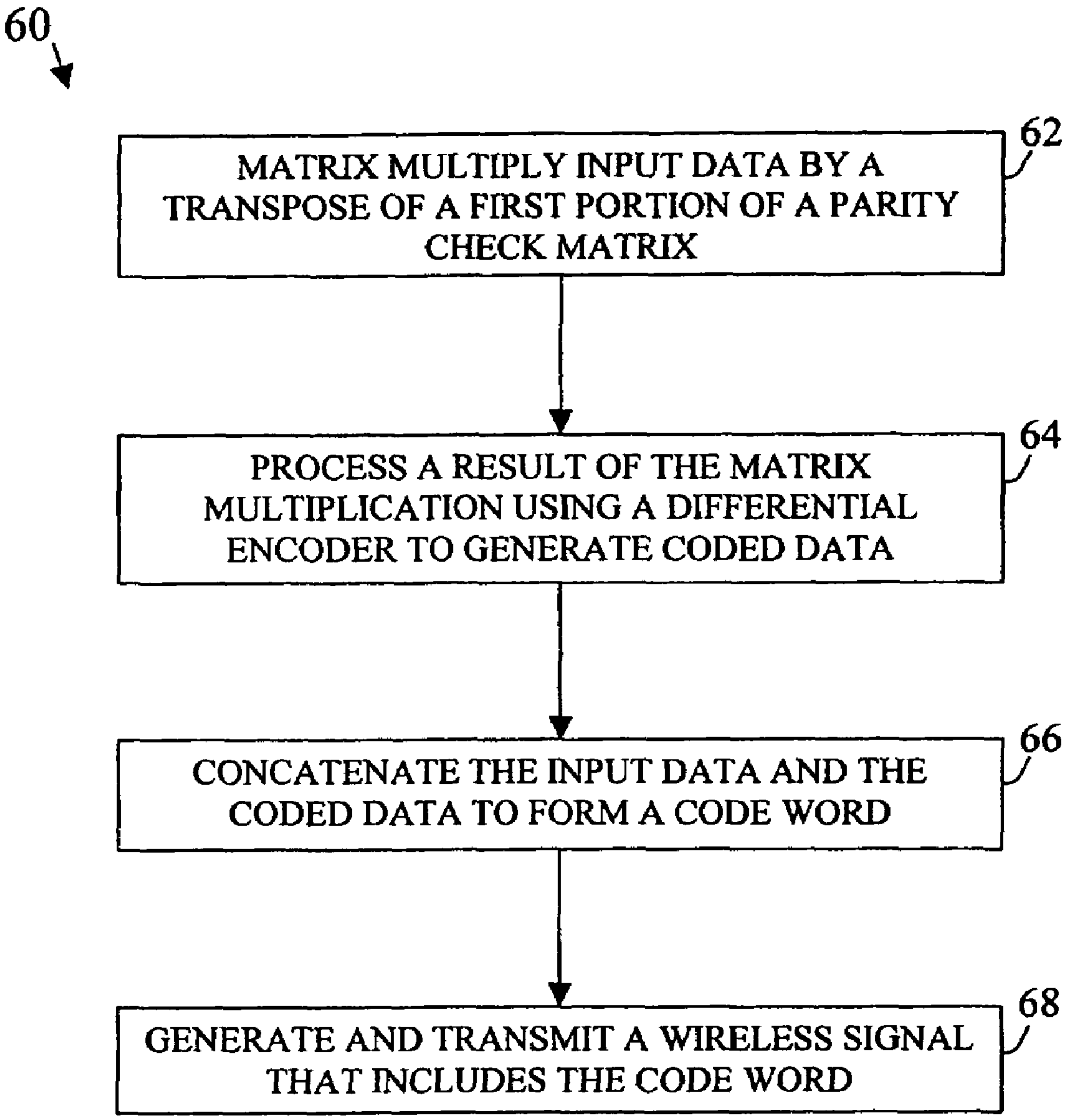
FIG. 5 is a flowchart illustrating an example method for use in processing data within a wireless device in accordance with an embodiment of the present invention.

FIG. 5 is a flowchart illustrating an example method 60 for use in processing data within a wireless device in accordance with an embodiment of the present invention. Input data is first matrix multiplied by a transpose of a first portion (i.e., $H_1^t$) of a parity check matrix H (block 62). The parity check matrix H (or some portion thereof) may be stored within a storage medium of the wireless device. In at least one embodiment, the parity check matrix H described in Appendix A is used. A result of the matrix multiplication may then be processed by a differential encoder to generate coded data (block 64). The original input data and the coded data are then concatenated to form a code word (block 66). A wireless signal is subsequently generated and transmitted that includes the code word (block 68). Other code words may also be part of the transmission. In at least one embodiment, the wireless signal is an orthogonal frequency division multiplexing (OFDM) signal. In at least one implementation, the method 60 of FIG. 5 (or a variant thereof) is embodied as a plurality of instructions stored on a machine readable storage medium that may be executed by a digital processing device.

The inventive techniques and structures may be used in any of a wide variety of different wireless devices, components, and systems. For example, in various embodiments, features of the invention may be implemented within laptop, desktop, palmtop, and/or tablet computers having wireless networking functionality, personal digital assistants (PDAs) having wireless networking functionality, cellular telephones and other handheld wireless communicators, pagers, satellite communication devices, devices for use in point to point wireless links, devices for use in local multipoint distribution systems (LMDS) and/or multi-channel multipoint distribution services (MMDS), wireless network interface cards (NICs) and other network interface structures, integrated circuits, and/or other devices.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

APPENDIX A

The list file for an example (2000, 1600) LDPC code is set out below:

```
2000 400
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 1
143 225 316 323
92 140 191 358
69 315 329 343
6 121 205 284
58 66 254 337
1 47 178 395
129 151 212 228
66 146 243 265
22 140 157 180
120 208 313 321
290 350 370 382
38 174 250 377
19 116 357 372
81 91 164 307
180 186 241 251
239 254 331 342
107 149 250 295
73 221 295 362
75 97 242 279
32 197 244 313
245 248 276 296
59 230 322 347
102 165 234 378
173 245 356 376
57 230 240 314
1 89 153 166
25 32 264 342
265 276 321 324
57 211 274 360
12 291 311 348
34 220 258 282
52 58 109 379
116 248 337 369
```

APPENDIX A-continued

| The list file for an example (2000, 1600) LDPC code is set out below: | | |
|---|---|---|
| 56 94 184 215 | 17 246 291 364 | 87 146 183 278 |
| 84 119 337 344 | 125 157 227 390 | 42 96 318 361 |
| 2 15 62 44 398 | 122 205 279 348 | 32 176 312 361 |
| 9 106 200 336 | 61 298 340 380 | 69 258 310 389 |
| 22 37 150 270 | 12 31 256 328 | 1 84 182 300 |
| 3 110 326 367 | 119 163 178 217 | 45 124 161 396 |
| 235 276 290 335 | 61 129 185 200 | 15 76 99 101 |
| 82 187 193 297 | 34 38 104 295 | 62 248 354 375 |
| 43 183 297 379 | 119 289 349 377 | 78 258 262 311 |
| 194 239 243 293 | 50 314 322 367 | 181 265 364 368 |
| 90 144 228 350 | 28 48 248 382 | 60 168 227 254 |
| 170 206 321 395 | 32 41 128 201 | 162 231 270 377 |
| 72 138 254 300 | 91 115 220 368 | 14 102 139 158 |
| 25196 201 279 | 45 151 196 265 | 28 79 155 318 |
| 56 59 362 379 | 152 190 198 317 | 28 40 63 236 |
| 28 121 170 277 | 157 212 242 275 | 163 181 258 279 |
| 61 273 351 386 | 2 40 249 283 | 158 176 273 334 |
| 71 76 232 328 | 195 280 299 345 | 80 236 256 380 |
| 62 109 190 201 | 142 151 220 395 | 74 156 214 358 |
| 111 162 190 227 | 70 121 252 382 | 176 229 251 283 |
| 189 272 288 302 | 52 244 279 297 | 19 104 114 162 |
| 14 49 147 334 | 22 131 256 349 | 141 284 291 358 |
| 33 53 213 238 | 47 52 339 346 | 77 123 157 361 |
| 53 219 368 379 | 50 288 342 388 | 141 154 215 338 |
| 126 149 188 339 | 26 87 247 283 | 55 294 296 298 |
| 108 118 182 393 | 67 127 132 136 | 80 109 272 364 |
| 0 37 160 295 | 146 264 321 323 | 43 206 287 363 |
| 158 200 335 356 | 210 275 319 346 | 81 175 206 261 |
| 11 20 229 397 | 57 160 252 261 | 31 94 275 317 |
| 77 86 212 250 | 26 54 170 197 | 10 123 141 279 |
| 79 193 262 336 | 120 218 229 341 | 44 64 157 270 |
| 43 104 125 376 | 44 53 124 323 | 160 243 290 373 |
| 55 114 134 293 | 0 113 315 358 | 39 217 262 324 |
| 240 283 299 333 | 110 144 246 298 | 19 185 312 389 |
| 0 24 57 100 | 89 91 99 346 | 211 271 277 291 |
| 46 84 322 341 | 21 32 216 393 | 19 148 155 324 |
| 5 43 45 221 | 37 170 209 342 | 24 94 124 314 |
| 29 217 274 301 | 49 58 357 399 | 3 85 193 349 |
| 81 93 116 278 | 18 23 31 373 | 68 175 202 253 |
| 93 174 213 231 | 159 172 195 366 | 139 160 337 377 |
| 64 201 251 385 | 213 335 337 378 | 21 224 249 398 |
| 76 134 278 370 | 1 103 159 277 | 113 122 206 327 |
| 71 93 182 398 | 96 159 209 387 | 7 10 156 245 |
| 140 182 192 235 | 3 126 132 163 | 35 89 248 252 |
| 161 291 324 387 | 66 88 169 271 | 6 55 319 345 |
| 31 232 237 350 | 88 197 201 387 | 107116 223 271 |
| 30 184 235 387 | 1 51 135 149 | 168 240 261 384 |
| 136 226 269 327 | 257 294 331 356 | 54 204 295 351 |
| 4 93 136 167 | 204 260 288 294 | 3 51 146 299 |
| 47 148 309 348 | 45 144 185 383 | 74 184 307 361 |
| 73 225 252 290 | 173 310 329 362 | 9 202 272 387 |
| 44 213 361 386 | 15 165 305 348 | 106 198 281 329 |
| 79 319 361 381 | 27 66 85 182 | 36 105 225 236 |
| 74 251 339 356 | 47 235 238 246 | 90 139 183 299 |
| 100 105 246 293 | 230 276 293 367 | 152 160 292 354 |
| 68 101 191 285 | 118 150 267 324 | 11 115 227 236 |
| 32 103 323 355 | 68 82 309 398 | 152 202 211 373 |
| 122 188 228 305 | 72 154 226 231 | 4 173 346 374 |
| 6 77 291 397 | 76 135 151 384 | 132 197 238 279 |
| 70 76 259 276 | 39 48 80 309 | 16 94 150 222 |
| 72 270 335 348 | 0 178 305 353 | 241 344 375 386 |
| 93 147 255 312 | 88 136 196 321 | 31 121 161 231 |
| 92 112 259 388 | 37 95 222 300 | 9 33 197 350 |
| 9 18 61 308 | 23 343 358 369 | 87 197 233 312 |
| 3 137 139 257 | 195 252 303 349 | 100 111 129 368 |
| 165 217 345 354 | 9 81 102 317 | 184 278 289 346 |
| 78 134 263 280 | 20 219 285 316 | 76 177 227 356 |
| 186 213 227 303 | 219 281 304 354 | 11 132 246 314 |
| 68 194 294 346 | 33 121 319 351 | 46 93 103 309 |
| 35 225 284 312 | 21 157 191 260 | 20 33 64 196 |
| 117 188 340 346 | 08 83 03 307 | 111 134 194 204 |
| 258 299 306 331 | 13 23 62 268 | 76 116 140 238 |
| 83 194 207 349 | 13 173 279 320 | 189 298 326 381 |
| 43 141 175 329 | 117 189 253 392 | 235 317 320 333 |
| 0 68 170 262 | 32 40 57 350 | 127 301 348 376 |
| 25 36 153 309 | 57 123 148 368 | 51 286 309 377 |
| 57 62 273 323 | 18 96 164 326 | 17 70 139 187 |

APPENDIX A-continued

The list file for an example (2000, 1600) LDPC code is set out below:

| | | |
|---|---|---|
| 7 19 75 264 | 84 103 107 359 | 54 180 184 344 |
| 21 254 259 366 | 92 338 350 355 | 85 311 318 327 |
| 8 97 156 172 | 16 70 242 338 | 263 312 364 369 |
| 9 185 313 330 | 20 74 141 179 | 97 149 198 336 |
| 55 219 253 393 | 159 246 248 365 | 31 141 151 285 |
| 86 120 185 233 | 207 292 387 399 | 72 163 187 311 |
| 41 136 191 242 | 38 148 303 347 | 24 54 249 297 |
| 194 265 303 393 | 68 113 296 389 | 64 143 322 360 |
| 256 285 310 399 | 12 257 286 325 | 53 73 122 256 |
| 103 247 275 378 | 50 287 294 327 | 100 138 214 226 |
| 115 218 225 285 | 149 259 356 367 | 265 348 373 378 |
| 98 196 217 328 | 3 12 178 309 | 42 62 113 174 |
| 177 267 306 350 | 63 92 166 368 | 29 313 349 358 |
| 82 299 320 395 | 97 190 199 363 | 154 179 217 268 |
| 139 251 364 381 | 13 86 92 308 | 164 289 380 392 |
| 42 118 178 194 | 132 141 221 322 | 109 165 236 312 |
| 73 100 198 286 | 213 257 348 396 | 92 141 193 238 |
| 68 249 292 376 | 91 147 294 325 | 190 243 267 275 |
| 13 216 221 256 | 14 27 48 222 | 95 143 203 393 |
| 127 138 177 398 | 11 81 110 360 | 130 213 264 308 |
| 20 69 239 264 | 10 50 357 393 | 102 133 217 226 |
| 69 88 116 295 | 89 122 207 362 | 4 16 44 89 |
| 108 217 273 322 | 3 166 190 305 | 103 165 177 358 |
| 26 287 306 343 | 155 171 289 336 | 53 217 342 383 |
| 8 18 136 152 | 34 37 293 301 | 58 88 126 370 |
| 110 240 245 334 | 143 189 255 338 | 4 214 243 383 |
| 225 255 278 310 | 38 75 137 166 | 5 96 155 354 |
| 63 168 170 303 | 62 92 124 366 | 7 61 214 237 |
| 8 17 255 314 | 73 83 105 136 | 90 241 261 367 |
| 28 92 98 200 | 69 134 200 366 | 39 161 202 206 |
| 112 201 244 392 | 179 324 366 386 | 101 132 135 250 |
| 134 216 344 383 | 72 82 188 192 | 117 191 213 352 |
| 21 97 115 396 | 100 120 189 375 | 132 233 270 303 |
| 28 69 120 380 | 244 252 318 329 | 16 251 266 370 |
| 34 259 267 314 | 3 105 116 203 | 41 45 60 99 |
| 55 72 87 223 | 280 282 288 365 | 182 197 276 331 |
| 43 180 185 252 | 38 196 330 369 | 40 257 262 322 |
| 23 113 133 277 | 20 31 113 381 | 148 208 332 352 |
| 258 285 347 350 | 56 173 205 390 | 127 159 253 290 |
| 246 253 318 399 | 2 30 165 366 | 273 289 325 341 |
| 12 78 90 369 | 41 75 169 302 | 95 145 231 297 |
| 17 93 96 102 | 210 271 330 334 | 70 110 225 313 |
| 109 162 318 360 | 60 109 199 348 | 50 112 166 302 |
| 22 83 151 290 | 27 89 214 388 | 68 97 128 218 |
| 141 191 240 266 | 77 79 83 289 | 90 264 269 280 |
| 25 90 138 390 | 119 236 323 383 | 22 132 258 368 |
| 81 113 265 382 | 1 44 271 372 | 65 124 129 325 |
| 88 142 210 283 | 25 42 104 215 | 95 105 111 385 |
| 10 40 43 140 | 144 153 357 362 | 109 233 250 302 |
| 2 195 268 328 | 133 153 273 383 | 8 33 80 318 |
| 117 240 257 374 | 152 174 269 355 | 51 253 281 288 |
| 298 332 350 365 | 107 193 210 320 | 209 237 346 391 |
| 60 122 240 313 | 194 298 317 331 | 12 198 221 269 |
| 157 215 274 397 | 22 112 139 222 | 9 141 229 306 |
| 11 41 164 274 | 147 152 221 365 | 0 114 219 300 |
| 67 76 92 104 | 20 48 130 353 | 242 289 318 335 |
| 19 192 305 344 | 58 100 125 172 | 41 90 163 215 |
| 23 35 125 224 | 79 181 242 313 | 65 80 99 167 |
| 152 163 352 385 | 174 254 304 321 | 269 296 303 356 |
| 40 161 165 329 | 70 129 283 385 | 45 106 232 346 |
| 113 215 245 378 | 18 79 296 345 | 86 195 293 391 |
| 80 168 262 382 | 14 25 34 52 | 140 193 245 321 |
| 81 136 165 239 | 31 88 212 226 | 88 150 183 380 |
| 2 42 248 323 | 26 53 123 165 | 230 253 315 373 |
| 111 127 157 330 | 101 108 248 328 | 53 184 258 263 |
| 79 125 239 341 | 49 115 190 395 | 17 79 261 286 |
| 147 172 187 397 | 23 119 139 282 | 94 293 302 397 |
| 230 245 277 352 | 27 206 209 324 | 170 218 358 376 |
| 49 202 350 381 | 203 221 332 356 | 61 246 287 292 |
| 34 56 167 242 | 181 190 288 379 | 61 162 245 303 |
| 36 58 61 83 | 38 73 249 368 | 25 286 333 355 |
| 107 110 133 251 | 45 49 264 394 | 159 241 263 354 |
| 100 245 295 330 | 89 112 218 316 | 134 186 305 327 |
| 16 71 175 397 | 144 186 297 343 | 33 38 283 301 |
| 106 206 229 236 | 152 177 233 237 | 17 44 159 398 |
| 177 308 371 387 | 74 171 223 334 | 108 167 174 374 |
| 90 105 172 257 | 124 315 322 359 | 94 261 312 341 |

APPENDIX A-continued

The list file for an example (2000, 1600) LDPC code is set out below:

| | | |
|---|---|---|
| 93 165 180 353 | 21 221 286 301 | 167 186 202 372 |
| 137 289 296 386 | 27 88 147 216 | 8 29 355 393 |
| 241 273 276 359 | 10 124 128 309 | 36 126 155 373 |
| 44 94 211 286 | 57 131 209 296 | 145 195 227 333 |
| 166 184 204 226 | 230 237 264 371 | 45 206 344 369 |
| 98 281 357 389 | 28 118 231 283 | 8 166 301 397 |
| 41 107 187 298 | 5 114 230 309 | 11 47 141 184 |
| 19 47 379 399 | 122 189 204 251 | 7 112 256 377 |
| 1 16 272 296 | 74 151 203 218 | 108 300 310 312 |
| 107 203 283 322 | 69 270 288 359 | 208 218 364 378 |
| 77 245 266 390 | 22 49 291 383 | 53 114 278 291 |
| 29 166 345 364 | 80 90 174 249 | 131 138 201 365 |
| 61 229 356 361 | 182 310 314 318 | 225 279 371 378 |
| 70 105 229 250 | 115 254 336 399 | 122 275 376 395 |
| 268 334 344 368 | 42 63 135 343 | 169 217 239 357 |
| 78 82 283 393 | 46 232 385 391 | 18 65 128 288 |
| 7 299 327 334 | 24 27 171 183 | 6 62 86 198 |
| 47 82 117 126 | 23 729 33 22 352 | 37 80 119 211 |
| 86 100 337 379 | 81 90 223 363 | 0 46 139 339 |
| 299 347 372 375 | 71 85 128 380 | 0 30 216 306 |
| 150 156 299 302 | 159 309 314 334 | 82 152 277 367 |
| 145 252 294 377 | 17 117 315 379 | 23 178 350 366 |
| 155 218 250 392 | 87 120 206 267 | 121 212 243 384 |
| 131 172 250 278 | 67 116 188 349 | 257 284 326 382 |
| 17 64 107195 | 63 232 338 365 | 57 138 311 343 |
| 26 55 142 181 | 178 272 327 392 | 295 318 322 377 |
| 106 181 327 342 | 19 35 204 386 | 78 343 373 377 |
| 101 103 340 368 | 194 235 289 345 | 79 89 131 254 |
| 44 196 198 280 | 29 50 154 315 | 61 74 304 382 |
| 39 148 192 385 | 22 47 353 387 | 30 70 168 253 |
| 37 130 182 207 | 0 137 143 167 | 64 156 306 332 |
| 57 242 262 316 | 21 162 195 339 | 162 197 255 275 |
| 20 171 259 396 | 24 225 233 338 | 33 71 91 112 |
| 257 288 338 361 | 177 225 232 281 | 13 132 247 391 |
| 12 290 362 367 | 77 149 241 310 | 22 208 226 392 |
| 153 236 304 330 | 319 325 363 374 | 56 60 158 164 |
| 12 144 261 329 | 77 251 308 379 | 20 105 120 199 |
| 33 92 106 173 | 183 203 290 330 | 133 232 236 341 |
| 68 89 159 308 | 158 246 275 352 | 90 107 293 370 |
| 9 23 41 301 | 78 99 210 238 | 17 32 254 263 |
| 109 160 278 387 | 222 271 380 393 | 8 173 238 266 |
| 138 235 241 356 | 79 107 201 351 | 30 167 169 391 |
| 225 256 321 332 | 66 90 275 287 | 43 213 328 362 |
| 32 42 253 275 | 65 219 247 398 | 73 231 244 282 |
| 95 199 219 225 | 16 203 207 237 | 71 221 245 253 |
| 116 328 345 395 | 101 216 333 357 | 215 225 258 335 |
| 128 159 161 207 | 2 39 326 373 | 46 87 263 384 |
| 111 306 363 373 | 51 151 305 341 | 81 96 282 338 |
| 174 256 368 381 | 6 25 30 130 | 192 222 306 353 |
| 18 104 115 317 | 2 91 146 227 | 8 115 292 305 |
| 102 115 140 394 | 46 141 273 298 | 36 170 186 260 |
| 91 96 128 327 | 157 331 374 385 | 10 85 212 300 |
| 97 99 300 385 | 172 223 237 258 | 5 129 198 365 |
| 40 150 229 316 | 15 93 128 250 | 19 107 153 308 |
| 10 57 98 215 | 167 226 281 351 | 170 213 331 367 |
| 181 211 228 339 | 0 200 309 384 | 12 136 274 326 |
| 62 89 163 295 | 36 171 193 328 | 13 51 96 147 |
| 43 77 113 143 | 107 178 228 240 | 23 264 334 346 |
| 125 149 196 218 | 80 146 156 375 | 29 122 183 356 |
| 83 147 183 279 | 75 90 290 312 | 78 287 330 349 |
| 62 145 180 397 | 20 55 131 215 | 42 69 131 198 |
| 84 280 331 360 | 99 127 231 344 | 36 43 189 216 |
| 114 190 281 359 | 156 176 301 313 | 44 142 195 344 |
| 69 129 168 187 | 41 146 247 290 | 40 147 260 330 |
| 119 144 180 249 | 49 52 61 76 | 125 325 379 387 |
| 7 47 218 308 | 24 74 310 326 | 90 111 126 301 |
| 217 251 269 390 | 56 196 212 332 | 113 177 226 273 |
| 189 200 275 372 | 76 205 335 385 | 96 172 181 218 |
| 157 218 296 363 | 75 101 209 349 | 17 124 154 373 |
| 52 110 151 319 | 28 172 242 294 | 87 285 306 376 |
| 30 131 153 174 | 18 71 267 297 | 83 163 173 299 |
| 28 32 182 198 | 84 115 233 384 | 65 87 245 333 |
| 56 263 316 328 | 63 139 216 325 | 161 267 284 293 |
| 87 168 275 343 | 23 64 310 348 | 1 29 54 379 |
| 24 31 131 148 | 63 130 188 352 | 141 170 183 232 |
| 166 203 208 231 | 23 45 160 165 | 5 40 167 238 |
| 126 170 224 369 | 42 114 382 399 | 15 44 95 239 |

APPENDIX A-continued

The list file for an example (2000, 1600) LDPC code is set out below:

| | | |
|---|---|---|
| 20 78 193 213 | 25 207 339 365 | 13 75 152 188 |
| 123 180 253 323 | 16 334 374 398 | 216 224 305 331 |
| 208 229 271 386 | 86 251 274 277 | 29 93 197 381 |
| 1 52 116 383 | 157 166 297 316 | 21 222 282 284 |
| 13 55 71 106 | 171 200 230 265 | 175 193 361 372 |
| 7 306 347 364 | 34 107 325 364 | 54 69 298 308 |
| 145 163 197 228 | 71 220 227 330 | 93 169 209 328 |
| 66 97 212 320 | 177 263 277 344 | 39 59 334 391 |
| 133 176 282 305 | 75 138 262 293 | 108 254 340 376 |
| 22 187 205 372 | 189 300 366 377 | 141 246 264 388 |
| 102 160 180 258 | 147 175 296 320 | 96 267 362 392 |
| 164 197 311 398 | 2 51 145 208 | 131 234 291 330 |
| 75 119 186 254 | 126 271 310 351 | 4 168 220 235 |
| 6 15 65 396 | 144 197 277 360 | 130 195 216 367 |
| 30 108 341 399 | 28 35 115 289 | 108 148 290 302 |
| 217 276 326 347 | 54 108 270 279 | 85 214 362 395 |
| 160 237 274 285 | 23 82 144 396 | 48 100 118 346 |
| 173 248 262 348 | 78 93 95 275 | 91 104 355 358 |
| 52 65 218 351 | 145 169 211 278 | 176 342 351 390 |
| 135 140 253 366 | 29 163 300 320 | 6 45 123 126 |
| 5 81 176 260 | 33 147 219 391 | 69 241 268 274 |
| 58 215 326 364 | 199 214 265 280 | 158 324 371 399 |
| 76 87 102 315 | 62 133 156 219 | 62 232 264 373 |
| 98 131 259 332 | 31 34 72 115 | 103 106 146 344 |
| 15 30 35 55 | 246 260 267 286 | 134 268 295 398 |
| 0 122 269 346 | 7 266 309 337 | 120 220 250 354 |
| 38 162 311 373 | 24 69 142 394 | 115 208 355 398 |
| 143 313 329 340 | 98 138 228 351 | 74 190 343 352 |
| 80 260 316 348 | 72 181 336 355 | 258 325 332 371 |
| 44 158 220 292 | 12 47 160 172 | 14 256 347 353 |
| 117 241 295 363 | 84 178 230 343 | 24 33 122 234 |
| 187 321 355 378 | 80 238 321 376 | 98 272 300 342 |
| 210 221 268 337 | 108 129 152 261 | 94 108 244 288 |
| 8 94 154 347 | 152 164 205 377 | 16 42 200 250 |
| 195 285 321 327 | 144 281 332 335 | 2 64 193 399 |
| 12 51 54 354 | 92 244 315 326 | 129 172 276 379 |
| 16 41 149 389 | 66 128 170 221 | 26 176 234 319 |
| 55 66 206 297 | 21 109 174 397 | 118 135 205 312 |
| 129 202 214 285 | 5 154 201 239 | 115 176 290 359 |
| 73 96 104 310 | 80 183 261 293 | 9 143 188 374 |
| 55 200 270 318 | 18 143 335 392 | 96 186 247 353 |
| 58 120 150 217 | 13 139 155 230 | 30 72 320 388 |
| 58 279 339 397 | 145 156 300 327 | 17 137 186 193 |
| 60 180 247 308 | 118 153 171 366 | 34 229 265 284 |
| 48 127 213 356 | 15 152 331 364 | 129 207 282 287 |
| 62 128 291 329 | 161 171 307 317 | 68 118 275 305 |
| 26 35 127 323 | 49 56 127 185 | 153 172 249 307 |
| 77 144 286 296 | 104 168 283 305 | 106 179 212 378 |
| 10 47 192 259 | 199 202 343 399 | 22 48 105 347 |
| 122 196 210 329 | 15 164 192 273 | 98 137 346 379 |
| 63 162 235 268 | 62 199 222 228 | 41 98 165 232 |
| 25 45 218 310 | 67 94 166 256 | 54 63 99 123 |
| 67 336 354 393 | 85 227 250 321 | 81 213 315 394 |
| 16 278 347 381 | 91 121 295 324 | 38 66 87 191 |
| 14 39 209 395 | 3 16 308 340 | 71 121 294 396 |
| 21 55 85 304 | 143 157 307 395 | 109 200 345 375 |
| 128 135 194 325 | 36 77 116 340 | 33 70 217 266 |
| 116 159 258 341 | 3 98 101 125 | 11 111 210 240 |
| 125 132 210 219 | 39 151 364 377 | 261 271 290 396 |
| 60 67 150 203 | 194 227 231 267 | 190 225 298 369 |
| 18 60 167 328 | 59 200 206 389 | 16 140 227 352 |
| 55 112 179 381 | 21 106 287 389 | 118 183 262 383 |
| 288 317 324 389 | 33 268 340 387 | 17 218 260 350 |
| 43 320 334 382 | 140 150 395 398 | 50 56 278 351 |
| 5 29 145 281 | 88 352 360 367 | 15 36 150 280 |
| 25 124 232 345 | 55 911 45 168 | 18 107 151 176 |
| 11 119 339 359 | 126 130 181 323 | 22 188 244 337 |
| 5 36 231 316 | 34 120 227 316 | 72 186 302 350 |
| 15 138 354 389 | 237 337 355 394 | 65 145 221 239 |
| 25 82 136 180 | 34 186 219 313 | 52 117 331 393 |
| 20 103 167 266 | 280 330 340 375 | 7 37 265 285 |
| 112 292 359 371 | 76 230 354 378 | 56 283 338 382 |
| 184 201 240 328 | 5 178 293 297 | 78 217 337 351 |
| 77 160 307 339 | 142 223 234 381 | 6 247 249 370 |
| 74 147 280 389 | 48 239 260 399 | 1 161 241 255 |
| 127 149 358 387 | 58 270 336 360 | 101 166 183 220 |
| 50 59 117 185 | 24 123 271 347 | 99 198 326 335 |

APPENDIX A-continued

The list file for an example (2000, 1600) LDPC code is set out below:

| | | |
|---|---|---|
| 11 189 212 220 | 12 76 137 280 | 105 234 340 384 |
| 123 135 226 372 | 107 226 302 367 | 60 233 242 397 |
| 83 86 149 386 | 175 186 208 366 | 207 215 223 293 |
| 26 95 121 163 | 65 183 369 376 | 233 279 351 380 |
| 30 54 178 315 | 60 169 292 350 | 83 106 188 311 |
| 136 301 341 365 | 44 169 240 362 | 97 185 361 392 |
| 21 59 265 299 | 146 187 293 319 | 14 26 72 304 |
| 111 1542 822 97 | 198 219 343 380 | 51 162 194 387 |
| 6 74 290 349 | 148 188 256 304 | 94 245 273 287 |
| 121 142 174 236 | 171 189 266 341 | 26 177 205 314 |
| 14 92 385 389 | 73 241 250 260 | 33 130 223 286 |
| 111 211 366 390 | 181 187 235 239 | 215 271 317 344 |
| 27 71 110 327 | 63 193 300 329 | 8 47 113 153 |
| 99 257 359 389 | 291 332 354 396 | 194 233 361 377 |
| 124 295 372 397 | 19 103 260 383 | 88 202 284 394 |
| 12 43 117 356 | 5 303 328 375 | 29 118 285 380 |
| 65 117 136 354 | 131 237 298 384 | 96 154 312 383 |
| 39 67 191 212 | 103 183 281 286 | 19 250 318 359 |
| 80 166 176 358 | 5 224 263 358 | 32 282 289 334 |
| 99 208 353 361 | 197 199 247 382 | 56 272 294 303 |
| 32 46 104 222 | 18 228 332 344 | 10 68 72 210 |
| 4 25 72 203 | 16 26 57 68 | 184 261 382 386 |
| 2 124 130 262 | 2 158 259 384 | 202 204 315 342 |
| 28 113 210 232 | 128 181 371 398 | 66 102 195 207 |
| 66 77 158 268 | 98 179 247 319 | 97 243 272 301 |
| 61 98 202 330 | 41 71 138 326 | 92 128 156 304 |
| 47 67 181 247 | 175 244 301 317 | 68 313 385 390 |
| 51 204 209 307 | 81 145 226 371 | 13 32 49 271 |
| 125 198 289 301 | 125 202 226 309 | 4 80 123 277 |
| 136 214 216 263 | 115 169 276 298 | 89 135 243 375 |
| 97 270 314 338 | 192 268 296 391 | 88 372 381 388 |
| 78 127 215 226 | 31 167 220 223 | 66 108 222 274 |
| 27 242 348 357 | 39 241 358 382 | 28 59 164 167 |
| 94 181 191 363 | 67 112 159 236 | 201 204 313 324 |
| 7 91 93 348 | 71 180 208 266 | 73 311 388 397 |
| 60 193 267 333 | 59 143 248 394 | 109 186 243 261 |
| 185 237 272 381 | 99 128 223 388 | 116 125 276 398 |
| 15 52 166 225 | 6 192 221 351 | 58 185 287 293 |
| 27 100 126 275 | 129 238 257 378 | 40 203 279 314 |
| 70 96 163 333 | 29 192 252 392 | 46 50 86 255 |
| 11 175 273 282 | 6 110 177 269 | 23 48 109 120 |
| 14 212 392 398 | 29 79 205 241 | 236 297 325 333 |
| 91 105 300 382 | 233 246 325 331 | 123 155 320 384 |
| 4 79 232 370 | 11 211 321 384 | 36 67 169 274 |
| 21 75 158 347 | 144 282 337 386 | 54 102 191 239 |
| 331 341 343 386 | 33 79 327 385 | 8 109 198 391 |
| 0 103 163 270 | 30 110 179 321 | 143 176 238 370 |
| 7 95 171 326 | 86 133 234 284 | 39 41 105 208 |
| 16 24 49 133 | 54 58 72 289 | 126 197 342 357 |
| 58 242 363 390 | 22 145 269 373 | 9 40 191 384 |
| 8 236 254 290 | 81 172 211 381 | 51 148 207 270 |
| 50 83 140 370 | 59 246 252 255 | 49 114 243 360 |
| 233 258 340 364 | 34 113 207 286 | 60 87 303 370 |
| 63 289 292 313 | 69 100 222 231 | 138 190 248 283 |
| 231 245 336 342 | 14 150 387 396 | 78 97 139 144 |
| 35 38 246 299 | 17 73 228 248 | 177 180 244 272 |
| 104 246 249 281 | 29 193 232 259 | 44 123 243 287 |
| 161 248 285 325 | 40 148 359 374 | 122 211 304 388 |
| 13 21 192 220 | 38 281 316 327 | 70 117 278 332 |
| 82 89 200 209 | 70 87 100 395 | 31 85 343 394 |
| 8 264 313 368 | 26 231 295 369 | 47 133 244 312 |
| 11 26 242 286 | 214 234 269 288 | 20 144 299 368 |
| 37 248 303 388 | 77 154 320 365 | 25 84 335 395 |
| 64 187 324 392 | 27 76 86 155 | 102 199 213 283 |
| 209 216 230 243 | 65 139 175 240 | 64 164 169 224 |
| 50 152 224 276 | 21 79 94 356 | 57 238 375 393 |
| 42 184 390 398 | 26 158 345 353 | 5 158 186 355 |
| 1 73 349 396 | 95 172 261 374 | 83 110 385 399 |
| 238 317 354 385 | 27 119 364 373 | 48 154 166 308 |
| 46 70 296 379 | 35 245 335 374 | 2 75 288 340 |
| 156 247 278 334 | 139 162 184 228 | 86 223 248 264 |
| 130 235 319 390 | 53 84 214 363 | 67 135 158 350 |
| 0 108 120 213 | 17 153 242 386 | 80 133 345 351 |
| 11 93 146 235 | 30 137 274 313 | 51 195 265 335 |
| 96 255 374 376 | 68 169 256 369 | 63 117 159 196 |
| 85 146 204 366 | 30 119 206 394 | 13 16 37 143 |
| 146 254 365 391 | 224 325 365 380 | 70 95 306 391 |

APPENDIX A-continued

The list file for an example (2000, 1600) LDPC code is set out below:

| | | |
|---|---|---|
| 114 148 151 373 | 50 178 188 274 | 178 187 249 316 |
| 60 121 145 343 | 2 56 169 225 | 37 52 162 307 |
| 112 195 277 296 | 43 75 167 296 | 173 211 237 344 |
| 29 302 310 334 | 28 131 274 304 | 41 114 210 233 |
| 38 156 251 280 | 107 263 309 385 | 102 202 287 354 |
| 130 209 249 266 | 101 238 310 395 | 136 185 223 303 |
| 43 161 250 322 | 35 58 238 345 | 86 265 287 355 |
| 7 168 182 185 | 43 61 106 391 | 11 66 131 255 |
| 15 45 189 286 | 86 113 161 390 | 124 147 319 392 |
| 191 205 301 305 | 35 316 329 376 | 46 67 152 380 |
| 155 235 282 299 | 37 161 224 306 | 64 82 111 312 |
| 40 114 194 372 | 14 53 98 269 | 78 123 264 317 |
| 249 263 323 372 | 179 207 236 269 | 24 45 85 295 |
| 36 214 252 380 | 10 163 205 369 | 118 141 244 255 |
| 176 201 258 373 | 31 92 162 396 | 17 164 229 252 |
| 102 208 340 379 | 85 268 314 345 | 27 132 134 179 |
| 85 161 240 262 | 1 31 249 319 | 173 216 220 247 |
| 5 17 199 339 | 35 56 281 333 | 246 306 375 384 |
| 150 230 306 341 | 137 199 223 376 | 75 160 187 263 |
| 46 123 20 43 18 | 52 320 338 362 | 171 236 329 389 |
| 71 130 143 271 | 65 224 307 390 | 58 178 196 380 |
| 208 268 365 396 | 146 310 346 384 | 171 203 256 370 |
| 257 263 336 395 | 101 138 193 307 | 5 134 277 330 |
| 218 267 334 360 | 234 314 342 394 | 110 153 320 336 |
| 53 74 255 302 | 19 109 127 214 | 24 93 369 383 |
| 104 175 302 311 | 40 80 132 196 | 35100 244 361 |
| 228 338 360 369 | 183 213 229 249 | 327 345 369 396 |
| 8 35 112 394 | 105 228 232 238 | 27 37 185 277 |
| 39 130 336 365 | 64 278 290 357 | 257 259 321 362 |
| 13 170 198 378 | 20 116 173 251 | 23 253 280 370 |
| 56 156 162 181 | 97 261 308 393 | 13 44 99 224 |
| 47 95 104 272 | 20 100 146 165 | 57 69 114 224 |
| 9 291 333 362 | 67 84 164 376 | 70 154 185 352 |
| 121 128 193 322 | 155 260 300 352 | 34 269 338 367 |
| 159 276 311 392 | 116 118 147 233 | 77 170 234 326 |
| 15 42 105 267 | 61 174 328 371 | 138 171 192 269 |
| 4 23 202 388 | 30 60 155 368 | 173 192 284 371 |
| 23 61 260 307 | 39 142 169 232 | 68 155 164 353 |
| 42 124 355 380 | 54 76 318 358 | 4 22 201 212 |
| 124 259 374 386 | 196 341 352 391 | 206 234 259 270 |
| 136 140 207 317 | 61 63 333 350 | 35 168 176 389 |
| 9 278 280 325 | 42 130 307 331 | 103 162 351 370 |
| 4 19 59 360 | 25 190 224 282 | 49 59 102 212 |
| 155 192 270 287 | 237 251 312 359 | 56 106 207 240 |
| 4 81 95 119 | 39 186 288 301 | 48 87 212 340 |
| 135 138 200 301 | 29 188 211 367 | 38 231 288 394 |
| 11 32 294 357 | 269 298 391 397 | 137 353 378 393 |
| 10 73 84 173 | 85 95 292 307 | 119 150 272 355 |
| 25 48 97 145 | 72 150 266 314 | 64 92 190 291 |
| 7 223 280 366 | 101 199 253 359 | 4 51 121 215 |
| 83 137 247 276 | 18 41 259 368 | 119 171 229 253 |
| 31 56 117 325 | 122 125 185 324 | 65 357 363 370 |
| 211 281 307 358 | 58 294 318 365 | 83 172 197 280 |
| 49 118 211 372 | 84 210 216 235 | 27 131 360 396 |
| 70 179 221 371 | 54 142 147 355 | 77 136 150 309 |
| 38 260 266 388 | 73 91 174 353 | 3 121 179 230 |
| 142 222 253 335 | 15 48 292 323 | 10 104 152 326 |
| 83 88 180 363 | 4 62 67 126 | 64 134 178 182 |
| 153 371 374 393 | 109 129 191 203 | 214 300 353 386 |
| 142 161 286 312 | 143 154 168 205 | 110 254 268 346 |
| 34 111 221 243 | 24 75 127 304 | 272 304 337 347 |
| 40 66 91 391 | 34 142 182 363 | 37 165 235 262 |
| 55 120 165 209 | 10 198 303 308 | 1 36 234 297 |
| 4 28 46 292 | 146 258 273 361 | 69 281 347 371 |
| 149 222 244 357 | 113 132 220 359 | 59 264 271 348 |
| 190 339 362 364 | 39 179 252 274 | 175 255 277 357 |
| 10 67 187 338 | 6 176 199 318 | 51 97 374 399 |
| 2 132 168 263 | 33 55 95 124 | 108 223 317 360 |
| 9 63 294 305 | 134 228 283 329 | 82 125 216 228 |
| 26 60 148 224 | 75 175 339 371 | 134 154 172 317 |
| 59 157 188 224 | 78 89 202 322 | 49 65 74 157 |
| 139 220 320 349 | 85 197 310 390 | 3 112 266 356 |
| 69 202 336 385 | 59 112 305 323 | 81 204 254 262 |
| 20 92 313 331 | 154 163 287 305 | 3 113 263 332 |
| 44 79 316 392 | 83 195 206 264 | 100 151 205 240 |
| 104 177 254 335 | 45 209 255 311 | 95 125180 303 |
| 4 199 234 308 | 54 182 261 302 | 234 292 306 352 |

APPENDIX A-continued

| The list file for an example (2000, 1600) LDPC code is set out below: | | |
|---|---|---|
| 76 139 192 332 | 128 190 241 384 | 149 227 349 355 |
| 1 252 322 331 | 7 48 66 82 | 111 142 267 321 |
| 89 217 352 378 | 173 315 372 382 | 27 203 228 361 |
| 83 156 175 211 | 41 49 117 320 | 52 277 309 390 |
| 75 132 341 364 | 45 82 120 133 | 33 57 284 302 |
| 78 106 204 272 | 6 42 195 295 | 35 50 66 219 |
| 65 159 214 284 | 171 201 344 377 | 2227 149 215 |
| 141 161 342 353 | 94 179 205 344 | 13 28 84 206 |
| 336 375 381 397 | 32 144 219 315 | 59 108 337 349 |
| 143 260 291 302 | 226 257 333 386 | 73 171 273 345 |
| 84 298 339 375 | 24 102 182 375 | 68 140 200 363 |
| 219 234 357 374 | 49 86 123 175 | 38 111 233 358 |
| 0 118 292 328 | 62 151 266 298 | 157 289 328 372 |
| 19 119 226 387 | 272 323 339 367 | 160 188 284 327 |
| 115 167 294 319 | 99 160 273 330 | 137 304 349 374 |
| 53 222 233 236 | 194 274 324 368 | 140 168 204 341 |
| 18 52 63 182 | 51 127 158 191 | 132 223 298 336 |
| 79 102 148 311 | 2 98 164 393 | 71 114 184 200 |
| 140 270 351 369 | 90 108 149 315 | 60 135 323 399 |
| 91 255 289 389 | 8 122 129 299 | 9 38 179 245 |
| 163 285 330 338 | 8 48 64 210 | 114 157 229 366 |
| 229 297 323 342 | 112 114 186 239 | 14 43 99 137 |
| 24 36 89 106 | 164 179 304 346 | 87 111 371 377 |
| 101 134 140 381 | 90 127 252 284 | 73 137 177 261 |
| 50 148 194 257 | 53 173 282 333 | 10 105 184 352 |
| 1 222 340 378 | 82 87 98 354 | 126 286 347 390 |
| 67 155 220 365 | 77 106 138 345 | 72 91 148 196 |
| 15 156 210 262 | 74 329 360 366 | 12 162 292 363 |
| 53 125 134 231 | 167 322 332 395 | 6 112 273 399 |
| 192 337 357 360 | 52 88 276 294 | 0 1 |
| 170 203 216 266 | 47 199 299 391 | 1 2 |
| 2 71 74 362 | 3 219 275 297 | 2 3 |
| 40 97 101 356 | 3 30 375 378 | 3 4 |
| 54 117 145 201 | 110 134 158 282 | 4 5 |
| 34 81 147 326 | 151 188 359 388 | 5 6 |
| 5 121 256 311 | 191 199 304 333 | 6 7 |
| 14 176 272 383 | 42 191 274 383 | 7 8 |
| 283 297 340 396 | 51 99 384 394 | 8 9 |
| 7 36 307 320 | 146 343 367 376 | 9 10 |
| 114 241 271 315 | 153 247 284 375 | 10 11 |
| 96 179 249 302 | 36 133 204 243 | 11 12 |
| 7 9 170 394 | 110 224 265 277 | 12 13 |
| 46 284 308 388 | 86 129 319 371 | 13 14 |
| 104 158 332 362 | 103 127 201 336 | 14 15 |
| 109 153 189 370 | 39 50 247 256 | 15 16 |
| 14 110 338 381 | 119 165 230 370 | 16 17 |
| 101 142 257 376 | 21 82 24 83 11 | 17 18 |
| 93 129 359 394 | 84 137 239 315 | 18 19 |
| 133 137 142 314 | 1 155 239 268 | 19 20 |
| 187 215 269 294 | 265 278 329 342 | 20 21 |
| 116 121 300 363 | 18 118 234 242 | 21 22 |
| 57 251 267 386 | 135 189 337 353 | 22 23 |
| 14 126 335 379 | 18 28 123 159 | 23 24 |
| 31 133 250 268 | 26 44 88 267 | 24 25 |
| 9 183 241 342 | 12 50 103 251 | 25 26 |
| 37 164 279 324 | 144 242 244 372 | 26 27 |
| 118 130 187 270 | 53 181 221 229 | 27 28 |
| 135 169 182 319 | 46 89 180 281 | 28 29 |
| 6 149 204 220 | 3 53 285 382 | 29 30 |
| 63 150 214 259 | 175 184 205 209 | 30 31 |
| 19 65 348 388 | 94 208 27 63 49 | 31 32 |
| 15 46 15 13 83 | 14 37 131 266 | 32 33 |
| 22 160 227 230 | 135 227 367 392 | 33 34 |
| 124 166 279 317 | 13 59 103 207 | 34 35 |
| 45 130 237 361 | 48 78 84 243 | 35 36 |
| 6 189 316 347 | 94 252 262 306 | 36 37 |
| 74135 142 311 | 168 316 324 380 | 37 38 |
| 85 153 177 222 | 196 255 260 394 | 38 39 |
| 120 154 210 237 | 11 105 178 243 | 39 40 |
| 0 98 291 388 | 19 122 177 339 | 40 41 |
| 32 259 287 333 | 64 203 304 319 | 41 42 |
| 184 314 389 397 | 12 174 194 208 | 42 43 |
| 101 189 296 383 | 46 52 271 377 | 43 44 |
| 126 160 235 240 | 62 149 169 353 | 44 45 |
| 111 120 212 288 | 133 205 239 387 | 45 46 |

APPENDIX A-continued

| The list file for an example (2000, 1600) LDPC code is set out below: | | |
|---|---|---|
| 10 174 209 291 | 174 206 285 292 | 46 47 |
| 47 48 | 102 103 | 157 158 |
| 48 49 | 103 104 | 158 159 |
| 49 50 | 104 105 | 159 160 |
| 50 51 | 105 106 | 160 161 |
| 51 52 | 106 107 | 161 162 |
| 52 53 | 107 108 | 162 163 |
| 53 54 | 108 109 | 163 164 |
| 54 55 | 109 110 | 164 165 |
| 55 56 | 110 111 | 165 166 |
| 56 57 | 111 112 | 166 167 |
| 57 58 | 112 113 | 167 168 |
| 58 59 | 113 114 | 168 169 |
| 59 60 | 114 115 | 169 170 |
| 60 61 | 115 116 | 170 171 |
| 61 62 | 116 117 | 171 172 |
| 62 63 | 117 118 | 172 173 |
| 63 64 | 118 119 | 173 174 |
| 64 65 | 119 120 | 174 175 |
| 65 66 | 120 121 | 175 176 |
| 66 67 | 121 122 | 176 177 |
| 67 68 | 122 123 | 177 178 |
| 68 69 | 123 124 | 178 179 |
| 69 70 | 124 125 | 179 180 |
| 70 71 | 125 126 | 180 181 |
| 71 72 | 126 127 | 181 182 |
| 72 73 | 127 128 | 182 183 |
| 73 74 | 128 129 | 183 184 |
| 74 75 | 129 130 | 184 185 |
| 75 76 | 130 131 | 185 186 |
| 76 77 | 131 132 | 186 187 |
| 77 78 | 132 133 | 187 188 |
| 78 79 | 133 134 | 188 189 |
| 79 80 | 134 135 | 189 190 |
| 80 81 | 135 136 | 190 191 |
| 81 82 | 136 137 | 191 192 |
| 82 83 | 137 138 | 192 193 |
| 83 84 | 138 139 | 193 194 |
| 84 85 | 139 140 | 194 195 |
| 85 86 | 140 141 | 195 196 |
| 86 87 | 141 142 | 196 197 |
| 87 88 | 142 143 | 197 198 |
| 88 89 | 143 144 | 198 199 |
| 89 90 | 144 145 | 199 200 |
| 90 91 | 145 146 | 200 201 |
| 91 92 | 146 147 | 201 202 |
| 92 93 | 147 148 | 202 203 |
| 93 94 | 148 149 | 203 204 |
| 94 95 | 149 150 | 204 205 |
| 95 96 | 150 151 | 205 206 |
| 96 97 | 151 152 | 206 207 |
| 97 98 | 152 153 | 207 208 |
| 98 99 | 153 154 | 208 209 |
| 99 100 | 154 155 | 209 210 |
| 100 101 | 155 156 | 210 211 |
| 101 102 | 156 157 | 211 212 |
| 212 213 | 267 268 | 322 323 |
| 213 214 | 268 269 | 323 324 |
| 214 215 | 269 270 | 324 325 |
| 215 216 | 270 271 | 325 326 |
| 216 217 | 271 272 | 326 327 |
| 217 218 | 272 273 | 327 328 |
| 218 219 | 273 274 | 328 329 |
| 219 220 | 274 275 | 329 330 |
| 220 221 | 275 276 | 330 331 |
| 221 222 | 276 277 | 331 332 |
| 222 223 | 277 278 | 332 333 |
| 223 224 | 278 279 | 333 334 |
| 224 225 | 279 280 | 334 335 |
| 225 226 | 280 281 | 335 336 |
| 226 227 | 281 282 | 336 337 |
| 227 228 | 282 283 | 337 338 |
| 228 229 | 283 284 | 338 339 |
| 229 230 | 284 285 | 339 340 |

APPENDIX A-continued

The list file for an example (2000, 1600) LDPC code is set out below:

| | | |
|---|---|---|
| 230 231 | 285 286 | 340 341 |
| 231 232 | 286 287 | 341 342 |
| 232 233 | 287 288 | 342 343 |
| 233 234 | 288 289 | 343 344 |
| 234 235 | 289 290 | 344 345 |
| 235 236 | 290 291 | 345 346 |
| 236 237 | 291 292 | 346 347 |
| 237 238 | 292 293 | 347 348 |
| 238 239 | 293 294 | 348 349 |
| 239 240 | 294 295 | 349 350 |
| 240 241 | 295 296 | 350 351 |
| 241 242 | 296 297 | 351 352 |
| 242 243 | 297 298 | 352 353 |
| 243 244 | 298 299 | 353 354 |
| 244 245 | 299 300 | 354 355 |
| 245 246 | 300 301 | 355 356 |
| 246 247 | 301 302 | 356 357 |
| 247 248 | 302 303 | 357 358 |
| 248 249 | 303 304 | 358 359 |
| 249 250 | 304 305 | 359 360 |
| 250 251 | 305 306 | 360 361 |
| 251 252 | 306 307 | 361 362 |
| 252 253 | 307 308 | 362 363 |
| 253 254 | 308 309 | 363 364 |
| 254 255 | 309 310 | 364 365 |
| 255 256 | 310 311 | 365 366 |
| 256 257 | 311 312 | 366 367 |
| 257 258 | 312 313 | 367 368 |
| 258 259 | 313 314 | 368 369 |
| 259 260 | 314 315 | 369 370 |
| 260 261 | 315 316 | 370 371 |
| 261 262 | 316 317 | 371 372 |
| 262 263 | 317 318 | 372 373 |
| 263 264 | 318 319 | 373 374 |
| 264 265 | 319 320 | 374 375 |
| 265 266 | 320 321 | 375 376 |
| 266 267 | 321 322 | 376 377 |
| 377 378 | | |
| 378 379 | | |
| 379 380 | | |
| 380 381 | | |
| 381 382 | | |
| 382 383 | | |
| 383 384 | | |
| 384 385 | | |
| 385 386 | | |
| 386 387 | | |
| 387 388 | | |
| 388 389 | | |
| 389 390 | | |
| 390 391 | | |
| 391 392 | | |
| 392 393 | | |
| 393 394 | | |
| 394 395 | | |
| 395 396 | | |
| 396 397 | | |
| 397 398 | | |
| 398 399 | | |
| 399 | | |

© 2004 Intel Corporation

What is claimed is:

1. A wireless apparatus comprising:

a forward error correction (FEC) coder to encode digital data using a low density parity check (LDPC) code, said FEC coder including:

a computer readable storage medium storing at least a first portion of a parity check matrix, wherein said first portion of said parity check matrix includes at least half of said parity check matrix;

a matrix multiplication unit to multiply input data by a transpose of said first portion of said parity check matrix to generate modified data;

a differential encoder to differentially encode said modified data to generate coded data; and a concatenation unit to concatenate the input data and the coded data to form a code word; and a wireless transmitter to transmit a wireless signal that includes said code word;

wherein said parity check matrix, in list file form, is substantially as follows:

2000 400
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 1

| | | | |
|---|---|---|---|
| 143 225 316 323 | 111 162 190 227 | 73 221 295 362 | 67 127 132 136 |
| 92 140 191 358 | 189 272 288 302 | 75 97 242 279 | 146 264 321 323 |
| 69 315 329 343 | 14 49 147 334 | 32 197 244 313 | 210 275 319 346 |
| 6 121 205 284 | 33 53 213 238 | 245 248 276 296 | 57 160 252 261 |
| 58 66 254 337 | 53 219 368 379 | 59 230 322 347 | 26 54 170 197 |
| 1 47 178 395 | 126 149 188 339 | 17 246 291 364 | 120 218 229 341 |
| 129 151 212 228 | 108 118 182 393 | 125 157 227 390 | 44 53 124 323 |
| 66 146 243 265 | 0 37 160 295 | 122 205 279 348 | 0 113 315 358 |
| 22 140 157 180 | 158 200 335 356 | 61 298 340 380 | 110 144 246 298 |
| 120 208 313 321 | 11 20 229 397 | 12 31 256 328 | 89 91 99 346 |
| 290 350 370 382 | 77 86 212 250 | 119 163 178 217 | 21 32 216 393 |
| 56 94 184 215 | 79 193 262 336 | 61 129 185 200 | 37 170 209 342 |
| 84 119 337 344 | 43 104 125 376 | 34 38 104 295 | 49 58 357 399 |
| 2 156 244 398 | 55 114 134 293 | 119 289 349 377 | 18 23 31 373 |
| 9 106 200 336 | 240 283 299 333 | 50 314 322 367 | 159 172 195 366 |
| 22 37 150 270 | 0 24 57 100 | 28 48 248 382 | 213 335 337 378 |
| 3 110 326 367 | 46 84 322 341 | 32 41 128 201 | 1 103 159 277 |
| 235 276 290 335 | 5 43 45 221 | 91 115 220 368 | 96 159 209 387 |
| 82 187 193 297 | 29 217 274 301 | 45 151 196 265 | 102 165 234 378 |
| 43 183 297 379 | 81 93 116 278 | 152 190 198 317 | 173 245 356 376 |
| 194 239 243 293 | 93 174 213 231 | 157 212 242 275 | 57 230 240 314 |
| 90 144 228 350 | 64 201 251 385 | 2 40 249 283 | 1 89 153 166 |
| 170 206 321 395 | 76 134 278 370 | 195 280 299 345 | 25 32 264 342 |
| 72 138 254 300 | 71 93 182 398 | 142 151 220 395 | 265 276 321 324 |
| 25 196 201 279 | 38 174 250 377 | 70 121 252 382 | 57 211 274 360 |
| 56 59 362 379 | 19 116 357 372 | 52 244 279 297 | 12 291 311 348 |
| 28 121 170 277 | 81 91 164 307 | 22 131 256 349 | 34 220 258 282 |
| 61 273 351 386 | 180 186 241 251 | 47 52 339 346 | 52 58 109 379 |
| 71 76 232 328 | 239 254 331 342 | 50 288 342 388 | 116 248 337 369 |
| 62 109 190 201 | 107 149 250 295 | 26 87 247 283 | 87 146 183 278 |
| 42 96 318 361 | 160 243 290 373 | 93 147 255 312 | 139 251 364 381 |
| 32 176 312 361 | 39 217 262 324 | 92 112 259 388 | 42 118 178 194 |
| 69 258 310 389 | 19 185 312 389 | 9 18 61 308 | 73 100 198 286 |
| 1 84 182 300 | 211 271 277 291 | 3 137 139 257 | 68 249 292 376 |
| 45 124 161 396 | 19 148 155 324 | 165 217 345 354 | 13 216 221 256 |
| 15 76 99 101 | 24 94 124 314 | 78 134 263 280 | 127 138 177 398 |
| 62 248 354 375 | 3 85 193 349 | 186 213 227 303 | 20 69 239 264 |
| 78 258 262 311 | 68 175 202 253 | 68 194 294 346 | 3 126 132 163 |
| 181 265 364 368 | 139 160 337 377 | 35 225 284 312 | 66 88 169 271 |

-continued

| | | | |
|---|---|---|---|
| 60 168 227 254 | 21 224 249 398 | 117 188 340 346 | 88 197 201 387 |
| 162 231 270 377 | 113 122 206 327 | 258 299 306 331 | 1 51 135 149 |
| 14 102 139 158 | 7 10 156 245 | 83 194 207 349 | 257 294 331 356 |
| 28 79 155 318 | 140 182 192 235 | 43 141 175 329 | 204 260 288 294 |
| 28 40 63 236 | 161 291 324 387 | 0 68 170 262 | 45 144 185 383 |
| 163 181 258 279 | 31 232 237 350 | 25 36 153 309 | 173 310 329 362 |
| 158 176 273 334 | 30 184 235 387 | 57 62 273 323 | 15 165 305 348 |
| 80 236 256 380 | 136 226 269 327 | 7 19 75 264 | 27 66 85 182 |
| 74 156 214 358 | 4 93 136 167 | 21 254 259 366 | 47 235 238 246 |
| 176 229 251 283 | 47 148 309 348 | 8 97 156 172 | 230 276 293 367 |
| 19 104 114 162 | 73 225 252 290 | 9 185 313 330 | 118 150 267 324 |
| 141 284 291 358 | 44 213 361 386 | 55 219 253 393 | 68 82 309 398 |
| 77 123 157 361 | 79 319 361 381 | 86 120 185 233 | 72 154 226 231 |
| 141 154 215 338 | 74 251 339 356 | 41 136 191 242 | 76 135 151 384 |
| 55 294 296 298 | 100 105 246 293 | 194 265 303 393 | 39 48 80 309 |
| 80 109 272 364 | 68 101 191 285 | 256 285 310 399 | 0 178 305 353 |
| 43 206 287 363 | 32 103 323 355 | 103 247 275 378 | 88 136 196 321 |
| 81 175 206 261 | 122 188 228 305 | 115 218 225 285 | 37 95 222 300 |
| 31 94 275 317 | 6 77 291 397 | 98 196 217 328 | 23 343 358 369 |
| 10 123 141 279 | 70 76 259 276 | 177 267 306 350 | 195 252 303 349 |
| 44 64 157 270 | 72 270 335 348 | 82 299 320 395 | 9 81 102 317 |
| 20 219 285 316 | 11 81 110 360 | 76 116 140 238 | 8 18 136 152 |
| 219 281 304 354 | 10 50 357 393 | 189 298 326 381 | 110 240 245 334 |
| 33 121 319 351 | 35 89 248 252 | 235 317 320 333 | 225 255 278 310 |
| 21 157 191 260 | 6 55 319 345 | 127 301 348 376 | 63 168 170 303 |
| 0 88 303 307 | 107 116 223 271 | 51 286 309 377 | 8 17 255 314 |
| 13 23 62 268 | 168 240 261 384 | 17 70 139 187 | 28 92 98 200 |
| 13 173 279 320 | 54 204 295 351 | 54 180 184 344 | 112 201 244 392 |
| 117 189 253 392 | 3 51 146 299 | 85 311 318 327 | 134 216 344 383 |
| 32 40 57 350 | 74 184 307 361 | 263 312 364 369 | 21 97 115 396 |
| 57 123 148 368 | 9 202 272 387 | 97 149 198 336 | 28 69 120 380 |
| 18 96 164 326 | 106 198 281 329 | 31 141 151 285 | 34 259 267 314 |
| 84 103 107 359 | 36 105 225 236 | 72 163 187 311 | 55 72 87 223 |
| 92 338 350 355 | 90 139 183 299 | 24 54 249 297 | 43 180 185 252 |
| 16 70 242 338 | 152 160 292 354 | 64 143 322 360 | 23 113 133 277 |
| 20 74 141 179 | 11 115 227 236 | 53 73 122 256 | 258 285 347 350 |
| 159 246 248 365 | 152 202 211 373 | 100 138 214 226 | 246 253 318 399 |
| 207 292 387 399 | 4 173 346 374 | 265 348 373 378 | 12 78 90 369 |
| 38 148 303 347 | 132 197 238 279 | 42 62 113 174 | 17 93 96 102 |
| 68 113 296 389 | 16 94 150 222 | 29 313 349 358 | 109 162 318 360 |
| 12 257 286 325 | 241 344 375 386 | 154 179 217 268 | 22 83 151 290 |
| 50 287 294 327 | 31 121 161 231 | 164 289 380 392 | 141 191 240 266 |
| 149 259 356 367 | 9 33 197 350 | 109 165 236 312 | 25 90 138 390 |
| 3 12 178 309 | 87 197 233 312 | 92 141 193 238 | 81 113 265 382 |
| 63 92 166 368 | 100 111 129 368 | 190 243 267 275 | 88 142 210 283 |
| 97 190 199 363 | 184 278 289 346 | 95 143 203 393 | 10 40 43 140 |
| 13 86 92 308 | 76 177 227 356 | 130 213 264 308 | 2 195 268 328 |
| 132 141 221 322 | 11 132 246 314 | 102 133 217 226 | 117 240 257 374 |
| 213 257 348 396 | 46 93 103 309 | 69 88 116 295 | 298 332 350 365 |
| 91 147 294 325 | 20 33 64 196 | 108 217 273 322 | 60 122 240 313 |
| 14 27 48 222 | 111 134 194 204 | 26 287 306 343 | 157 215 274 397 |
| 11 41 164 274 | 69 134 200 366 | 70 129 283 385 | 41 45 60 99 |
| 67 76 92 104 | 179 324 366 386 | 18 79 296 345 | 182 197 276 331 |
| 19 192 305 344 | 72 82 188 192 | 14 25 34 52 | 40 257 262 322 |
| 23 35 125 224 | 100 120 189 375 | 31 88 212 226 | 148 208 332 352 |
| 152 163 352 385 | 244 252 318 329 | 26 53 123 165 | 127 159 253 290 |
| 40 161 165 329 | 3 105 116 203 | 101 108 248 328 | 273 289 325 341 |
| 113 215 245 378 | 280 282 288 365 | 49 115 190 395 | 95 145 231 297 |
| 80 168 262 382 | 38 196 330 369 | 23 119 139 282 | 70 110 225 313 |
| 81 136 165 239 | 20 31 113 381 | 27 206 209 324 | 50 112 166 302 |
| 2 42 248 323 | 56 173 205 390 | 203 221 332 356 | 68 97 128 218 |
| 111 127 157 330 | 2 30 165 366 | 181 190 288 379 | 90 264 269 280 |
| 79 125 239 341 | 41 75 169 302 | 38 73 249 368 | 22 132 258 368 |
| 147 172 187 397 | 210 271 330 334 | 45 49 264 394 | 65 124 129 325 |
| 230 245 277 352 | 60 109 199 348 | 89 112 218 316 | 95 105 111 385 |
| 49 202 350 381 | 27 89 214 388 | 144 186 297 343 | 109 233 250 302 |
| 34 56 167 242 | 77 79 83 289 | 152 177 233 237 | 8 33 80 318 |
| 36 58 61 83 | 119 236 323 383 | 74 171 223 334 | 51 253 281 288 |
| 107 110 133 251 | 1 44 271 372 | 4 16 44 89 | 209 237 346 391 |
| 100 245 295 330 | 25 42 104 215 | 103 165 177 358 | 12 198 221 269 |
| 16 71 175 397 | 144 153 357 362 | 53 217 342 383 | 9 141 229 306 |
| 106 206 229 236 | 133 153 273 383 | 58 88 126 370 | 0 114 219 300 |
| 177 308 371 387 | 152 174 269 355 | 4 214 243 383 | 242 289 318 335 |
| 89 122 207 362 | 107 193 210 320 | 5 96 155 354 | 41 90 163 215 |
| 3 166 190 305 | 194 298 317 331 | 7 61 214 237 | 65 80 99 167 |
| 155 171 289 336 | 22 112 139 222 | 90 241 261 367 | 269 296 303 356 |
| 34 37 293 301 | 147 152 221 365 | 39 161 202 206 | 45 106 232 346 |
| 143 189 255 338 | 20 48 130 353 | 101 132 135 250 | 86 195 293 391 |
| 38 75 137 166 | 58 100 125 172 | 117 191 213 352 | 140 193 245 321 |

-continued

| | | | |
|---|---|---|---|
| 62 92 124 366 | 79 181 242 313 | 132 233 270 303 | 88 150 183 380 |
| 73 83 105 136 | 174 254 304 321 | 16 251 266 370 | 230 253 315 373 |
| 53 184 258 263 | 47 82 117 126 | 111 306 363 373 | 87 120 206 267 |
| 17 79 261 286 | 86 100 337 379 | 174 256 368 381 | 67 116 188 349 |
| 94 293 302 397 | 299 347 372 375 | 18 104 115 317 | 63 232 338 365 |
| 170 218 358 376 | 150 156 299 302 | 102 115 140 394 | 178 272 327 392 |
| 61 246 287 292 | 145 252 294 377 | 91 96 128 327 | 19 35 204 386 |
| 61 162 245 303 | 155 218 250 392 | 97 99 300 385 | 194 235 289 345 |
| 25 286 333 355 | 131 172 250 278 | 40 150 229 316 | 29 50 154 315 |
| 159 241 263 354 | 17 64 107 195 | 124 315 322 359 | 22 47 353 387 |
| 134 186 305 327 | 26 55 142 181 | 21 221 286 301 | 0 137 143 167 |
| 33 38 283 301 | 106 181 327 342 | 27 88 147 216 | 21 162 195 339 |
| 17 44 159 398 | 101 103 340 368 | 10 124 128 309 | 24 225 233 338 |
| 108 167 174 374 | 44 196 198 280 | 57 131 209 296 | 177 225 232 281 |
| 90 105 172 257 | 39 148 192 385 | 230 237 264 371 | 77 149 241 310 |
| 93 165 180 353 | 37 130 182 207 | 28 118 231 283 | 319 325 363 374 |
| 137 289 296 386 | 57 242 262 316 | 5 114 230 309 | 77 251 308 379 |
| 241 273 276 359 | 20 171 259 396 | 122 189 204 251 | 183 203 290 330 |
| 44 94 211 286 | 257 288 338 361 | 74 151 203 218 | 158 246 275 352 |
| 166 184 204 226 | 12 290 362 367 | 69 270 288 359 | 78 99 210 238 |
| 98 281 357 389 | 153 236 304 330 | 22 49 291 383 | 222 271 380 393 |
| 41 107 187 298 | 12 144 261 329 | 80 90 174 249 | 79 107 201 351 |
| 19 47 379 399 | 33 92 106 173 | 182 310 314 318 | 66 90 275 287 |
| 1 16 272 296 | 68 89 159 308 | 115 254 336 399 | 65 219 247 398 |
| 107 203 283 322 | 9 23 41 301 | 42 63 135 343 | 16 203 207 237 |
| 77 245 266 390 | 109 160 278 387 | 46 232 385 391 | 101 216 333 357 |
| 29 166 345 364 | 138 235 241 356 | 24 27 171 183 | 2 39 326 373 |
| 61 229 356 361 | 225 256 321 332 | 237 293 322 352 | 51 151 305 341 |
| 70 105 229 250 | 32 42 253 275 | 81 90 223 363 | 6 25 30 130 |
| 268 334 344 368 | 95 199 219 225 | 71 85 128 380 | 2 91 146 227 |
| 78 82 283 393 | 116 328 345 395 | 159 309 314 334 | 46 141 273 298 |
| 7 299 327 334 | 128 159 161 207 | 17 117 315 379 | 157 331 374 385 |
| 172 223 237 258 | 79 89 131 254 | 43 77 113 143 | 102 160 180 258 |
| 15 93 128 250 | 61 74 304 382 | 125 149 196 218 | 164 197 311 398 |
| 94 261 312 341 | 30 70 168 253 | 83 147 183 279 | 75 119 186 254 |
| 167 186 202 372 | 64 156 306 332 | 62 145 180 397 | 6 15 65 396 |
| 8 29 355 393 | 162 197 255 275 | 84 280 331 360 | 30 108 341 399 |
| 36 126 155 373 | 33 71 91 112 | 114 190 281 359 | 217 276 326 347 |
| 145 195 227 333 | 13 132 247 391 | 69 129 168 187 | 160 237 274 285 |
| 45 206 344 369 | 22 208 226 392 | 119 144 180 249 | 173 248 262 348 |
| 8 166 301 397 | 56 60 158 164 | 7 47 218 308 | 52 65 218 351 |
| 11 47 141 184 | 20 105 120 199 | 217 251 269 390 | 135 140 253 366 |
| 7 112 256 377 | 133 232 236 341 | 189 200 275 372 | 5 81 176 260 |
| 108 300 310 312 | 90 107 293 370 | 157 218 296 363 | 58 215 326 364 |
| 208 218 364 378 | 17 32 254 263 | 52 110 151 319 | 76 87 102 315 |
| 53 114 278 291 | 8 173 238 266 | 30 131 153 174 | 98 131 259 332 |
| 131 138 201 365 | 30 167 169 391 | 28 32 182 198 | 15 30 35 55 |
| 225 279 371 378 | 43 213 328 362 | 56 263 316 328 | 0 122 269 346 |
| 122 275 376 395 | 73 231 244 282 | 87 168 275 343 | 38 162 311 373 |
| 169 217 239 357 | 71 221 245 253 | 24 31 131 148 | 143 313 329 340 |
| 18 65 128 288 | 215 225 258 335 | 166 203 208 231 | 80 260 316 348 |
| 6 62 86 198 | 46 87 263 384 | 126 170 224 369 | 44 158 220 292 |
| 37 80 119 211 | 81 96 282 338 | 20 78 193 213 | 117 241 295 363 |
| 0 46 139 339 | 192 222 306 353 | 123 180 253 323 | 187 321 355 378 |
| 0 30 216 306 | 8 115 292 305 | 208 229 271 386 | 167 226 281 351 |
| 82 152 277 367 | 36 170 186 260 | 1 52 116 383 | 0 200 309 384 |
| 23 178 350 366 | 10 85 212 300 | 13 55 71 106 | 36 171 193 328 |
| 121 212 243 384 | 5 129 198 365 | 7 306 347 364 | 107 178 228 240 |
| 257 284 326 382 | 19 107 153 308 | 145 163 197 228 | 80 146 156 375 |
| 57 138 311 343 | 10 57 98 215 | 66 97 212 320 | 75 90 290 312 |
| 295 318 322 377 | 181 211 228 339 | 133 176 282 305 | 20 55 131 215 |
| 78 343 373 377 | 62 89 163 295 | 22 187 205 372 | 99 127 231 344 |
| 156 176 301 313 | 54 108 270 279 | 96 172 181 218 | 69 241 268 274 |
| 41 146 247 290 | 23 82 144 396 | 17 124 154 373 | 158 324 371 399 |
| 49 52 61 76 | 78 93 95 275 | 87 285 306 376 | 62 232 264 373 |
| 24 74 310 326 | 145 169 211 278 | 83 163 173 299 | 103 106 146 344 |
| 56 196 212 332 | 29 163 300 320 | 65 87 245 333 | 134 268 295 398 |
| 76 205 335 385 | 33 147 219 391 | 161 267 284 293 | 120 220 250 354 |
| 75 101 209 349 | 199 214 265 280 | 1 29 54 379 | 115 208 355 398 |
| 28 172 242 294 | 62 133 156 219 | 141 170 183 232 | 74 190 343 352 |
| 18 71 267 297 | 31 34 72 115 | 5 40 167 238 | 258 325 332 371 |
| 84 115 233 384 | 246 260 267 286 | 15 44 95 239 | 14 256 347 353 |
| 63 139 216 325 | 7 266 309 337 | 13 75 152 188 | 24 33 122 234 |
| 23 64 310 348 | 24 69 142 394 | 216 224 305 331 | 98 272 300 342 |
| 63 130 188 352 | 98 138 228 351 | 29 93 197 381 | 210 221 268 337 |
| 23 45 160 165 | 72 181 336 355 | 21 222 282 284 | 8 94 154 347 |
| 42 114 382 399 | 12 47 160 172 | 175 193 361 372 | 195 285 321 327 |
| 25 207 339 365 | 84 178 230 343 | 54 69 298 308 | 12 51 54 354 |
| 16 334 374 398 | 80 238 321 376 | 93 169 209 328 | 16 41 149 389 |

-continued

| | | | |
|---|---|---|---|
| 86 251 274 277 | 170 213 331 367 | 39 59 334 391 | 55 66 206 297 |
| 157 166 297 316 | 12 136 274 326 | 108 254 340 376 | 129 202 214 285 |
| 171 200 230 265 | 13 51 96 147 | 141 246 264 388 | 73 96 104 310 |
| 34 107 325 364 | 23 264 334 346 | 96 267 362 392 | 55 200 270 318 |
| 71 220 227 330 | 29 122 183 356 | 131 234 291 330 | 58 120 150 217 |
| 177 263 277 344 | 78 287 330 349 | 4 168 220 235 | 58 279 339 397 |
| 75 138 262 293 | 42 69 131 198 | 130 195 216 367 | 60 180 247 308 |
| 189 300 366 377 | 36 43 189 216 | 108 148 290 302 | 48 127 213 356 |
| 147 175 296 320 | 44 142 195 344 | 85 214 362 395 | 62 128 291 329 |
| 2 51 145 208 | 40 147 260 330 | 48 100 118 346 | 26 35 127 323 |
| 126 271 310 351 | 125 325 379 387 | 91 104 355 358 | 77 144 286 296 |
| 144 197 277 360 | 90 111 126 301 | 176 342 351 390 | 10 47 192 259 |
| 28 35 115 289 | 113 177 226 273 | 6 45 123 126 | 122 196 210 329 |
| 63 162 235 268 | 26 95 121 163 | 143 157 307 395 | 148 188 256 304 |
| 25 45 218 310 | 30 54 178 315 | 36 77 116 340 | 171 189 266 341 |
| 67 336 354 393 | 136 301 341 365 | 3 98 101 125 | 94 108 244 288 |
| 16 278 347 381 | 21 59 265 299 | 39 151 364 377 | 16 42 200 250 |
| 14 39 209 395 | 111 154 282 297 | 194 227 231 267 | 2 64 193 399 |
| 21 55 85 304 | 6 74 290 349 | 59 200 206 389 | 129 172 276 379 |
| 128 135 194 325 | 121 142 174 236 | 21 106 287 389 | 26 176 234 319 |
| 116 159 258 341 | 108 129 152 261 | 33 268 340 387 | 118 135 205 312 |
| 125 132 210 219 | 152 164 205 377 | 140 150 395 398 | 115 176 290 359 |
| 60 67 150 203 | 144 281 332 335 | 88 352 360 367 | 9 143 188 374 |
| 18 60 167 328 | 92 244 315 326 | 55 91 145 168 | 96 186 247 353 |
| 55 112 179 381 | 66 128 170 221 | 126 130 181 323 | 30 72 320 388 |
| 288 317 324 389 | 21 109 174 397 | 34 120 227 316 | 17 137 186 193 |
| 43 320 334 382 | 5 154 201 239 | 237 337 355 394 | 34 229 265 284 |
| 5 29 145 281 | 80 183 261 293 | 34 186 219 313 | 129 207 282 287 |
| 25 124 232 345 | 18 143 335 392 | 280 330 340 375 | 68 118 275 305 |
| 11 119 339 359 | 13 139 155 230 | 76 230 354 378 | 153 172 249 307 |
| 5 36 231 316 | 145 156 300 327 | 5 178 293 297 | 106 179 212 378 |
| 15 138 354 389 | 118 153 171 366 | 142 223 234 381 | 22 48 105 347 |
| 25 82 136 180 | 15 152 331 364 | 48 239 260 399 | 98 137 346 379 |
| 20 103 167 266 | 161 171 307 317 | 58 270 336 360 | 41 98 165 232 |
| 112 292 359 371 | 49 56 127 185 | 24 123 271 347 | 54 63 99 123 |
| 184 201 240 328 | 104 168 283 305 | 12 76 137 280 | 81 213 315 394 |
| 77 160 307 339 | 199 202 343 399 | 107 226 302 367 | 38 66 87 191 |
| 74 147 280 389 | 15 164 192 273 | 175 186 208 366 | 71 121 294 396 |
| 127 149 358 387 | 62 199 222 228 | 65 183 369 376 | 109 200 345 375 |
| 50 59 117 185 | 67 94 166 256 | 60 169 292 350 | 33 70 217 266 |
| 11 189 212 220 | 85 227 250 321 | 44 169 240 362 | 11 111 210 240 |
| 123 135 226 372 | 91 121 295 324 | 146 187 293 319 | 261 271 290 396 |
| 83 86 149 386 | 3 16 308 340 | 198 219 343 380 | 190 225 298 369 |
| 16 140 227 352 | 99 257 359 389 | 4 79 232 370 | 5 224 263 358 |
| 118 183 262 383 | 124 295 372 397 | 21 75 158 347 | 197 199 247 382 |
| 17 218 260 350 | 12 43 117 356 | 331 341 343 386 | 18 228 332 344 |
| 50 56 278 351 | 65 117 136 354 | 0 103 163 270 | 16 26 57 68 |
| 15 36 150 280 | 39 67 191 212 | 7 95 171 326 | 2 158 259 384 |
| 18 107 151 176 | 80 166 176 358 | 16 24 49 133 | 128 181 371 398 |
| 22 188 244 337 | 99 208 353 361 | 58 242 363 390 | 98 179 247 319 |
| 72 186 302 350 | 32 46 104 222 | 8 236 254 290 | 41 71 138 326 |
| 65 145 221 239 | 4 25 72 203 | 50 83 140 370 | 175 244 301 317 |
| 52 117 331 393 | 2 124 130 262 | 233 258 340 364 | 81 145 226 371 |
| 7 37 265 285 | 28 113 210 232 | 63 289 292 313 | 125 202 226 309 |
| 56 283 338 382 | 66 77 158 268 | 231 245 336 342 | 115 169 276 298 |
| 78 217 337 351 | 61 98 202 330 | 35 38 246 299 | 192 268 296 391 |
| 6 247 249 370 | 47 67 181 247 | 104 246 249 281 | 31 167 220 223 |
| 1 161 241 255 | 51 204 209 307 | 161 248 285 325 | 39 241 358 382 |
| 101 166 183 220 | 125 198 289 301 | 13 21 192 220 | 67 112 159 236 |
| 99 198 326 335 | 136 214 216 263 | 82 89 200 209 | 71 180 208 266 |
| 105 234 340 384 | 97 270 314 338 | 8 264 313 368 | 59 143 248 394 |
| 60 233 242 397 | 78 127 215 226 | 11 262 422 86 | 99 128 223 388 |
| 207 215 223 293 | 27 242 348 357 | 37 248 303 388 | 6 192 221 351 |
| 233 279 351 380 | 94 181 191 363 | 64 187 324 392 | 129 238 257 378 |
| 83 106 188 311 | 7 91 93 348 | 209 216 230 243 | 29 192 252 392 |
| 97 185 361 392 | 60 193 267 333 | 73 241 250 260 | 6 110 177 269 |
| 14 26 72 304 | 185 237 272 381 | 181 187 235 239 | 29 79 205 241 |
| 51 162 194 387 | 15 52 166 225 | 63 193 300 329 | 233 246 325 331 |
| 94 245 273 287 | 27 100 126 275 | 291 332 354 396 | 11 211 321 384 |
| 26 177 205 314 | 70 96 163 333 | 19 103 260 383 | 144 282 337 386 |
| 14 92 385 389 | 11 175 273 282 | 5 303 328 375 | 33 79 327 385 |
| 111 211 366 390 | 14 212 392 398 | 131 237 298 384 | 30 110 179 321 |
| 27 71 110 327 | 91 105 300 382 | 103 183 281 286 | 86 133 234 284 |
| 54 58 72 289 | 66 102 195 207 | 138 190 248 283 | 43 161 250 322 |
| 22 145 269 373 | 97 243 272 301 | 78 97 139 144 | 7 168 182 185 |
| 81 172 211 381 | 92 128 156 304 | 177 180 244 272 | 15 45 189 286 |
| 59 246 252 255 | 68 313 385 390 | 44 123 243 287 | 191 205 301 305 |
| 34 113 207 286 | 13 32 49 271 | 122 211 304 388 | 155 235 282 299 |
| 69 100 222 231 | 4 80 123 277 | 70 117 278 332 | 40 114 194 372 |

-continued

| | | | |
|---|---|---|---|
| 14 150 387 396 | 89 135 243 375 | 31 85 343 394 | 249 263 323 372 |
| 17 73 228 248 | 88 372 381 388 | 47 133 244 312 | 36 214 252 380 |
| 29 193 232 259 | 66 108 222 274 | 20 144 299 368 | 176 201 258 373 |
| 40 148 359 374 | 28 59 164 167 | 25 84 335 395 | 102 208 340 379 |
| 38 281 316 327 | 201 204 313 324 | 102 199 213 283 | 85 161 240 262 |
| 70 87 100 395 | 73 311 388 397 | 64 164 169 224 | 5 17 199 339 |
| 26 231 295 369 | 109 186 243 261 | 50 152 224 276 | 150 230 306 341 |
| 214 234 269 288 | 116 125 276 398 | 42 184 390 398 | 46 123 204 318 |
| 77 154 320 365 | 58 185 287 293 | 1 73 349 396 | 71 130 143 271 |
| 27 76 86 155 | 40 203 279 314 | 238 317 354 385 | 208 268 365 396 |
| 65 139 175 240 | 46 50 86 255 | 46 70 296 379 | 257 263 336 395 |
| 33 130 223 286 | 23 48 109 120 | 156 247 278 334 | 218 267 334 360 |
| 215 271 317 344 | 236 297 325 333 | 130 235 319 390 | 53 74 255 302 |
| 8 47 113 153 | 123 155 320 384 | 0 108 120 213 | 104 175 302 311 |
| 194 233 361 377 | 36 67 169 274 | 11 93 146 235 | 228 338 360 369 |
| 88 202 284 394 | 54 102 191 239 | 96 255 374 376 | 8 35 112 394 |
| 29 118 285 380 | 8 109 198 391 | 85 146 204 366 | 39 130 336 365 |
| 96 154 312 383 | 143 176 238 370 | 146 254 365 391 | 13 170 198 378 |
| 19 250 318 359 | 39 41 105 208 | 114 148 151 373 | 56 156 162 181 |
| 32 282 289 334 | 126 197 342 357 | 60 121 145 343 | 47 95 104 272 |
| 56 272 294 303 | 9 40 191 384 | 112 195 277 296 | 9 291 333 362 |
| 10 68 72 210 | 51 148 207 270 | 29 302 310 334 | 121 128 193 322 |
| 184 261 382 386 | 49 114 243 360 | 38 156 251 280 | 159 276 311 392 |
| 202 204 315 342 | 60 87 303 370 | 130 209 249 266 | 15 42 105 267 |
| 4 23 202 388 | 14 53 98 269 | 42 130 307 331 | 173 216 220 247 |
| 23 61 260 307 | 179 207 236 269 | 25 190 224 282 | 246 306 375 384 |
| 42 124 355 380 | 10 163 205 369 | 57 238 375 393 | 75 160 187 263 |
| 124 259 374 386 | 31 92 162 396 | 5 158 186 355 | 171 236 329 389 |
| 136 140 207 317 | 85 268 314 345 | 83 110 385 399 | 58 178 196 380 |
| 9 278 280 325 | 1 31 249 319 | 48 154 166 308 | 171 203 256 370 |
| 4 19 59 360 | 35 56 281 333 | 2 75 288 340 | 5 134 277 330 |
| 21 79 94 356 | 137 199 223 376 | 86 223 248 264 | 110 153 320 336 |
| 26 158 345 353 | 52 320 338 362 | 67 135 158 350 | 24 93 369 383 |
| 95 172 261 374 | 65 224 307 390 | 80 133 345 351 | 35 100 244 361 |
| 27 119 364 373 | 146 310 346 384 | 51 195 265 335 | 327 345 369 396 |
| 35 245 335 374 | 101 138 193 307 | 63 117 159 196 | 27 37 185 277 |
| 139 162 184 228 | 234 314 342 394 | 13 16 37 143 | 257 259 321 362 |
| 53 84 214 363 | 19 109 127 214 | 70 95 306 391 | 23 253 280 370 |
| 17 153 242 386 | 40 80 132 196 | 178 187 249 316 | 13 44 99 224 |
| 30 137 274 313 | 183 213 229 249 | 37 52 162 307 | 57 69 114 224 |
| 68 169 256 369 | 105 228 232 238 | 173 211 237 344 | 70 154 185 352 |
| 30 119 206 394 | 64 278 290 357 | 41 114 210 233 | 34 269 338 367 |
| 224 325 365 380 | 20 116 173 251 | 102 202 287 354 | 77 170 234 326 |
| 50 178 188 274 | 97 261 308 393 | 136 185 223 303 | 138 171 192 269 |
| 2 56 169 225 | 20 100 146 165 | 86 265 287 355 | 173 192 284 371 |
| 43 75 167 296 | 67 84 164 376 | 11 66 131 255 | 68 155 164 353 |
| 28 131 274 304 | 155 260 300 352 | 124 147 319 392 | 4 22 201 212 |
| 107 263 309 385 | 116 118 147 233 | 46 67 152 380 | 206 234 259 270 |
| 101 238 310 395 | 61 174 328 371 | 64 82 111 312 | 35 168 176 389 |
| 35 58 238 345 | 30 60 155 368 | 78 123 264 317 | 103 162 351 370 |
| 43 61 106 391 | 39 142 169 232 | 24 45 85 295 | 49 59 102 212 |
| 86 113 161 390 | 54 76 318 358 | 118 141 244 255 | 155 192 270 287 |
| 35 316 329 376 | 196 341 352 391 | 17 164 229 252 | 4 81 95 119 |
| 37 161 224 306 | 61 63 333 350 | 27 132 134 179 | 135 138 200 301 |
| 11 32 294 357 | 4 199 234 308 | 122 125 185 324 | 45 82 120 133 |
| 10 73 84 173 | 76 139 192 332 | 58 294 318 365 | 6 42 195 295 |
| 25 48 97 145 | 1 252 322 331 | 84 210 216 235 | 171 201 344 377 |
| 7 223 280 366 | 89 217 352 378 | 54 142 147 355 | 94 179 205 344 |
| 83 137 247 276 | 83 156 175 211 | 73 91 174 353 | 32 144 219 315 |
| 31 56 117 325 | 75 132 341 364 | 15 48 292 323 | 226 257 333 386 |
| 211 281 307 358 | 78 106 204 272 | 4 62 67 126 | 24 102 182 375 |
| 49 118 211 372 | 65 159 214 284 | 109 129 191 203 | 49 86 123 175 |
| 70 179 221 371 | 141 161 342 353 | 143 154 168 205 | 62 151 266 298 |
| 38 260 266 388 | 336 375 381 397 | 24 75 127 304 | 272 323 339 367 |
| 142 222 253 335 | 143 260 291 302 | 34 142 182 363 | 99 160 273 330 |
| 83 88 180 363 | 84 298 339 375 | 10 198 303 308 | 194 274 324 368 |
| 153 371 374 393 | 219 234 357 374 | 146 258 273 361 | 51 127 158 191 |
| 142 161 286 312 | 0 118 292 328 | 113 132 220 359 | 2 98 164 393 |
| 34 111 221 243 | 19 119 226 387 | 39 179 252 274 | 90 108 149 315 |
| 40 66 91 391 | 115 167 294 319 | 6 176 199 318 | 8 122 129 299 |
| 55 120 165 209 | 53 222 233 236 | 33 55 95 124 | 8 48 64 210 |
| 4 28 46 292 | 18 52 63 182 | 134 228 283 329 | 56 106 207 240 |
| 149 222 244 357 | 79 102 148 311 | 75 175 339 371 | 48 87 212 340 |
| 190 339 362 364 | 140 270 351 369 | 78 89 202 322 | 38 231 288 394 |
| 10 67 187 338 | 91 255 289 389 | 85 197 310 390 | 137 353 378 393 |
| 2 132 168 263 | 163 285 330 338 | 59 112 305 323 | 119 150 272 355 |
| 9 63 294 305 | 237 251 312 359 | 154 163 287 305 | 64 92 190 291 |

-continued

| | | | |
|---|---|---|---|
| 26 60 148 224 | 39 186 288 301 | 83 195 206 264 | 4 51 121 215 |
| 59 157 188 224 | 29 188 211 367 | 45 209 255 311 | 119 171 229 253 |
| 139 220 320 349 | 269 298 391 397 | 54 182 261 302 | 65 357 363 370 |
| 69 202 336 385 | 85 95 292 307 | 128 190 241 384 | 83 172 197 280 |
| 20 92 313 331 | 72 150 266 314 | 7 48 66 82 | 27 131 360 396 |
| 44 79 316 392 | 101 199 253 359 | 173 315 372 382 | 77 136 150 309 |
| 104 177 254 335 | 18 41 259 368 | 41 49 117 320 | 3 121 179 230 |
| 10 104 152 326 | 73 171 273 345 | 114 241 271 315 | 0 98 291 388 |
| 64 134 178 182 | 68 140 200 363 | 96 179 249 302 | 32 259 287 333 |
| 214 300 353 386 | 38 111 233 358 | 7 9 170 394 | 184 314 389 397 |
| 110 254 268 346 | 157 289 328 372 | 46 284 308 388 | 101 189 296 383 |
| 272 304 337 347 | 160 188 284 327 | 104 158 332 362 | 126 160 235 240 |
| 37 165 235 262 | 137 304 349 374 | 109 153 189 370 | 111 120 212 288 |
| 1 36 234 297 | 140 168 204 341 | 14 110 338 381 | 10 174 209 291 |
| 69 281 347 371 | 132 223 298 336 | 101 142 257 376 | 112 114 186 239 |
| 59 264 271 348 | 71 114 184 200 | 93 129 359 394 | 164 179 304 346 |
| 175 255 277 357 | 60 135 323 399 | 133 137 142 314 | 90 127 252 284 |
| 51 97 374 399 | 9 38 179 245 | 187 215 269 294 | 53 173 282 333 |
| 108 223 317 360 | 114 157 229 366 | 116 121 300 363 | 82 87 98 354 |
| 82 125 216 228 | 229 297 323 342 | 57 251 267 386 | 77 106 138 345 |
| 134 154 172 317 | 24 36 89 106 | 14 126 335 379 | 74 329 360 366 |
| 49 65 74 157 | 101 134 140 381 | 31 133 250 268 | 167 322 332 395 |
| 3 112 266 356 | 50 148 194 257 | 9 183 241 342 | 52 88 276 294 |
| 81 204 254 262 | 1 222 340 378 | 37 164 279 324 | 47 199 299 391 |
| 3 113 263 332 | 67 155 220 365 | 118 130 187 270 | 3 219 275 297 |
| 100 151 205 240 | 15 156 210 262 | 135 169 182 319 | 3 30 375 378 |
| 95 125 180 303 | 53 125 134 231 | 6 149 204 220 | 110 134 158 282 |
| 234 292 306 352 | 192 337 357 360 | 63 150 214 259 | 151 188 359 388 |
| 149 227 349 355 | 170 203 216 266 | 19 65 348 388 | 191 199 304 333 |
| 111 142 267 321 | 2 71 74 362 | 15 46 151 383 | 42 191 274 383 |
| 27 203 228 361 | 40 97 101 356 | 22 160 227 230 | 51 99 384 394 |
| 52 277 309 390 | 54 117 145 201 | 124 166 279 317 | 146 343 367 376 |
| 33 57 284 302 | 34 81 147 326 | 45 130 237 361 | 153 247 284 375 |
| 35 50 66 219 | 5 121 256 311 | 6 189 316 347 | 36 133 204 243 |
| 22 27 149 215 | 14 176 272 383 | 74 135 142 311 | 110 224 265 277 |
| 13 28 84 206 | 283 297 340 396 | 85 153 177 222 | 86 129 319 371 |
| 59 108 337 349 | 7 36 307 320 | 120 154 210 237 | 103 127 201 336 |
| 39 50 247 256 | 133 205 239 387 | 20 21 | 50 51 |
| 119 165 230 370 | 174 206 285 292 | 21 22 | 51 52 |
| 21 82 248 311 | 14 43 99 137 | 22 23 | 52 53 |
| 84 137 239 315 | 87 111 371 377 | 23 24 | 53 54 |
| 1 155 239 268 | 73 137 177 261 | 24 25 | 54 55 |
| 265 278 329 342 | 10 105 184 352 | 25 26 | 55 56 |
| 18 118 234 242 | 126 286 347 390 | 26 27 | 56 57 |
| 135 189 337 353 | 72 91 148 196 | 27 28 | 57 58 |
| 18 28 123 159 | 12 162 292 363 | 28 29 | 58 59 |
| 26 44 88 267 | 6 112 273 399 | 29 30 | 59 60 |
| 12 50 103 251 | 0 1 | 30 31 | 60 61 |
| 144 242 244 372 | 1 2 | 31 32 | 61 62 |
| 53 181 221 229 | 2 3 | 32 33 | 62 63 |
| 46 89 180 281 | 3 4 | 33 34 | 63 64 |
| 3 53 285 382 | 4 5 | 34 35 | 64 65 |
| 175 184 205 209 | 5 6 | 35 36 | 65 66 |
| 94 208 276 349 | 6 7 | 36 37 | 66 67 |
| 14 37 131 266 | 7 8 | 37 38 | 67 68 |
| 135 227 367 392 | 8 9 | 38 39 | 68 69 |
| 13 59 103 207 | 9 10 | 39 40 | 69 70 |
| 48 78 84 243 | 10 11 | 40 41 | 70 71 |
| 94 252 262 306 | 11 12 | 41 42 | 71 72 |
| 168 316 324 380 | 12 13 | 42 43 | 72 73 |
| 196 255 260 394 | 13 14 | 43 44 | 73 74 |
| 11 105 178 243 | 14 15 | 44 45 | 74 75 |
| 19 122 177 339 | 15 16 | 45 46 | 75 76 |
| 64 203 304 319 | 16 17 | 46 47 | 76 77 |
| 12 174 194 208 | 17 18 | 47 48 | 77 78 |
| 46 52 271 377 | 18 19 | 48 49 | 78 79 |
| 62 149 169 353 | 19 20 | 49 50 | 79 80 |
| 80 81 | 110 111 | 140 141 | 170 171 |
| 81 82 | 111 112 | 141 142 | 171 172 |
| 82 83 | 112 113 | 142 143 | 172 173 |
| 83 84 | 113 114 | 143 144 | 173 174 |
| 84 85 | 114 115 | 144 145 | 174 175 |
| 85 86 | 115 116 | 145 146 | 175 176 |
| 86 87 | 116 117 | 146 147 | 176 177 |
| 87 88 | 117 118 | 147 148 | 177 178 |
| 88 89 | 118 119 | 148 149 | 178 179 |
| 89 90 | 119 120 | 149 150 | 179 180 |
| 90 91 | 120 121 | 150 151 | 180 181 |
| 91 92 | 121 122 | 151 152 | 181 182 |

-continued

| | | | |
|---|---|---|---|
| 92 93 | 122 123 | 152 153 | 182 183 |
| 93 94 | 123 124 | 153 154 | 183 184 |
| 94 95 | 124 125 | 154 155 | 184 185 |
| 95 96 | 125 126 | 155 156 | 185 186 |
| 96 97 | 126 127 | 156 157 | 186 187 |
| 97 98 | 127 128 | 157 158 | 187 188 |
| 98 99 | 128 129 | 158 159 | 188 189 |
| 99 100 | 129 130 | 159 160 | 189 190 |
| 100 101 | 130 131 | 160 161 | 190 191 |
| 101 102 | 131 132 | 161 162 | 191 192 |
| 102 103 | 132 133 | 162 163 | 192 193 |
| 103 104 | 133 134 | 163 164 | 193 194 |
| 104 105 | 134 135 | 164 165 | 194 195 |
| 105 106 | 135 136 | 165 166 | 195 196 |
| 106 107 | 136 137 | 166 167 | 196 197 |
| 107 108 | 137 138 | 167 168 | 197 198 |
| 108 109 | 138 139 | 168 169 | 198 199 |
| 109 110 | 139 140 | 169 170 | 199 200 |
| 200 201 | 230 231 | 260 261 | 290 291 |
| 201 202 | 231 232 | 261 262 | 291 292 |
| 202 203 | 232 233 | 262 263 | 292 293 |
| 203 204 | 233 234 | 263 264 | 293 294 |
| 204 205 | 234 235 | 264 265 | 294 295 |
| 205 206 | 235 236 | 265 266 | 295 296 |
| 206 207 | 236 237 | 266 267 | 296 297 |
| 207 208 | 237 238 | 267 268 | 297 298 |
| 208 209 | 238 239 | 268 269 | 298 299 |
| 209 210 | 239 240 | 269 270 | 299 300 |
| 210 211 | 240 241 | 270 271 | 300 301 |
| 211 212 | 241 242 | 271 272 | 301 302 |
| 212 213 | 242 243 | 272 273 | 302 303 |
| 213 214 | 243 244 | 273 274 | 303 304 |
| 214 215 | 244 245 | 274 275 | 304 305 |
| 215 216 | 245 246 | 275 276 | 305 306 |
| 216 217 | 246 247 | 276 277 | 306 307 |
| 217 218 | 247 248 | 277 278 | 307 308 |
| 218 219 | 248 249 | 278 279 | 308 309 |
| 219 220 | 249 250 | 279 280 | 309 310 |
| 220 221 | 250 251 | 280 281 | 310 311 |
| 221 222 | 251 252 | 281 282 | 311 312 |
| 222 223 | 252 253 | 282 283 | 312 313 |
| 223 224 | 253 254 | 283 284 | 313 314 |
| 224 225 | 254 255 | 284 285 | 314 315 |
| 225 226 | 255 256 | 285 286 | 315 316 |
| 226 227 | 256 257 | 286 287 | 316 317 |
| 227 228 | 257 258 | 287 288 | 317 318 |
| 228 229 | 258 259 | 288 289 | 318 319 |
| 229 230 | 259 260 | 289 290 | 319 320 |
| 320 321 | 340 341 | 360 361 | 380 381 |
| 321 322 | 341 342 | 361 362 | 381 382 |
| 322 323 | 342 343 | 362 363 | 382 383 |
| 323 324 | 343 344 | 363 364 | 383 384 |
| 324 325 | 344 345 | 364 365 | 384 385 |
| 325 326 | 345 346 | 365 366 | 385 386 |
| 326 327 | 346 347 | 366 367 | 386 387 |
| 327 328 | 347 348 | 367 368 | 387 388 |
| 328 329 | 348 349 | 368 369 | 388 389 |
| 329 330 | 349 350 | 369 370 | 389 390 |
| 330 331 | 350 351 | 370 371 | 390 391 |
| 331 332 | 351 352 | 371 372 | 391 392 |
| 332 333 | 352 353 | 372 373 | 392 393 |
| 333 334 | 353 354 | 373 374 | 393 394 |
| 334 335 | 354 355 | 374 375 | 394 395 |
| 335 336 | 355 356 | 375 376 | 395 396 |
| 336 337 | 356 357 | 376 377 | 396 397 |
| 337 338 | 357 358 | 377 378 | 397 398 |
| 338 339 | 358 359 | 378 379 | 398 399 |
| 339 340 | 359 360 | 379 380 | 399. |

2. The wireless apparatus of claim 1, wherein:

said wireless signal is an orthogonal frequency division multiplexing (OFDM) signal.

3. The wireless apparatus of claim 1, further comprising:

a mapper, between said FEC coder and said wireless transmitter, to map said code word based on a predetermined modulation scheme; and an inverse discrete Fourier transform unit to convert mapped data from a frequency domain representation to a time domain representation.

4. The wireless apparatus of claim 1, wherein:

said first portion of said parity check matrix is a portion that includes columns of said parity check matrix having a column weight of 4.

5. The wireless apparatus of claim 1, wherein: said first portion of said parity check matrix includes said entire parity check matrix.

6. The wireless apparatus of claim 1, wherein: said LDPC code is a (2000, 1600) LDPC code.

7. The wireless apparatus of claim 1, wherein: said wireless apparatus is a wireless user device for use in a wireless network.

8. The wireless apparatus of claim 1, wherein: said wireless apparatus is a wireless access point.

9. The wireless apparatus of claim 1, wherein: said wireless apparatus is a wireless network interface module.

10. The wireless apparatus of claim 1, wherein: said wireless apparatus is an integrated circuit.

11. A computer implemented method comprising:

accessing a computer readable storage medium storing a representation of at least a first portion of a parity check matrix, wherein said said first portion of said parity check matrix includes at least half of said parity check matrix;

matrix multiplying input data by a transpose of said first portion of said parity check matrix;

processing a result of said matrix multiplication using differential encoding to generate coded data;

concatenating said input data and said coded data to form a code word; and generating and transmitting a wireless signal that includes said code word;

wherein said parity check matrix, in list file form, is substantially as follows:

2000 400
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 1

| | | | |
|---|---|---|---|
| 143 225 316 323 | 290 350 370 382 | 194 239 243 293 | 111 162 190 227 |
| 92 140 191 358 | 56 94 184 215 | 90 144 228 350 | 189 272 288 302 |
| 69 315 329 343 | 84 119 337 344 | 170 206 321 395 | 14 49 147 334 |
| 6 121 205 284 | 2 156 244 398 | 72 138 254 300 | 33 53 213 238 |
| 58 66 254 337 | 9 106 200 336 | 25 196 201 279 | 53 219 368 379 |
| 1 47 178 395 | 22 37 150 270 | 56 59 362 379 | 126 149 188 339 |
| 129 151 212 228 | 3 110 326 367 | 28 121 170 277 | 108 118 182 393 |
| 66 146 243 265 | 235 276 290 335 | 61 273 351 386 | 0 37 160 295 |
| 22 140 157 180 | 82 187 193 297 | 71 76 232 328 | 158 200 335 356 |
| 120 208 313 321 | 43 183 297 379 | 62 109 190 201 | 11 20 229 397 |
| 77 86 212 250 | 119 163 178 217 | 21 32 216 393 | 162 231 270 377 |
| 79 193 262 336 | 61 129 185 200 | 37 170 209 342 | 14 102 139 158 |
| 43 104 125 376 | 34 38 104 295 | 49 58 357 399 | 28 79 155 318 |
| 55 114 134 293 | 119 289 349 377 | 18 23 31 373 | 28 40 63 236 |
| 240 283 299 333 | 50 314 322 367 | 159 172 195 366 | 163 181 258 279 |
| 0 24 57 100 | 28 48 248 382 | 213 335 337 378 | 158 176 273 334 |
| 46 84 322 341 | 32 41 128 201 | 1 103 159 277 | 80 236 256 380 |
| 5 43 45 221 | 91 115 220 368 | 96 159 209 387 | 74 156 214 358 |

-continued

| | | | |
|---|---|---|---|
| 29 217 274 301 | 45 151 196 265 | 102 165 234 378 | 176 229 251 283 |
| 81 93 116 278 | 152 190 198 317 | 173 245 356 376 | 19 104 114 162 |
| 93 174 213 231 | 157 212 242 275 | 57 230 240 314 | 141 284 291 358 |
| 64 201 251 385 | 2 40 249 283 | 1 89 153 166 | 77 123 157 361 |
| 76 134 278 370 | 195 280 299 345 | 25 32 264 342 | 141 154 215 338 |
| 71 93 182 398 | 142 151 220 395 | 265 276 321 324 | 55 294 296 298 |
| 38 174 250 377 | 70 121 252 382 | 57 211 274 360 | 80 109 272 364 |
| 19 116 357 372 | 52 244 279 297 | 12 291 311 348 | 43 206 287 363 |
| 81 91 164 307 | 22 131 256 349 | 34 220 258 282 | 81 175 206 261 |
| 180 186 241 251 | 47 52 339 346 | 52 58 109 379 | 31 94 275 317 |
| 239 254 331 342 | 50 288 342 388 | 116 248 337 369 | 10 123 141 279 |
| 107 149 250 295 | 26 87 247 283 | 87 146 183 278 | 44 64 157 270 |
| 73 221 295 362 | 67 127 132 136 | 42 96 318 361 | 160 243 290 373 |
| 75 97 242 279 | 146 264 321 323 | 32 176 312 361 | 39 217 262 324 |
| 32 197 244 313 | 210 275 319 346 | 69 258 310 389 | 19 185 312 389 |
| 245 248 276 296 | 57 160 252 261 | 1 84 182 300 | 211 271 277 291 |
| 59 230 322 347 | 26 54 170 197 | 45 124 161 396 | 19 148 155 324 |
| 17 246 291 364 | 120 218 229 341 | 15 76 99 101 | 24 94 124 314 |
| 125 157 227 390 | 44 53 124 323 | 62 248 354 375 | 3 85 193 349 |
| 122 205 279 348 | 0 113 315 358 | 78 258 262 311 | 68 175 202 253 |
| 61 298 340 380 | 110 144 246 298 | 181 265 364 368 | 139 160 337 377 |
| 12 31 256 328 | 89 91 99 346 | 60 168 227 254 | 21 224 249 398 |
| 113 122 206 327 | 258 299 306 331 | 1 51 135 149 | 18 96 164 326 |
| 7 10 156 245 | 83 194 207 349 | 257 294 331 356 | 84 103 107 359 |
| 140 182 192 235 | 43 141 175 329 | 204 260 288 294 | 92 338 350 355 |
| 161 291 324 387 | 0 68 170 262 | 45 144 185 383 | 16 70 242 338 |
| 31 232 237 350 | 25 36 153 309 | 173 310 329 362 | 20 74 141 179 |
| 30 184 235 387 | 57 62 273 323 | 15 165 305 348 | 159 246 248 365 |
| 136 226 269 327 | 7 19 75 264 | 27 66 85 182 | 207 292 387 399 |
| 4 93 136 167 | 21 254 259 366 | 47 235 238 246 | 38 148 303 347 |
| 47 148 309 348 | 8 97 156 172 | 230 276 293 367 | 68 113 296 389 |
| 73 225 252 290 | 9 185 313 330 | 118 150 267 324 | 12 257 286 325 |
| 44 213 361 386 | 55 219 253 393 | 68 82 309 398 | 50 287 294 327 |
| 79 319 361 381 | 86 120 185 233 | 72 154 226 231 | 149 259 356 367 |
| 74 251 339 356 | 41 136 191 242 | 76 135 151 384 | 3 12 178 309 |
| 100 105 246 293 | 194 265 303 393 | 39 48 80 309 | 63 92 166 368 |
| 68 101 191 285 | 256 285 310 399 | 0 178 305 353 | 97 190 199 363 |
| 32 103 323 355 | 103 247 275 378 | 88 136 196 321 | 13 86 92 308 |
| 122 188 228 305 | 115 218 225 285 | 37 95 222 300 | 132 141 221 322 |
| 6 77 291 397 | 98 196 217 328 | 23 343 358 369 | 213 257 348 396 |
| 70 76 259 276 | 177 267 306 350 | 195 252 303 349 | 91 147 294 325 |
| 72 270 335 348 | 82 299 320 395 | 9 81 102 317 | 14 27 48 222 |
| 93 147 255 312 | 139 251 364 381 | 20 219 285 316 | 11 81 110 360 |
| 92 112 259 388 | 42 118 178 194 | 219 281 304 354 | 10 50 357 393 |
| 9 18 61 308 | 73 100 198 286 | 33 121 319 351 | 35 89 248 252 |
| 3 137 139 257 | 68 249 292 376 | 21 157 191 260 | 6 55 319 345 |
| 165 217 345 354 | 13 216 221 256 | 0 88 303 307 | 107 116 223 271 |
| 78 134 263 280 | 127 138 177 398 | 13 23 62 268 | 168 240 261 384 |
| 186 213 227 303 | 20 69 239 264 | 13 173 279 320 | 54 204 295 351 |
| 68 194 294 346 | 3 126 132 163 | 117 189 253 392 | 3 51 146 299 |
| 35 225 284 312 | 66 88 169 271 | 32 40 57 350 | 74 184 307 361 |
| 117 188 340 346 | 88 197 201 387 | 57 123 148 368 | 9 202 272 387 |
| 106 198 281 329 | 31 141 151 285 | 34 259 267 314 | 111 127 157 330 |
| 36 105 225 236 | 72 163 187 311 | 55 72 87 223 | 79 125 239 341 |
| 90 139 183 299 | 24 54 249 297 | 43 180 185 252 | 147 172 187 397 |
| 152 160 292 354 | 64 143 322 360 | 23 113 133 277 | 230 245 277 352 |
| 11 115 227 236 | 53 73 122 256 | 258 285 347 350 | 49 202 350 381 |
| 152 202 211 373 | 100 138 214 226 | 246 253 318 399 | 34 56 167 242 |
| 4 173 346 374 | 265 348 373 378 | 12 78 90 369 | 36 58 61 83 |
| 132 197 238 279 | 42 62 113 174 | 17 93 96 102 | 107 110 133 251 |
| 16 94 150 222 | 29 313 349 358 | 109 162 318 360 | 100 245 295 330 |
| 241 344 375 386 | 154 179 217 268 | 22 83 151 290 | 16 71 175 397 |
| 31 121 161 231 | 164 289 380 392 | 141 191 240 266 | 106 206 229 236 |
| 9 33 197 350 | 109 165 236 312 | 25 90 138 390 | 177 308 371 387 |
| 87 197 233 312 | 92 141 193 238 | 81 113 265 382 | 89 122 207 362 |
| 100 111 129 368 | 190 243 267 275 | 88 142 210 283 | 3 166 190 305 |
| 184 278 289 346 | 95 143 203 393 | 10 40 43 140 | 155 171 289 336 |
| 76 177 227 356 | 130 213 264 308 | 2 195 268 328 | 34 37 293 301 |
| 11 132 246 314 | 102 133 217 226 | 117 240 257 374 | 143 189 255 338 |
| 46 93 103 309 | 69 88 116 295 | 298 332 350 365 | 38 75 137 166 |
| 20 33 64 196 | 108 217 273 322 | 60 122 240 313 | 62 92 124 366 |
| 111 134 194 204 | 26 287 306 343 | 157 215 274 397 | 73 83 105 136 |
| 76 116 140 238 | 8 18 136 152 | 11 41 164 274 | 69 134 200 366 |
| 189 298 326 381 | 110 240 245 334 | 67 76 92 104 | 179 324 366 386 |
| 235 317 320 333 | 225 255 278 310 | 19 192 305 344 | 72 82 188 192 |
| 127 301 348 376 | 63 168 170 303 | 23 35 125 224 | 100 120 189 375 |
| 51 286 309 377 | 8 17 255 314 | 152 163 352 385 | 244 252 318 329 |
| 17 70 139 187 | 28 92 98 200 | 40 161 165 329 | 3 105 116 203 |
| 54 180 184 344 | 112 201 244 392 | 113 215 245 378 | 280 282 288 365 |

-continued

| | | | |
|---|---|---|---|
| 85 311 318 327 | 134 216 344 383 | 80 168 262 382 | 38 196 330 369 |
| 263 312 364 369 | 21 97 115 396 | 81 136 165 239 | 20 31 113 381 |
| 97 149 198 336 | 28 69 120 380 | 2 42 248 323 | 56 173 205 390 |
| 2 30 165 366 | 181 190 288 379 | 90 264 269 280 | 17 44 159 398 |
| 41 75 169 302 | 38 73 249 368 | 22 132 258 368 | 108 167 174 374 |
| 210 271 330 334 | 45 49 264 394 | 65 124 129 325 | 90 105 172 257 |
| 60 109 199 348 | 89 112 218 316 | 95 105 111 385 | 93 165 180 353 |
| 27 89 214 388 | 144 186 297 343 | 109 233 250 302 | 137 289 296 386 |
| 77 79 83 289 | 152 177 233 237 | 8 33 80 318 | 241 273 276 359 |
| 119 236 323 383 | 74 171 223 334 | 51 253 281 288 | 44 94 211 286 |
| 1 44 271 372 | 4 16 44 89 | 209 237 346 391 | 166 184 204 226 |
| 25 42 104 215 | 103 165 177 358 | 12 198 221 269 | 98 281 357 389 |
| 144 153 357 362 | 53 217 342 383 | 9 141 229 306 | 41 107 187 298 |
| 133 153 273 383 | 58 88 126 370 | 0 114 219 300 | 19 47 379 399 |
| 152 174 269 355 | 4 214 243 383 | 242 289 318 335 | 1 16 272 296 |
| 107 193 210 320 | 5 96 155 354 | 41 90 163 215 | 107 203 283 322 |
| 194 298 317 331 | 7 61 214 237 | 65 80 99 167 | 77 245 266 390 |
| 22 112 139 222 | 90 241 261 367 | 269 296 303 356 | 29 166 345 364 |
| 147 152 221 365 | 39 161 202 206 | 45 106 232 346 | 61 229 356 361 |
| 20 48 130 353 | 101 132 135 250 | 86 195 293 391 | 70 105 229 250 |
| 58 100 125 172 | 117 191 213 352 | 140 193 245 321 | 268 334 344 368 |
| 79 181 242 313 | 132 233 270 303 | 88 150 183 380 | 78 82 283 393 |
| 174 254 304 321 | 16 251 266 370 | 230 253 315 373 | 7 299 327 334 |
| 70 129 283 385 | 41 45 60 99 | 53 184 258 263 | 47 82 117 126 |
| 18 79 296 345 | 182 197 276 331 | 17 79 261 286 | 86 100 337 379 |
| 14 25 34 52 | 40 257 262 322 | 94 293 302 397 | 299 347 372 375 |
| 31 88 212 226 | 148 208 332 352 | 170 218 358 376 | 150 156 299 302 |
| 26 53 123 165 | 127 159 253 290 | 61 246 287 292 | 145 252 294 377 |
| 101 108 248 328 | 273 289 325 341 | 61 162 245 303 | 155 218 250 392 |
| 49 115 190 395 | 95 145 231 297 | 25 286 333 355 | 131 172 250 278 |
| 23 119 139 282 | 70 110 225 313 | 159 241 263 354 | 17 64 107 195 |
| 27 206 209 324 | 50 112 166 302 | 134 186 305 327 | 26 55 142 181 |
| 203 221 332 356 | 68 97 128 218 | 33 38 283 301 | 106 181 327 342 |
| 101 103 340 368 | 10 124 128 309 | 24 225 233 338 | 7 112 256 377 |
| 44 196 198 280 | 57 131 209 296 | 177 225 232 281 | 108 300 310 312 |
| 39 148 192 385 | 230 237 264 371 | 77 149 241 310 | 208 218 364 378 |
| 37 130 182 207 | 28 118 231 283 | 319 325 363 374 | 53 114 278 291 |
| 57 242 262 316 | 5 114 230 309 | 77 251 308 379 | 131 138 201 365 |
| 20 171 259 396 | 122 189 204 251 | 183 203 290 330 | 225 279 371 378 |
| 257 288 338 361 | 74 151 203 218 | 158 246 275 352 | 122 275 376 395 |
| 12 290 362 367 | 69 270 288 359 | 78 99 210 238 | 169 217 239 357 |
| 153 236 304 330 | 22 49 291 383 | 222 271 380 393 | 18 65 128 288 |
| 12 144 261 329 | 80 90 174 249 | 79 107 201 351 | 6 62 86 198 |
| 33 92 106 173 | 182 310 314 318 | 66 90 275 287 | 37 80 119 211 |
| 68 89 159 308 | 115 254 336 399 | 65 219 247 398 | 0 46 139 339 |
| 9 23 41 301 | 42 63 135 343 | 16 203 207 237 | 0 30 216 306 |
| 109 160 278 387 | 46 232 385 391 | 101 216 333 357 | 82 152 277 367 |
| 138 235 241 356 | 24 27 171 183 | 2 39 326 373 | 23 178 350 366 |
| 225 256 321 332 | 237 293 322 352 | 51 151 305 341 | 121 212 243 384 |
| 32 42 253 275 | 81 90 223 363 | 6 25 30 130 | 257 284 326 382 |
| 95 199 219 225 | 71 85 128 380 | 2 91 146 227 | 57 138 311 343 |
| 116 328 345 395 | 159 309 314 334 | 46 141 273 298 | 295 318 322 377 |
| 128 159 161 207 | 17 117 315 379 | 157 331 374 385 | 78 343 373 377 |
| 111 306 363 373 | 87 120 206 267 | 172 223 237 258 | 79 89 131 254 |
| 174 256 368 381 | 67 116 188 349 | 15 93 128 250 | 61 74 304 382 |
| 18 104 115 317 | 63 232 338 365 | 94 261 312 341 | 30 70 168 253 |
| 102 115 140 394 | 178 272 327 392 | 167 186 202 372 | 64 156 306 332 |
| 91 96 128 327 | 19 35 204 386 | 8 29 355 393 | 162 197 255 275 |
| 97 99 300 385 | 194 235 289 345 | 36 126 155 373 | 33 71 91 112 |
| 40 150 229 316 | 29 50 154 315 | 145 195 227 333 | 13 132 247 391 |
| 124 315 322 359 | 22 47 353 387 | 45 206 344 369 | 22 208 226 392 |
| 21 221 286 301 | 0 137 143 167 | 8 166 301 397 | 56 60 158 164 |
| 27 88 147 216 | 21 162 195 339 | 11 47 141 184 | 20 105 120 199 |
| 133 232 236 341 | 189 200 275 372 | 5 81 176 260 | 63 139 216 325 |
| 90 107 293 370 | 157 218 296 363 | 58 215 326 364 | 23 64 310 348 |
| 17 32 254 263 | 52 110 151 319 | 76 87 102 315 | 63 130 188 352 |
| 8 173 238 266 | 30 131 153 174 | 98 131 259 332 | 23 45 160 165 |
| 30 167 169 391 | 28 32 182 198 | 15 30 35 55 | 42 114 382 399 |
| 43 213 328 362 | 56 263 316 328 | 0 122 269 346 | 25 207 339 365 |
| 73 231 244 282 | 87 168 275 343 | 38 162 311 373 | 16 334 374 398 |
| 71 221 245 253 | 24 31 131 148 | 143 313 329 340 | 86 251 274 277 |
| 215 225 258 335 | 166 203 208 231 | 80 260 316 348 | 157 166 297 316 |
| 46 87 263 384 | 126 170 224 369 | 44 158 220 292 | 171 200 230 265 |
| 81 96 282 338 | 20 78 193 213 | 117 241 295 363 | 34 107 325 364 |
| 192 222 306 353 | 123 180 253 323 | 187 321 355 378 | 71 220 227 330 |
| 8 115 292 305 | 208 229 271 386 | 167 226 281 351 | 177 263 277 344 |
| 36 170 186 260 | 1 52 116 383 | 0 200 309 384 | 75 138 262 293 |
| 10 85 212 300 | 13 55 71 106 | 36 171 193 328 | 189 300 366 377 |
| 5 129 198 365 | 7 306 347 364 | 107 178 228 240 | 147 175 296 320 |

-continued

| | | | |
|---|---|---|---|
| 19 107 153 308 | 145 163 197 228 | 80 146 156 375 | 2 51 145 208 |
| 10 57 98 215 | 66 97 212 320 | 75 90 290 312 | 126 271 310 351 |
| 181 211 228 339 | 133 176 282 305 | 20 55 131 215 | 144 197 277 360 |
| 62 89 163 295 | 22 187 205 372 | 99 127 231 344 | 28 35 115 289 |
| 43 77 113 143 | 102 160 180 258 | 156 176 301 313 | 54 108 270 279 |
| 125 149 196 218 | 164 197 311 398 | 41 146 247 290 | 23 82 144 396 |
| 83 147 183 279 | 75 119 186 254 | 49 52 61 76 | 78 93 95 275 |
| 62 145 180 397 | 6 15 65 396 | 24 74 310 326 | 145 169 211 278 |
| 84 280 331 360 | 30 108 341 399 | 56 196 212 332 | 29 163 300 320 |
| 114 190 281 359 | 217 276 326 347 | 76 205 335 385 | 33 147 219 391 |
| 69 129 168 187 | 160 237 274 285 | 75 101 209 349 | 199 214 265 280 |
| 119 144 180 249 | 173 248 262 348 | 28 172 242 294 | 62 133 156 219 |
| 7 47 218 308 | 52 65 218 351 | 18 71 267 297 | 31 34 72 115 |
| 217 251 269 390 | 135 140 253 366 | 84 115 233 384 | 246 260 267 286 |
| 7 266 309 337 | 13 75 152 188 | 24 33 122 234 | 18 60 167 328 |
| 24 69 142 394 | 216 224 305 331 | 98 272 300 342 | 55 112 179 381 |
| 98 138 228 351 | 29 93 197 381 | 210 221 268 337 | 288 317 324 389 |
| 72 181 336 355 | 21 222 282 284 | 8 94 154 347 | 43 320 334 382 |
| 12 47 160 172 | 175 193 361 372 | 195 285 321 327 | 5 29 145 281 |
| 84 178 230 343 | 54 69 298 308 | 12 51 54 354 | 25 124 232 345 |
| 80 238 321 376 | 93 169 209 328 | 16 41 149 389 | 11 119 339 359 |
| 170 213 331 367 | 39 59 334 391 | 55 66 206 297 | 5 36 231 316 |
| 12 136 274 326 | 108 254 340 376 | 129 202 214 285 | 15 138 354 389 |
| 13 51 96 147 | 141 246 264 388 | 73 96 104 310 | 25 82 136 180 |
| 23 264 334 346 | 96 267 362 392 | 55 200 270 318 | 20 103 167 266 |
| 29 122 183 356 | 131 234 291 330 | 58 120 150 217 | 112 292 359 371 |
| 78 287 330 349 | 4 168 220 235 | 58 279 339 397 | 184 201 240 328 |
| 42 69 131 198 | 130 195 216 367 | 60 180 247 308 | 77 160 307 339 |
| 36 43 189 216 | 108 148 290 302 | 48 127 213 356 | 74 147 280 389 |
| 44 142 195 344 | 85 214 362 395 | 62 128 291 329 | 127 149 358 387 |
| 40 147 260 330 | 48 100 118 346 | 26 35 127 323 | 50 59 117 185 |
| 125 325 379 387 | 91 104 355 358 | 77 144 286 296 | 11 189 212 220 |
| 90 111 126 301 | 176 342 351 390 | 10 47 192 259 | 123 135 226 372 |
| 113 177 226 273 | 6 45 123 126 | 122 196 210 329 | 83 86 149 386 |
| 96 172 181 218 | 69 241 268 274 | 63 162 235 268 | 26 95 121 163 |
| 17 124 154 373 | 158 324 371 399 | 25 45 218 310 | 30 54 178 315 |
| 87 285 306 376 | 62 232 264 373 | 67 336 354 393 | 136 301 341 365 |
| 83 163 173 299 | 103 106 146 344 | 16 278 347 381 | 21 59 265 299 |
| 65 87 245 333 | 134 268 295 398 | 14 39 209 395 | 111 154 282 297 |
| 161 267 284 293 | 120 220 250 354 | 21 55 85 304 | 6 74 290 349 |
| 1 29 54 379 | 115 208 355 398 | 128 135 194 325 | 121 142 174 236 |
| 141 170 183 232 | 74 190 343 352 | 116 159 258 341 | 108 129 152 261 |
| 5 40 167 238 | 258 325 332 371 | 125 132 210 219 | 152 164 205 377 |
| 15 44 95 239 | 14 256 347 353 | 60 67 150 203 | 144 281 332 335 |
| 92 244 315 326 | 55 91 145 168 | 96 186 247 353 | 7 37 265 285 |
| 66 128 170 221 | 126 130 181 323 | 30 72 320 388 | 56 283 338 382 |
| 21 109 174 397 | 34 120 227 316 | 17 137 186 193 | 78 217 337 351 |
| 5 154 201 239 | 237 337 355 394 | 34 229 265 284 | 6 247 249 370 |
| 80 183 261 293 | 34 186 219 313 | 129 207 282 287 | 1 161 241 255 |
| 18 143 335 392 | 280 330 340 375 | 68 118 275 305 | 101 166 183 220 |
| 13 139 155 230 | 76 230 354 378 | 153 172 249 307 | 99 198 326 335 |
| 145 156 300 327 | 5 178 293 297 | 106 179 212 378 | 105 234 340 384 |
| 118 153 171 366 | 142 223 234 381 | 22 48 105 347 | 60 233 242 397 |
| 15 152 331 364 | 48 239 260 399 | 98 137 346 379 | 207 215 223 293 |
| 161 171 307 317 | 58 270 336 360 | 41 98 165 232 | 233 279 351 380 |
| 49 56 127 185 | 24 123 271 347 | 54 63 99 123 | 83 106 188 311 |
| 104 168 283 305 | 12 76 137 280 | 81 213 315 394 | 97 185 361 392 |
| 199 202 343 399 | 107 226 302 367 | 38 66 87 191 | 14 26 72 304 |
| 15 164 192 273 | 175 186 208 366 | 71 121 294 396 | 51 162 194 387 |
| 62 199 222 228 | 65 183 369 376 | 109 200 345 375 | 94 245 273 287 |
| 67 94 166 256 | 60 169 292 350 | 33 70 217 266 | 26 177 205 314 |
| 85 227 250 321 | 44 169 240 362 | 11 111 210 240 | 14 92 385 389 |
| 91 121 295 324 | 146 187 293 319 | 261 271 290 396 | 111 211 366 390 |
| 3 16 308 340 | 198 219 343 380 | 190 225 298 369 | 27 71 110 327 |
| 143 157 307 395 | 148 188 256 304 | 16 140 227 352 | 99 257 359 389 |
| 36 77 116 340 | 171 189 266 341 | 118 183 262 383 | 124 295 372 397 |
| 3 98 101 125 | 94 108 244 288 | 17 218 260 350 | 12 43 117 356 |
| 39 151 364 377 | 16 42 200 250 | 50 56 278 351 | 65 117 136 354 |
| 194 227 231 267 | 2 64 193 399 | 15 36 150 280 | 39 67 191 212 |
| 59 200 206 389 | 129 172 276 379 | 18 107 151 176 | 80 166 176 358 |
| 21 106 287 389 | 26 176 234 319 | 22 188 244 337 | 99 208 353 361 |
| 33 268 340 387 | 118 135 205 312 | 72 186 302 350 | 32 46 104 222 |
| 140 150 395 398 | 115 176 290 359 | 65 145 221 239 | 4 25 72 203 |
| 88 352 360 367 | 9 143 188 374 | 52 117 331 393 | 2 124 130 262 |
| 28 113 210 232 | 63 289 292 313 | 125 202 226 309 | 38 281 316 327 |
| 66 77 158 268 | 231 245 336 342 | 115 169 276 298 | 70 87 100 395 |
| 61 98 202 330 | 35 38 246 299 | 192 268 296 391 | 26 231 295 369 |
| 47 67 181 247 | 104 246 249 281 | 31 167 220 223 | 214 234 269 288 |
| 51 204 209 307 | 161 248 285 325 | 39 241 358 382 | 77 154 320 365 |

-continued

| | | | |
|---|---|---|---|
| 125 198 289 301 | 13 21 192 220 | 67 112 159 236 | 27 76 86 155 |
| 136 214 216 263 | 82 89 200 209 | 71 180 208 266 | 65 139 175 240 |
| 97 270 314 338 | 8 264 313 368 | 59 143 248 394 | 33 130 223 286 |
| 78 127 215 226 | 11 26 242 286 | 99 128 223 388 | 215 271 317 344 |
| 27 242 348 357 | 37 248 303 388 | 6 192 221 351 | 8 47 113 153 |
| 94 181 191 363 | 64 187 324 392 | 129 238 257 378 | 194 233 361 377 |
| 7 91 93 348 | 209 216 230 243 | 29 192 252 392 | 88 202 284 394 |
| 60 193 267 333 | 73 241 250 260 | 6 110 177 269 | 29 118 285 380 |
| 185 237 272 381 | 181 187 235 239 | 29 79 205 241 | 96 154 312 383 |
| 15 52 166 225 | 63 193 300 329 | 233 246 325 331 | 19 250 318 359 |
| 27 100 126 275 | 291 332 354 396 | 11 211 321 384 | 32 282 289 334 |
| 70 96 163 333 | 19 103 260 383 | 144 282 337 386 | 56 272 294 303 |
| 11 175 273 282 | 5 303 328 375 | 33 79 327 385 | 10 68 72 210 |
| 14 212 392 398 | 131 237 298 384 | 30 110 179 321 | 184 261 382 386 |
| 91 105 300 382 | 103 183 281 286 | 86 133 234 284 | 202 204 315 342 |
| 4 79 232 370 | 5 224 263 358 | 54 58 72 289 | 66 102 195 207 |
| 21 75 158 347 | 197 199 247 382 | 22 145 269 373 | 97 243 272 301 |
| 331 341 343 386 | 18 228 332 344 | 81 172 211 381 | 92 128 156 304 |
| 0 103 163 270 | 16 26 57 68 | 59 246 252 255 | 68 313 385 390 |
| 7 95 171 326 | 2 158 259 384 | 34 113 207 286 | 13 32 49 271 |
| 16 24 49 133 | 128 181 371 398 | 69 100 222 231 | 4 80 123 277 |
| 58 242 363 390 | 98 179 247 319 | 14 150 387 396 | 89 135 243 375 |
| 8 236 254 290 | 41 71 138 326 | 17 73 228 248 | 88 372 381 388 |
| 50 83 140 370 | 175 244 301 317 | 29 193 232 259 | 66 108 222 274 |
| 233 258 340 364 | 81 145 226 371 | 40 148 359 374 | 28 59 164 167 |
| 201 204 313 324 | 102 199 213 283 | 85 161 240 262 | 27 119 364 373 |
| 73 311 388 397 | 64 164 169 224 | 5 17 199 339 | 35 245 335 374 |
| 109 186 243 261 | 50 152 224 276 | 150 230 306 341 | 139 162 184 228 |
| 116 125 276 398 | 42 184 390 398 | 46 123 204 318 | 53 84 214 363 |
| 58 185 287 293 | 1 73 349 396 | 71 130 143 271 | 17 153 242 386 |
| 40 203 279 314 | 238 317 354 385 | 208 268 365 396 | 30 137 274 313 |
| 46 50 86 255 | 46 70 296 379 | 257 263 336 395 | 68 169 256 369 |
| 23 48 109 120 | 156 247 278 334 | 218 267 334 360 | 30 119 206 394 |
| 236 297 325 333 | 130 235 319 390 | 53 74 255 302 | 224 325 365 380 |
| 123 155 320 384 | 0 108 120 213 | 104 175 302 311 | 50 178 188 274 |
| 36 67 169 274 | 11 93 146 235 | 228 338 360 369 | 2 56 169 225 |
| 54 102 191 239 | 96 255 374 376 | 8 35 112 394 | 43 75 167 296 |
| 8 109 198 391 | 85 146 204 366 | 39 130 336 365 | 28 131 274 304 |
| 143 176 238 370 | 146 254 365 391 | 13 170 198 378 | 107 263 309 385 |
| 39 41 105 208 | 114 148 151 373 | 56 156 162 181 | 101 238 310 395 |
| 126 197 342 357 | 60 121 145 343 | 47 95 104 272 | 35 58 238 345 |
| 9 40 191 384 | 112 195 277 296 | 9 291 333 362 | 43 61 106 391 |
| 51 148 207 270 | 29 302 310 334 | 121 128 193 322 | 86 113 161 390 |
| 49 114 243 360 | 38 156 251 280 | 159 276 311 392 | 35 316 329 376 |
| 60 87 303 370 | 130 209 249 266 | 15 42 105 267 | 37 161 224 306 |
| 138 190 248 283 | 43 161 250 322 | 4 23 202 388 | 14 53 98 269 |
| 78 97 139 144 | 7 168 182 185 | 23 61 260 307 | 179 207 236 269 |
| 177 180 244 272 | 15 45 189 286 | 42 124 355 380 | 10 163 205 369 |
| 44 123 243 287 | 191 205 301 305 | 124 259 374 386 | 31 92 162 396 |
| 122 211 304 388 | 155 235 282 299 | 136 140 207 317 | 85 268 314 345 |
| 70 117 278 332 | 40 114 194 372 | 9 278 280 325 | 1 31 249 319 |
| 31 85 343 394 | 249 263 323 372 | 4 19 59 360 | 35 56 281 333 |
| 47 133 244 312 | 36 214 252 380 | 21 79 94 356 | 137 199 223 376 |
| 20 144 299 368 | 176 201 258 373 | 26 158 345 353 | 52 320 338 362 |
| 25 84 335 395 | 102 208 340 379 | 95 172 261 374 | 65 224 307 390 |
| 146 310 346 384 | 51 195 265 335 | 327 345 369 396 | 142 222 253 335 |
| 101 138 193 307 | 63 117 159 196 | 27 37 185 277 | 83 88 180 363 |
| 234 314 342 394 | 13 16 37 143 | 257 259 321 362 | 153 371 374 393 |
| 19 109 127 214 | 70 95 306 391 | 23 253 280 370 | 142 161 286 312 |
| 40 80 132 196 | 178 187 249 316 | 13 44 99 224 | 34 111 221 243 |
| 183 213 229 249 | 37 52 162 307 | 57 69 114 224 | 40 66 91 391 |
| 105 228 232 238 | 173 211 237 344 | 70 154 185 352 | 55 120 165 209 |
| 64 278 290 357 | 41 114 210 233 | 34 269 338 367 | 4 28 46 292 |
| 20 116 173 251 | 102 202 287 354 | 77 170 234 326 | 149 222 244 357 |
| 97 261 308 393 | 136 185 223 303 | 138 171 192 269 | 190 339 362 364 |
| 20 100 146 165 | 86 265 287 355 | 173 192 284 371 | 10 67 187 338 |
| 67 84 164 376 | 11 66 131 255 | 68 155 164 353 | 2 132 168 263 |
| 155 260 300 352 | 124 147 319 392 | 4 22 201 212 | 9 63 294 305 |
| 116 118 147 233 | 46 67 152 380 | 206 234 259 270 | 26 60 148 224 |
| 61 174 328 371 | 64 82 111 312 | 35 168 176 389 | 59 157 188 224 |
| 30 60 155 368 | 78 123 264 317 | 103 162 351 370 | 139 220 320 349 |
| 39 142 169 232 | 24 45 85 295 | 49 59 102 212 | 69 202 336 385 |
| 54 76 318 358 | 118 141 244 255 | 155 192 270 287 | 20 92 313 331 |
| 196 341 352 391 | 17 164 229 252 | 4 81 95 119 | 44 79 316 392 |
| 61 63 333 350 | 27 132 134 179 | 135 138 200 301 | 104 177 254 335 |
| 42 130 307 331 | 173 216 220 247 | 11 32 294 357 | 4 199 234 308 |
| 25 190 224 282 | 246 306 375 384 | 10 73 84 173 | 76 139 192 332 |
| 57 238 375 393 | 75 160 187 263 | 25 48 97 145 | 1 252 322 331 |
| 5 158 186 355 | 171 236 329 389 | 7 223 280 366 | 89 217 352 378 |

-continued

| | | | |
|---|---|---|---|
| 83 110 385 399 | 58 178 196 380 | 83 137 247 276 | 83 156 175 211 |
| 48 154 166 308 | 171 203 256 370 | 31 56 117 325 | 75 132 341 364 |
| 2 75 288 340 | 5 134 277 330 | 211 281 307 358 | 78 106 204 272 |
| 86 223 248 264 | 110 153 320 336 | 49 118 211 372 | 65 159 214 284 |
| 67 135 158 350 | 24 93 369 383 | 70 179 221 371 | 141 161 342 353 |
| 80 133 345 351 | 35 100 244 361 | 38 260 266 388 | 336 375 381 397 |
| 143 260 291 302 | 34 142 182 363 | 99 160 273 330 | 51 97 374 399 |
| 84 298 339 375 | 10 198 303 308 | 194 274 324 368 | 108 223 317 360 |
| 219 234 357 374 | 146 258 273 361 | 51 127 158 191 | 82 125 216 228 |
| 0 118 292 328 | 113 132 220 359 | 2 98 164 393 | 134 154 172 317 |
| 19 119 226 387 | 39 179 252 274 | 90 108 149 315 | 49 65 74 157 |
| 115 167 294 319 | 6 176 199 318 | 8 122 129 299 | 3 112 266 356 |
| 53 222 233 236 | 33 55 95 124 | 8 48 64 210 | 81 204 254 262 |
| 18 52 63 182 | 134 228 283 329 | 56 106 207 240 | 3 113 263 332 |
| 79 102 148 311 | 75 175 339 371 | 48 87 212 340 | 100 151 205 240 |
| 140 270 351 369 | 78 89 202 322 | 38 231 288 394 | 95 125 180 303 |
| 91 255 289 389 | 85 197 310 390 | 137 353 378 393 | 234 292 306 352 |
| 163 285 330 338 | 59 112 305 323 | 119 150 272 355 | 149 227 349 355 |
| 237 251 312 359 | 154 163 287 305 | 64 92 190 291 | 111 142 267 321 |
| 39 186 288 301 | 83 195 206 264 | 4 51 121 215 | 27 203 228 361 |
| 29 188 211 367 | 45 209 255 311 | 119 171 229 253 | 52 277 309 390 |
| 269 298 391 397 | 54 182 261 302 | 65 357 363 370 | 33 57 284 302 |
| 85 95 292 307 | 128 190 241 384 | 83 172 197 280 | 35 50 66 219 |
| 72 150 266 314 | 7 48 66 82 | 27 131 360 396 | 22 27 149 215 |
| 101 199 253 359 | 173 315 372 382 | 77 136 150 309 | 13 28 84 206 |
| 18 41 259 368 | 41 49 117 320 | 3 121 179 230 | 59 108 337 349 |
| 122 125 185 324 | 45 82 120 133 | 10 104 152 326 | 73 171 273 345 |
| 58 294 318 365 | 6 42 195 295 | 64 134 178 182 | 68 140 200 363 |
| 84 210 216 235 | 171 201 344 377 | 214 300 353 386 | 38 111 233 358 |
| 54 142 147 355 | 94 179 205 344 | 110 254 268 346 | 157 289 328 372 |
| 73 91 174 353 | 32 144 219 315 | 272 304 337 347 | 160 188 284 327 |
| 15 48 292 323 | 226 257 333 386 | 37 165 235 262 | 137 304 349 374 |
| 4 62 67 126 | 24 102 182 375 | 1 36 234 297 | 140 168 204 341 |
| 109 129 191 203 | 49 86 123 175 | 69 281 347 371 | 132 223 298 336 |
| 143 154 168 205 | 62 151 266 298 | 59 264 271 348 | 71 114 184 200 |
| 24 75 127 304 | 272 323 339 367 | 175 255 277 357 | 60 135 323 399 |
| 9 38 179 245 | 187 215 269 294 | 53 173 282 333 | 12 50 103 251 |
| 114 157 229 366 | 116 121 300 363 | 82 87 98 354 | 144 242 244 372 |
| 229 297 323 342 | 57 251 267 386 | 77 106 138 345 | 53 181 221 229 |
| 24 36 89 106 | 14 126 335 379 | 74 329 360 366 | 46 89 180 281 |
| 101 134 140 381 | 31 133 250 268 | 167 322 332 395 | 3 53 285 382 |
| 50 148 194 257 | 9 183 241 342 | 52 88 276 294 | 175 184 205 209 |
| 1 222 340 378 | 37 164 279 324 | 47 199 299 391 | 94 208 276 349 |
| 67 155 220 365 | 118 130 187 270 | 3 219 275 297 | 14 37 131 266 |
| 15 156 210 262 | 135 169 182 319 | 3 30 375 378 | 135 227 367 392 |
| 53 125 134 231 | 6 149 204 220 | 110 134 158 282 | 13 59 103 207 |
| 192 337 357 360 | 63 150 214 259 | 151 188 359 388 | 48 78 84 243 |
| 170 203 216 266 | 19 65 348 388 | 191 199 304 333 | 94 252 262 306 |
| 2 71 74 362 | 15 46 151 383 | 42 191 274 383 | 168 316 324 380 |
| 40 97 101 356 | 22 160 227 230 | 51 99 384 394 | 196 255 260 394 |
| 54 117 145 201 | 124 166 279 317 | 146 343 367 376 | 11 105 178 243 |
| 34 81 147 326 | 45 130 237 361 | 153 247 284 375 | 19 122 177 339 |
| 5 121 256 311 | 6 189 316 347 | 36 133 204 243 | 64 203 304 319 |
| 14 176 272 383 | 74 135 142 311 | 110 224 265 277 | 12 174 194 208 |
| 283 297 340 396 | 85 153 177 222 | 86 129 319 371 | 46 52 271 377 |
| 7 36 307 320 | 120 154 210 237 | 103 127 201 336 | 62 149 169 353 |
| 114 241 271 315 | 0 98 291 388 | 39 50 247 256 | 133 205 239 387 |
| 96 179 249 302 | 32 259 287 333 | 119 165 230 370 | 174 206 285 292 |
| 7 9 170 394 | 184 314 389 397 | 21 82 248 311 | 14 43 99 137 |
| 46 284 308 388 | 101 189 296 383 | 84 137 239 315 | 87 111 371 377 |
| 104 158 332 362 | 126 160 235 240 | 1 155 239 268 | 73 137 177 261 |
| 109 153 189 370 | 111 120 212 288 | 265 278 329 342 | 10 105 184 352 |
| 14 110 338 381 | 10 174 209 291 | 18 118 234 242 | 126 286 347 390 |
| 101 142 257 376 | 112 114 186 239 | 135 189 337 353 | 72 91 148 196 |
| 93 129 359 394 | 164 179 304 346 | 18 28 123 159 | 12 162 292 363 |
| 133 137 142 314 | 90 127 252 284 | 26 44 88 267 | 6 112 273 399 |
| 0 1 | 30 31 | 60 61 | 90 91 |
| 1 2 | 31 32 | 61 62 | 91 92 |
| 2 3 | 32 33 | 62 63 | 92 93 |
| 3 4 | 33 34 | 63 64 | 93 94 |
| 4 5 | 34 35 | 64 65 | 94 95 |
| 5 6 | 35 36 | 65 66 | 95 96 |
| 6 7 | 36 37 | 66 67 | 96 97 |
| 7 8 | 37 38 | 67 68 | 97 98 |
| 8 9 | 38 39 | 68 69 | 98 99 |
| 9 10 | 39 40 | 69 70 | 99 100 |
| 10 11 | 40 41 | 70 71 | 100 101 |
| 11 12 | 41 42 | 71 72 | 101 102 |
| 12 13 | 42 43 | 72 73 | 102 103 |

-continued

| | | | |
|---|---|---|---|
| 13 14 | 43 44 | 73 74 | 103 104 |
| 14 15 | 44 45 | 74 75 | 104 105 |
| 15 16 | 45 46 | 75 76 | 105 106 |
| 16 17 | 46 47 | 76 77 | 106 107 |
| 17 18 | 47 48 | 77 78 | 107 108 |
| 18 19 | 48 49 | 78 79 | 108 109 |
| 19 20 | 49 50 | 79 80 | 109 110 |
| 20 21 | 50 51 | 80 81 | 110 111 |
| 21 22 | 51 52 | 81 82 | 111 112 |
| 22 23 | 52 53 | 82 83 | 112 113 |
| 23 24 | 53 54 | 83 84 | 113 114 |
| 24 25 | 54 55 | 84 85 | 114 115 |
| 25 26 | 55 56 | 85 86 | 115 116 |
| 26 27 | 56 57 | 86 87 | 116 117 |
| 27 28 | 57 58 | 87 88 | 117 118 |
| 28 29 | 58 59 | 88 89 | 118 119 |
| 29 30 | 59 60 | 89 90 | 119 120 |
| 120 121 | 150 151 | 180 181 | 210 211 |
| 121 122 | 151 152 | 181 182 | 211 212 |
| 122 123 | 152 153 | 182 183 | 212 213 |
| 123 124 | 153 154 | 183 184 | 213 214 |
| 124 125 | 154 155 | 184 185 | 214 215 |
| 125 126 | 155 156 | 185 186 | 215 216 |
| 126 127 | 156 157 | 186 187 | 216 217 |
| 127 128 | 157 158 | 187 188 | 217 218 |
| 128 129 | 158 159 | 188 189 | 218 219 |
| 129 130 | 159 160 | 189 190 | 219 220 |
| 130 131 | 160 161 | 190 191 | 220 221 |
| 131 132 | 161 162 | 191 192 | 221 222 |
| 132 133 | 162 163 | 192 193 | 222 223 |
| 133 134 | 163 164 | 193 194 | 223 224 |
| 134 135 | 164 165 | 194 195 | 224 225 |
| 135 136 | 165 166 | 195 196 | 225 226 |
| 136 137 | 166 167 | 196 197 | 226 227 |
| 137 138 | 167 168 | 197 198 | 227 228 |
| 138 139 | 168 169 | 198 199 | 228 229 |
| 139 140 | 169 170 | 199 200 | 229 230 |
| 140 141 | 170 171 | 200 201 | 230 231 |
| 141 142 | 171 172 | 201 202 | 231 232 |
| 142 143 | 172 173 | 202 203 | 232 233 |
| 143 144 | 173 174 | 203 204 | 233 234 |
| 144 145 | 174 175 | 204 205 | 234 235 |
| 145 146 | 175 176 | 205 206 | 235 236 |
| 146 147 | 176 177 | 206 207 | 236 237 |
| 147 148 | 177 178 | 207 208 | 237 238 |
| 148 149 | 178 179 | 208 209 | 238 239 |
| 149 150 | 179 180 | 209 210 | 239 240 |
| 240 241 | 270 271 | 300 301 | 330 331 |
| 241 242 | 271 272 | 301 302 | 331 332 |
| 242 243 | 272 273 | 302 303 | 332 333 |
| 243 244 | 273 274 | 303 304 | 333 334 |
| 244 245 | 274 275 | 304 305 | 334 335 |
| 245 246 | 275 276 | 305 306 | 335 336 |
| 246 247 | 276 277 | 306 307 | 336 337 |
| 247 248 | 277 278 | 307 308 | 337 338 |
| 248 249 | 278 279 | 308 309 | 338 339 |
| 249 250 | 279 280 | 309 310 | 339 340 |
| 250 251 | 280 281 | 310 311 | 340 341 |
| 251 252 | 281 282 | 311 312 | 341 342 |
| 252 253 | 282 283 | 312 313 | 342 343 |
| 253 254 | 283 284 | 313 314 | 343 344 |
| 254 255 | 284 285 | 314 315 | 344 345 |
| 255 256 | 285 286 | 315 316 | 345 346 |
| 256 257 | 286 287 | 316 317 | 346 347 |
| 257 258 | 287 288 | 317 318 | 347 348 |
| 258 259 | 288 289 | 318 319 | 348 349 |
| 259 260 | 289 290 | 319 320 | 349 350 |
| 260 261 | 290 291 | 320 321 | 350 351 |
| 261 262 | 291 292 | 321 322 | 351 352 |
| 262 263 | 292 293 | 322 323 | 352 353 |
| 263 264 | 293 294 | 323 324 | 353 354 |
| 264 265 | 294 295 | 324 325 | 354 355 |
| 265 266 | 295 296 | 325 326 | 355 356 |
| 266 267 | 296 297 | 326 327 | 356 357 |
| 267 268 | 297 298 | 327 328 | 357 358 |
| 268 269 | 298 299 | 328 329 | 358 359 |
| 269 270 | 299 300 | 329 330 | 359 360 |
| 360 361 | 370 371 | 380 381 | 390 391 |
| 361 362 | 371 372 | 381 382 | 391 392 |

-continued

| | | | |
|---|---|---|---|
| 362 363 | 372 373 | 382 383 | 392 393 |
| 363 364 | 373 374 | 383 384 | 393 394 |
| 364 365 | 374 375 | 384 385 | 394 395 |
| 365 366 | 375 376 | 385 386 | 395 396 |
| 366 367 | 376 377 | 386 387 | 396 397 |
| 367 368 | 377 378 | 387 388 | 397 398 |
| 368 369 | 378 379 | 388 389 | 398 399 |
| 369 370 | 379 380 | 389 390 | 399. |

12. The method of claim 11, wherein:

said wireless signal is an orthogonal frequency division multiplexing (OFDM) signal.

13. The method of claim 11, wherein:

said first portion of said parity check matrix is a portion that includes columns of said parity check matrix having a column weight of 4.

14. The method of claim 11, wherein:

said parity check matrix defines a (2000, 1600) LDPC code.

15. The method of claim 11, wherein:

generating and transmitting a wireless signal includes mapping said code word into modulation symbols and processing said modulation symbols using an inverse discrete Fourier transform.

16. A system comprising:

a forward error correction (FEC) coder to encode digital data using a low density parity check (LDPC) code, said FEC coder including:

a computer readable storage medium storing at least a first portion of a parity check matrix, wherein said first portion of said parity check matrix includes at least half of said parity check matrix;

a matrix multiplication unit to multiply input data by a transpose of said first portion of said parity check matrix to generate modified data;

a differential encoder to differentially encode said modified data to generate coded data; and a concatenation unit to concatenate the input data and the coded data to form a code word;

a wireless transmitter to transmit a wireless signal that includes said code word; and at least one dipole antenna coupled to said wireless transmitter to facilitate transmission of said wireless signal;

wherein said parity check matrix, in list file form, is substantially as follows:

```
2000 400
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 1
```

-continued

| | | | |
|---|---|---|---|
| 143 225 316 323 | 62 109 190 201 | 239 254 331 342 | 47 52 339 346 |
| 92 140 191 358 | 111 162 190 227 | 107 149 250 295 | 50 288 342 388 |
| 69 315 329 343 | 189 272 288 302 | 73 221 295 362 | 26 87 247 283 |
| 6 121 205 284 | 14 49 147 334 | 75 97 242 279 | 67 127 132 136 |
| 58 66 254 337 | 33 53 213 238 | 32 197 244 313 | 146 264 321 323 |
| 1 47 178 395 | 53 219 368 379 | 245 248 276 296 | 210 275 319 346 |
| 129 151 212 228 | 126 149 188 339 | 59 230 322 347 | 57 160 252 261 |
| 66 146 243 265 | 108 118 182 393 | 17 246 291 364 | 26 54 170 197 |
| 22 140 157 180 | 0 37 160 295 | 125 157 227 390 | 120 218 229 341 |
| 120 208 313 321 | 158 200 335 356 | 122 205 279 348 | 44 53 124 323 |
| 290 350 370 382 | 11 20 229 397 | 61 298 340 380 | 0 113 315 358 |
| 56 94 184 215 | 77 86 212 250 | 12 31 256 328 | 110 144 246 298 |
| 84 119 337 344 | 79 193 262 336 | 119 163 178 217 | 89 91 99 346 |
| 2 156 244 398 | 43 104 125 376 | 61 129 185 200 | 21 32 216 393 |
| 9 106 200 336 | 55 114 134 293 | 34 38 104 295 | 37 170 209 342 |
| 22 37 150 270 | 240 283 299 333 | 119 289 349 377 | 49 58 357 399 |
| 3 110 326 367 | 0 24 57 100 | 50 314 322 367 | 18 23 31 373 |
| 235 276 290 335 | 46 84 322 341 | 28 48 248 382 | 159 172 195 366 |
| 82 187 193 297 | 5 43 45 221 | 32 41 128 201 | 213 335 337 378 |
| 43 183 297 379 | 29 217 274 301 | 91 115 220 368 | 1 103 159 277 |
| 194 239 243 293 | 81 93 116 278 | 45 151 196 265 | 96 159 209 387 |
| 90 144 228 350 | 93 174 213 231 | 152 190 198 317 | 102 165 234 378 |
| 170 206 321 395 | 64 201 251 385 | 157 212 242 275 | 173 245 356 376 |
| 72 138 254 300 | 76 134 278 370 | 2 40 249 283 | 57 230 240 314 |
| 25 196 201 279 | 71 93 182 398 | 195 280 299 345 | 1 89 153 166 |
| 56 59 362 379 | 38 174 250 377 | 142 151 220 395 | 25 32 264 342 |
| 28 121 170 277 | 19 116 357 372 | 70 121 252 382 | 265 276 321 324 |
| 61 273 351 386 | 81 91 164 307 | 52 244 279 297 | 57 211 274 360 |
| 71 76 232 328 | 180 186 241 251 | 22 131 256 349 | 12 291 311 348 |
| 34 220 258 282 | 81 175 206 261 | 122 188 228 305 | 115 218 225 285 |
| 52 58 109 379 | 31 94 275 317 | 6 77 291 397 | 98 196 217 328 |
| 116 248 337 369 | 10 123 141 279 | 70 76 259 276 | 177 267 306 350 |
| 87 146 183 278 | 44 64 157 270 | 72 270 335 348 | 82 299 320 395 |
| 42 96 318 361 | 160 243 290 373 | 93 147 255 312 | 139 251 364 381 |
| 32 176 312 361 | 39 217 262 324 | 92 112 259 388 | 42 118 178 194 |
| 69 258 310 389 | 19 185 312 389 | 9 18 61 308 | 73 100 198 286 |
| 1 84 182 300 | 211 271 277 291 | 3 137 139 257 | 68 249 292 376 |
| 45 124 161 396 | 19 148 155 324 | 165 217 345 354 | 13 216 221 256 |
| 15 76 99 101 | 24 94 124 314 | 78 134 263 280 | 127 138 177 398 |
| 62 248 354 375 | 3 85 193 349 | 186 213 227 303 | 20 69 239 264 |
| 78 258 262 311 | 68 175 202 253 | 68 194 294 346 | 3 126 132 163 |
| 181 265 364 368 | 139 160 337 377 | 35 225 284 312 | 66 88 169 271 |
| 60 168 227 254 | 21 224 249 398 | 117 188 340 346 | 88 197 201 387 |
| 162 231 270 377 | 113 122 206 327 | 258 299 306 331 | 1 51 135 149 |
| 14 102 139 158 | 7 10 156 245 | 83 194 207 349 | 257 294 331 356 |
| 28 79 155 318 | 140 182 192 235 | 43 141 175 329 | 204 260 288 294 |
| 28 40 63 236 | 161 291 324 387 | 0 68 170 262 | 45 144 185 383 |
| 163 181 258 279 | 31 232 237 350 | 25 36 153 309 | 173 310 329 362 |
| 158 176 273 334 | 30 184 235 387 | 57 62 273 323 | 15 165 305 348 |
| 80 236 256 380 | 136 226 269 327 | 7 19 75 264 | 27 66 85 182 |
| 74 156 214 358 | 4 93 136 167 | 21 254 259 366 | 47 235 238 246 |
| 176 229 251 283 | 47 148 309 348 | 8 97 156 172 | 230 276 293 367 |
| 19 104 114 162 | 73 225 252 290 | 9 185 313 330 | 118 150 267 324 |
| 141 284 291 358 | 44 213 361 386 | 55 219 253 393 | 68 82 309 398 |
| 77 123 157 361 | 79 319 361 381 | 86 120 185 233 | 72 154 226 231 |
| 141 154 215 338 | 74 251 339 356 | 41 136 191 242 | 76 135 151 384 |
| 55 294 296 298 | 100 105 246 293 | 194 265 303 393 | 39 48 80 309 |
| 80 109 272 364 | 68 101 191 285 | 256 285 310 399 | 0 178 305 353 |
| 43 206 287 363 | 32 103 323 355 | 103 247 275 378 | 88 136 196 321 |
| 37 95 222 300 | 132 141 221 322 | 11 132 246 314 | 102 133 217 226 |
| 23 343 358 369 | 213 257 348 396 | 46 93 103 309 | 69 88 116 295 |
| 195 252 303 349 | 91 147 294 325 | 20 33 64 196 | 108 217 273 322 |
| 9 81 102 317 | 14 27 48 222 | 111 134 194 204 | 26 287 306 343 |
| 20 219 285 316 | 11 81 110 360 | 76 116 140 238 | 8 18 136 152 |
| 219 281 304 354 | 10 50 357 393 | 189 298 326 381 | 110 240 245 334 |
| 33 121 319 351 | 35 89 248 252 | 235 317 320 333 | 225 255 278 310 |
| 21 157 191 260 | 6 55 319 345 | 127 301 348 376 | 63 168 170 303 |
| 0 88 303 307 | 107 116 223 271 | 51 286 309 377 | 8 17 255 314 |
| 13 23 62 268 | 168 240 261 384 | 17 70 139 187 | 28 92 98 200 |
| 13 173 279 320 | 54 204 295 351 | 54 180 184 344 | 112 201 244 392 |
| 117 189 253 392 | 3 51 146 299 | 85 311 318 327 | 134 216 344 383 |
| 32 40 57 350 | 74 184 307 361 | 263 312 364 369 | 21 97 115 396 |
| 57 123 148 368 | 9 202 272 387 | 97 149 198 336 | 28 69 120 380 |
| 18 96 164 326 | 106 198 281 329 | 31 141 151 285 | 34 259 267 314 |
| 84 103 107 359 | 36 105 225 236 | 72 163 187 311 | 55 72 87 223 |
| 92 338 350 355 | 90 139 183 299 | 24 54 249 297 | 43 180 185 252 |
| 16 70 242 338 | 152 160 292 354 | 64 143 322 360 | 23 113 133 277 |
| 20 74 141 179 | 11 115 227 236 | 53 73 122 256 | 258 285 347 350 |
| 159 246 248 365 | 152 202 211 373 | 100 138 214 226 | 246 253 318 399 |

-continued

| | | | |
|---|---|---|---|
| 207 292 387 399 | 4 173 346 374 | 265 348 373 378 | 12 78 90 369 |
| 38 148 303 347 | 132 197 238 279 | 42 62 113 174 | 17 93 96 102 |
| 68 113 296 389 | 16 94 150 222 | 29 313 349 358 | 109 162 318 360 |
| 12 257 286 325 | 241 344 375 386 | 154 179 217 268 | 22 83 151 290 |
| 50 287 294 327 | 31 121 161 231 | 164 289 380 392 | 141 191 240 266 |
| 149 259 356 367 | 9 33 197 350 | 109 165 236 312 | 25 90 138 390 |
| 3 12 178 309 | 87 197 233 312 | 92 141 193 238 | 81 113 265 382 |
| 63 92 166 368 | 100 111 129 368 | 190 243 267 275 | 88 142 210 283 |
| 97 190 199 363 | 184 278 289 346 | 95 143 203 393 | 10 40 43 140 |
| 13 86 92 308 | 76 177 227 356 | 130 213 264 308 | 2 195 268 328 |
| 117 240 257 374 | 143 189 255 338 | 20 48 130 353 | 101 132 135 250 |
| 298 332 350 365 | 38 75 137 166 | 58 100 125 172 | 117 191 213 352 |
| 60 122 240 313 | 62 92 124 366 | 79 181 242 313 | 132 233 270 303 |
| 157 215 274 397 | 73 83 105 136 | 174 254 304 321 | 16 251 266 370 |
| 11 41 164 274 | 69 134 200 366 | 70 129 283 385 | 41 45 60 99 |
| 67 76 92 104 | 179 324 366 386 | 18 79 296 345 | 182 197 276 331 |
| 19 192 305 344 | 72 82 188 192 | 14 25 34 52 | 40 257 262 322 |
| 23 35 125 224 | 100 120 189 375 | 31 88 212 226 | 148 208 332 352 |
| 152 163 352 385 | 244 252 318 329 | 26 53 123 165 | 127 159 253 290 |
| 40 161 165 329 | 3 105 116 203 | 101 108 248 328 | 273 289 325 341 |
| 113 215 245 378 | 280 282 288 365 | 49 115 190 395 | 95 145 231 297 |
| 80 168 262 382 | 38 196 330 369 | 23 119 139 282 | 70 110 225 313 |
| 81 136 165 239 | 20 31 113 381 | 27 206 209 324 | 50 112 166 302 |
| 2 42 248 323 | 56 173 205 390 | 203 221 332 356 | 68 97 128 218 |
| 111 127 157 330 | 2 30 165 366 | 181 190 288 379 | 90 264 269 280 |
| 79 125 239 341 | 41 75 169 302 | 38 73 249 368 | 22 132 258 368 |
| 147 172 187 397 | 210 271 330 334 | 45 49 264 394 | 65 124 129 325 |
| 230 245 277 352 | 60 109 199 348 | 89 112 218 316 | 95 105 111 385 |
| 49 202 350 381 | 27 89 214 388 | 144 186 297 343 | 109 233 250 302 |
| 34 56 167 242 | 77 79 83 289 | 152 177 233 237 | 8 33 80 318 |
| 36 58 61 83 | 119 236 323 383 | 74 171 223 334 | 51 253 281 288 |
| 107 110 133 251 | 1 44 271 372 | 4 16 44 89 | 209 237 346 391 |
| 100 245 295 330 | 25 42 104 215 | 103 165 177 358 | 12 198 221 269 |
| 16 71 175 397 | 144 153 357 362 | 53 217 342 383 | 9 141 229 306 |
| 106 206 229 236 | 133 153 273 383 | 58 88 126 370 | 0 114 219 300 |
| 177 308 371 387 | 152 174 269 355 | 4 214 243 383 | 242 289 318 335 |
| 89 122 207 362 | 107 193 210 320 | 5 96 155 354 | 41 90 163 215 |
| 3 166 190 305 | 194 298 317 331 | 7 61 214 237 | 65 80 99 167 |
| 155 171 289 336 | 22 112 139 222 | 90 241 261 367 | 269 296 303 356 |
| 34 37 293 301 | 147 152 221 365 | 39 161 202 206 | 45 106 232 346 |
| 86 195 293 391 | 70 105 229 250 | 32 42 253 275 | 81 90 223 363 |
| 140 193 245 321 | 268 334 344 368 | 95 199 219 225 | 71 85 128 380 |
| 88 150 183 380 | 78 82 283 393 | 116 328 345 395 | 159 309 314 334 |
| 230 253 315 373 | 7 299 327 334 | 128 159 161 207 | 17 117 315 379 |
| 53 184 258 263 | 47 82 117 126 | 111 306 363 373 | 87 120 206 267 |
| 17 79 261 286 | 86 100 337 379 | 174 256 368 381 | 67 116 188 349 |
| 94 293 302 397 | 299 347 372 375 | 18 104 115 317 | 63 232 338 365 |
| 170 218 358 376 | 150 156 299 302 | 102 115 140 394 | 178 272 327 392 |
| 61 246 287 292 | 145 252 294 377 | 91 96 128 327 | 19 35 204 386 |
| 61 162 245 303 | 155 218 250 392 | 97 99 300 385 | 194 235 289 345 |
| 25 286 333 355 | 131 172 250 278 | 40 150 229 316 | 29 50 154 315 |
| 159 241 263 354 | 17 64 107 195 | 124 315 322 359 | 22 47 353 387 |
| 134 186 305 327 | 26 55 142 181 | 21 221 286 301 | 0 137 143 167 |
| 33 38 283 301 | 106 181 327 342 | 27 88 147 216 | 21 162 195 339 |
| 17 44 159 398 | 101 103 340 368 | 10 124 128 309 | 24 225 233 338 |
| 108 167 174 374 | 44 196 198 280 | 57 131 209 296 | 177 225 232 281 |
| 90 105 172 257 | 39 148 192 385 | 230 237 264 371 | 77 149 241 310 |
| 93 165 180 353 | 37 130 182 207 | 28 118 231 283 | 319 325 363 374 |
| 137 289 296 386 | 57 242 262 316 | 5 114 230 309 | 77 251 308 379 |
| 241 273 276 359 | 20 171 259 396 | 122 189 204 251 | 183 203 290 330 |
| 44 94 211 286 | 257 288 338 361 | 74 151 203 218 | 158 246 275 352 |
| 166 184 204 226 | 12 290 362 367 | 69 270 288 359 | 78 99 210 238 |
| 98 281 357 389 | 153 236 304 330 | 22 49 291 383 | 222 271 380 393 |
| 41 107 187 298 | 12 144 261 329 | 80 90 174 249 | 79 107 201 351 |
| 19 47 379 399 | 33 92 106 173 | 182 310 314 318 | 66 90 275 287 |
| 1 16 272 296 | 68 89 159 308 | 115 254 336 399 | 65 219 247 398 |
| 107 203 283 322 | 9 23 41 301 | 42 63 135 343 | 16 203 207 237 |
| 77 245 266 390 | 109 160 278 387 | 46 232 385 391 | 101 216 333 357 |
| 29 166 345 364 | 138 235 241 356 | 24 27 171 183 | 2 39 326 373 |
| 61 229 356 361 | 225 256 321 332 | 237 293 322 352 | 51 151 305 341 |
| 6 25 30 130 | 257 284 326 382 | 19 107 153 308 | 145 163 197 228 |
| 2 91 146 227 | 57 138 311 343 | 10 57 98 215 | 66 97 212 320 |
| 46 141 273 298 | 295 318 322 377 | 181 211 228 339 | 133 176 282 305 |
| 157 331 374 385 | 78 343 373 377 | 62 89 163 295 | 22 187 205 372 |
| 172 223 237 258 | 79 89 131 254 | 43 77 113 143 | 102 160 180 258 |
| 15 93 128 250 | 61 74 304 382 | 125 149 196 218 | 164 197 311 398 |
| 94 261 312 341 | 30 70 168 253 | 83 147 183 279 | 75 119 186 254 |
| 167 186 202 372 | 64 156 306 332 | 62 145 180 397 | 6 15 65 396 |
| 8 29 355 393 | 162 197 255 275 | 84 280 331 360 | 30 108 341 399 |

-continued

| | | | |
|---|---|---|---|
| 36 126 155 373 | 33 71 91 112 | 114 190 281 359 | 217 276 326 347 |
| 145 195 227 333 | 13 132 247 391 | 69 129 168 187 | 160 237 274 285 |
| 45 206 344 369 | 22 208 226 392 | 119 144 180 249 | 173 248 262 348 |
| 8 166 301 397 | 56 60 158 164 | 7 47 218 308 | 52 65 218 351 |
| 11 47 141 184 | 20 105 120 199 | 217 251 269 390 | 135 140 253 366 |
| 7 112 256 377 | 133 232 236 341 | 189 200 275 372 | 5 81 176 260 |
| 108 300 310 312 | 90 107 293 370 | 157 218 296 363 | 58 215 326 364 |
| 208 218 364 378 | 17 32 254 263 | 52 110 151 319 | 76 87 102 315 |
| 53 114 278 291 | 8 173 238 266 | 30 131 153 174 | 98 131 259 332 |
| 131 138 201 365 | 30 167 169 391 | 28 32 182 198 | 15 30 35 55 |
| 225 279 371 378 | 43 213 328 362 | 56 263 316 328 | 0 122 269 346 |
| 122 275 376 395 | 73 231 244 282 | 87 168 275 343 | 38 162 311 373 |
| 169 217 239 357 | 71 221 245 253 | 24 31 131 148 | 143 313 329 340 |
| 18 65 128 288 | 215 225 258 335 | 166 203 208 231 | 80 260 316 348 |
| 6 62 86 198 | 46 87 263 384 | 126 170 224 369 | 44 158 220 292 |
| 37 80 119 211 | 81 96 282 338 | 20 78 193 213 | 117 241 295 363 |
| 0 46 139 339 | 192 222 306 353 | 123 180 253 323 | 187 321 355 378 |
| 0 30 216 306 | 8 115 292 305 | 208 229 271 386 | 167 226 281 351 |
| 82 152 277 367 | 36 170 186 260 | 1 52 116 383 | 0 200 309 384 |
| 23 178 350 366 | 10 85 212 300 | 13 55 71 106 | 36 171 193 328 |
| 121 212 243 384 | 5 129 198 365 | 7 306 347 364 | 107 178 228 240 |
| 80 146 156 375 | 2 51 145 208 | 40 147 260 330 | 48 100 118 346 |
| 75 90 290 312 | 126 271 310 351 | 125 325 379 387 | 91 104 355 358 |
| 20 55 131 215 | 144 197 277 360 | 90 111 126 301 | 176 342 351 390 |
| 99 127 231 344 | 28 35 115 289 | 113 177 226 273 | 6 45 123 126 |
| 156 176 301 313 | 54 108 270 279 | 96 172 181 218 | 69 241 268 274 |
| 41 146 247 290 | 23 82 144 396 | 17 124 154 373 | 158 324 371 399 |
| 49 52 61 76 | 78 93 95 275 | 87 285 306 376 | 62 232 264 373 |
| 24 74 310 326 | 145 169 211 278 | 83 163 173 299 | 103 106 146 344 |
| 56 196 212 332 | 29 163 300 320 | 65 87 245 333 | 134 268 295 398 |
| 76 205 335 385 | 33 147 219 391 | 161 267 284 293 | 120 220 250 354 |
| 75 101 209 349 | 199 214 265 280 | 1 29 54 379 | 115 208 355 398 |
| 28 172 242 294 | 62 133 156 219 | 141 170 183 232 | 74 190 343 352 |
| 18 71 267 297 | 31 34 72 115 | 5 40 167 238 | 258 325 332 371 |
| 84 115 233 384 | 246 260 267 286 | 15 44 95 239 | 14 256 347 353 |
| 63 139 216 325 | 7 266 309 337 | 13 75 152 188 | 24 33 122 234 |
| 23 64 310 348 | 24 69 142 394 | 216 224 305 331 | 98 272 300 342 |
| 63 130 188 352 | 98 138 228 351 | 29 93 197 381 | 210 221 268 337 |
| 23 45 160 165 | 72 181 336 355 | 21 222 282 284 | 8 94 154 347 |
| 42 114 382 399 | 12 47 160 172 | 175 193 361 372 | 195 285 321 327 |
| 25 207 339 365 | 84 178 230 343 | 54 69 298 308 | 12 51 54 354 |
| 16 334 374 398 | 80 238 321 376 | 93 169 209 328 | 16 41 149 389 |
| 86 251 274 277 | 170 213 331 367 | 39 59 334 391 | 55 66 206 297 |
| 157 166 297 316 | 12 136 274 326 | 108 254 340 376 | 129 202 214 285 |
| 171 200 230 265 | 13 51 96 147 | 141 246 264 388 | 73 96 104 310 |
| 34 107 325 364 | 23 264 334 346 | 96 267 362 392 | 55 200 270 318 |
| 71 220 227 330 | 29 122 183 356 | 131 234 291 330 | 58 120 150 217 |
| 177 263 277 344 | 78 287 330 349 | 4 168 220 235 | 58 279 339 397 |
| 75 138 262 293 | 42 69 131 198 | 130 195 216 367 | 60 180 247 308 |
| 189 300 366 377 | 36 43 189 216 | 108 148 290 302 | 48 127 213 356 |
| 147 175 296 320 | 44 142 195 344 | 85 214 362 395 | 62 128 291 329 |
| 26 35 127 323 | 50 59 117 185 | 67 94 166 256 | 60 169 292 350 |
| 77 144 286 296 | 11 189 212 220 | 85 227 250 321 | 44 169 240 362 |
| 10 47 192 259 | 123 135 226 372 | 91 121 295 324 | 146 187 293 319 |
| 122 196 210 329 | 83 86 149 386 | 3 16 308 340 | 198 219 343 380 |
| 63 162 235 268 | 26 95 121 163 | 143 157 307 395 | 148 188 256 304 |
| 25 45 218 310 | 30 54 178 315 | 36 77 116 340 | 171 189 266 341 |
| 67 336 354 393 | 136 301 341 365 | 3 98 101 125 | 94 108 244 288 |
| 16 278 347 381 | 21 59 265 299 | 39 151 364 377 | 16 42 200 250 |
| 14 39 209 395 | 111 154 282 297 | 194 227 231 267 | 2 64 193 399 |
| 21 55 85 304 | 6 74 290 349 | 59 200 206 389 | 129 172 276 379 |
| 128 135 194 325 | 121 142 174 236 | 21 106 287 389 | 26 176 234 319 |
| 116 159 258 341 | 108 129 152 261 | 33 268 340 387 | 118 135 205 312 |
| 125 132 210 219 | 152 164 205 377 | 140 150 395 398 | 115 176 290 359 |
| 60 67 150 203 | 144 281 332 335 | 88 352 360 367 | 9 143 188 374 |
| 18 60 167 328 | 92 244 315 326 | 55 91 145 168 | 96 186 247 353 |
| 55 112 179 381 | 66 128 170 221 | 126 130 181 323 | 30 72 320 388 |
| 288 317 324 389 | 21 109 174 397 | 34 120 227 316 | 17 137 186 193 |
| 43 320 334 382 | 5 154 201 239 | 237 337 355 394 | 34 229 265 284 |
| 5 29 145 281 | 80 183 261 293 | 34 186 219 313 | 129 207 282 287 |
| 25 124 232 345 | 18 143 335 392 | 280 330 340 375 | 68 118 275 305 |
| 11 119 339 359 | 13 139 155 230 | 76 230 354 378 | 153 172 249 307 |
| 5 36 231 316 | 145 156 300 327 | 5 178 293 297 | 106 179 212 378 |
| 15 138 354 389 | 118 153 171 366 | 142 223 234 381 | 22 48 105 347 |
| 25 82 136 180 | 15 152 331 364 | 48 239 260 399 | 98 137 346 379 |
| 20 103 167 266 | 161 171 307 317 | 58 270 336 360 | 41 98 165 232 |
| 112 292 359 371 | 49 56 127 185 | 24 123 271 347 | 54 63 99 123 |
| 184 201 240 328 | 104 168 283 305 | 12 76 137 280 | 81 213 315 394 |
| 77 160 307 339 | 199 202 343 399 | 107 226 302 367 | 38 66 87 191 |

-continued

| | | | |
|---|---|---|---|
| 74 147 280 389 | 15 164 192 273 | 175 186 208 366 | 71 121 294 396 |
| 127 149 358 387 | 62 199 222 228 | 65 183 369 376 | 109 200 345 375 |
| 33 70 217 266 | 26 177 205 314 | 70 96 163 333 | 19 103 260 383 |
| 11 111 210 240 | 14 92 385 389 | 11 175 273 282 | 5 303 328 375 |
| 261 271 290 396 | 111 211 366 390 | 14 212 392 398 | 131 237 298 384 |
| 190 225 298 369 | 27 71 110 327 | 91 105 300 382 | 103 183 281 286 |
| 16 140 227 352 | 99 257 359 389 | 4 79 232 370 | 5 224 263 358 |
| 118 183 262 383 | 124 295 372 397 | 21 75 158 347 | 197 199 247 382 |
| 17 218 260 350 | 12 43 117 356 | 331 341 343 386 | 18 228 332 344 |
| 50 56 278 351 | 65 117 136 354 | 0 103 163 270 | 16 26 57 68 |
| 15 36 150 280 | 39 67 191 212 | 7 95 171 326 | 2 158 259 384 |
| 18 107 151 176 | 80 166 176 358 | 16 24 49 133 | 128 181 371 398 |
| 22 188 244 337 | 99 208 353 361 | 58 242 363 390 | 98 179 247 319 |
| 72 186 302 350 | 32 46 104 222 | 8 236 254 290 | 41 71 138 326 |
| 65 145 221 239 | 4 25 72 203 | 50 83 140 370 | 175 244 301 317 |
| 52 117 331 393 | 2 124 130 262 | 233 258 340 364 | 81 145 226 371 |
| 7 37 265 285 | 28 113 210 232 | 63 289 292 313 | 125 202 226 309 |
| 56 283 338 382 | 66 77 158 268 | 231 245 336 342 | 115 169 276 298 |
| 78 217 337 351 | 61 98 202 330 | 35 38 246 299 | 192 268 296 391 |
| 6 247 249 370 | 47 67 181 247 | 104 246 249 281 | 31 167 220 223 |
| 1 161 241 255 | 51 204 209 307 | 161 248 285 325 | 39 241 358 382 |
| 101 166 183 220 | 125 198 289 301 | 13 21 192 220 | 67 112 159 236 |
| 99 198 326 335 | 136 214 216 263 | 82 89 200 209 | 71 180 208 266 |
| 105 234 340 384 | 97 270 314 338 | 8 264 313 368 | 59 143 248 394 |
| 60 233 242 397 | 78 127 215 226 | 11 26 242 286 | 99 128 223 388 |
| 207 215 223 293 | 27 242 348 357 | 37 248 303 388 | 6 192 221 351 |
| 233 279 351 380 | 94 181 191 363 | 64 187 324 392 | 129 238 257 378 |
| 83 106 188 311 | 7 91 93 348 | 209 216 230 243 | 29 192 252 392 |
| 97 185 361 392 | 60 193 267 333 | 73 241 250 260 | 6 110 177 269 |
| 14 26 72 304 | 185 237 272 381 | 181 187 235 239 | 29 79 205 241 |
| 51 162 194 387 | 15 52 166 225 | 63 193 300 329 | 233 246 325 331 |
| 94 245 273 287 | 27 100 126 275 | 291 332 354 396 | 11 211 321 384 |
| 144 282 337 386 | 56 272 294 303 | 9 40 191 384 | 112 195 277 296 |
| 33 79 327 385 | 10 68 72 210 | 51 148 207 270 | 29 302 310 334 |
| 30 110 179 321 | 184 261 382 386 | 49 114 243 360 | 38 156 251 280 |
| 86 133 234 284 | 202 204 315 342 | 60 87 303 370 | 130 209 249 266 |
| 54 58 72 289 | 66 102 195 207 | 138 190 248 283 | 43 161 250 32 2 |
| 22 145 269 373 | 97 243 272 301 | 78 97 139 144 | 7 168 182 185 |
| 81 172 211 381 | 92 128 156 304 | 177 180 244 272 | 15 45 189 286 |
| 59 246 252 255 | 68 313 385 390 | 44 123 243 287 | 191 205 301 305 |
| 34 113 207 286 | 13 32 49 271 | 122 211 304 388 | 155 235 282 299 |
| 69 100 222 231 | 4 80 123 277 | 70 117 278 332 | 40 114 194 372 |
| 14 150 387 396 | 89 135 243 375 | 31 85 343 394 | 249 263 323 372 |
| 17 73 228 248 | 88 372 381 388 | 47 133 244 312 | 36 214 252 380 |
| 29 193 232 259 | 66 108 222 274 | 20 144 299 368 | 176 201 258 373 |
| 40 148 359 374 | 28 59 164 167 | 25 84 335 395 | 102 208 340 379 |
| 38 281 316 327 | 201 204 313 324 | 102 199 213 283 | 85 161 240 262 |
| 70 87 100 395 | 73 311 388 397 | 64 164 169 224 | 5 17 199 339 |
| 26 231 295 369 | 109 186 243 261 | 50 152 224 276 | 150 230 306 341 |
| 214 234 269 288 | 116 125 276 398 | 42 184 390 398 | 46 123 204 318 |
| 77 154 320 365 | 58 185 287 293 | 1 73 349 396 | 71 130 143 271 |
| 27 76 86 155 | 40 203 279 314 | 238 317 354 385 | 208 268 365 396 |
| 65 139 175 240 | 46 50 86 255 | 46 70 296 379 | 257 263 336 395 |
| 33 130 223 286 | 23 48 109 120 | 156 247 278 334 | 218 267 334 360 |
| 215 271 317 344 | 236 297 325 333 | 130 235 319 390 | 53 74 255 302 |
| 8 47 113 153 | 123 155 320 384 | 0 108 120 213 | 104 175 302 311 |
| 194 233 361 377 | 36 67 169 274 | 11 93 146 235 | 228 338 360 369 |
| 88 202 284 394 | 54 102 191 239 | 96 255 374 376 | 8 35 112 394 |
| 29 118 285 380 | 8 109 198 391 | 85 146 204 366 | 39 130 336 365 |
| 96 154 312 383 | 143 176 238 370 | 146 254 365 391 | 13 170 198 378 |
| 19 250 318 359 | 39 41 105 208 | 114 148 151 373 | 56 156 162 181 |
| 32 282 289 334 | 126 197 342 357 | 60 121 145 343 | 47 95 104 272 |
| 9 291 333 362 | 43 61 106 391 | 39 142 169 232 | 24 45 85 295 |
| 121 128 193 322 | 861 13 161 390 | 54 76 318 358 | 118 141 244 255 |
| 159 276 311 392 | 35 316 329 376 | 196 341 352 391 | 17 164 229 252 |
| 15 42 105 267 | 37 161 224 306 | 61 63 333 350 | 27 132 134 179 |
| 4 23 202 388 | 14 53 98 269 | 42 130 307 331 | 173 216 220 247 |
| 23 61 260 307 | 179 207 236 269 | 25 190 224 282 | 246 306 375 384 |
| 42 124 355 380 | 10 163 205 369 | 57 238 375 393 | 75 160 187 263 |
| 124 259 374 386 | 31 92 162 396 | 5 158 186 355 | 171 236 329 389 |
| 136 140 207 317 | 85 268 314 345 | 83 110 385 399 | 58 178 196 380 |
| 9 278 280 325 | 1 31 249 319 | 48 154 166 308 | 171 203 256 370 |
| 4 19 59 360 | 35 56 281 333 | 2 75 288 340 | 5 134 277 330 |
| 21 79 94 356 | 137 199 223 376 | 86 223 248 264 | 110 153 320 336 |
| 26 158 345 353 | 52 320 338 362 | 67 135 158 350 | 24 93 369 383 |
| 95 172 261 374 | 65 224 307 390 | 80 133 345 351 | 35 100 244 361 |
| 27 119 364 373 | 146 310 346 384 | 51 195 265 335 | 327 345 369 396 |
| 35 245 335 374 | 101 138 193 307 | 63 117 159 196 | 27 37 185 277 |
| 139 162 184 228 | 234 314 342 394 | 13 16 37 143 | 257 259 321 362 |

-continued

| | | | |
|---|---|---|---|
| 53 84 214 363 | 19 109 127 214 | 70 95 306 391 | 23 253 280 370 |
| 17 153 242 386 | 40 80 132 196 | 178 187 249 316 | 13 44 99 224 |
| 30 137 274 313 | 183 213 229 249 | 37 52 162 307 | 57 69 114 224 |
| 68 169 256 369 | 105 228 232 238 | 173 211 237 344 | 70 154 185 352 |
| 30 119 206 394 | 64 278 290 357 | 41 114 210 233 | 34 269 338 367 |
| 224 325 365 380 | 20 116 173 251 | 102 202 287 354 | 77 170 234 326 |
| 50 178 188 274 | 97 261 308 393 | 136 185 223 303 | 138 171 192 269 |
| 2 56 169 225 | 20 100 146 165 | 86 265 287 355 | 173 192 284 371 |
| 43 75 167 296 | 67 84 164 376 | 11 66 131 255 | 68 155 164 353 |
| 28 131 274 304 | 155 260 300 352 | 124 147 319 392 | 42 2 201 212 |
| 107 263 309 385 | 116 118 147 233 | 46 67 152 380 | 206 234 259 270 |
| 101 238 310 395 | 61 174 328 371 | 64 82 111 312 | 35 168 176 389 |
| 35 58 238 345 | 30 60 155 368 | 78 123 264 317 | 103 162 351 370 |
| 49 59 102 212 | 69 202 336 385 | 85 95 292 307 | 128 190 241 384 |
| 155 192 270 287 | 20 92 313 331 | 72 150 266 314 | 7 48 66 82 |
| 4 81 95 119 | 44 79 316 392 | 101 199 253 359 | 173 315 372 382 |
| 135 138 200 301 | 104 177 254 335 | 18 41 259 368 | 41 49 117 320 |
| 11 32 294 357 | 4 199 234 308 | 122 125 185 324 | 45 82 120 133 |
| 10 73 84 173 | 76 139 192 332 | 58 294 318 365 | 6 42 195 295 |
| 25 48 97 145 | 1 252 322 331 | 84 210 216 235 | 171 201 344 377 |
| 7 223 280 366 | 89 217 352 378 | 54 142 147 355 | 94 179 205 344 |
| 83 137 247 276 | 83 156 175 211 | 73 91 174 353 | 32 144 219 315 |
| 31 56 117 325 | 75 132 341 364 | 15 48 292 323 | 226 257 333 386 |
| 211 281 307 358 | 78 106 204 272 | 4 62 67 126 | 24 102 182 375 |
| 49 118 211 372 | 65 159 214 284 | 109 129 191 203 | 49 86 123 175 |
| 70 179 221 371 | 141 161 342 353 | 143 154 168 205 | 62 151 266 298 |
| 38 260 266 388 | 336 375 381 397 | 24 75 127 304 | 272 323 339 367 |
| 142 222 253 335 | 143 260 291 302 | 34 142 182 363 | 99 160 273 330 |
| 83 88 180 363 | 84 298 339 375 | 10 198 303 308 | 194 274 324 368 |
| 153 371 374 393 | 219 234 357 374 | 146 258 273 361 | 51 127 158 191 |
| 142 161 286 312 | 0 118 292 328 | 113 132 220 359 | 2 98 164 393 |
| 34 111 221 243 | 19 119 226 387 | 39 179 252 274 | 90 108 149 315 |
| 40 66 91 391 | 115 167 294 319 | 6 176 199 318 | 8 122 129 299 |
| 55 120 165 209 | 53 222 233 236 | 33 55 95 124 | 8 48 64 210 |
| 4 28 46 292 | 18 52 63 182 | 134 228 283 329 | 56 106 207 240 |
| 149 222 244 357 | 79 102 148 311 | 75 175 339 371 | 48 87 212 340 |
| 190 339 362 364 | 140 270 351 369 | 78 89 202 322 | 38 231 288 394 |
| 10 67 187 338 | 91 255 289 389 | 85 197 310 390 | 137 353 378 393 |
| 2 132 168 263 | 163 285 330 338 | 59 112 305 323 | 119 150 272 355 |
| 9 63 294 305 | 237 251 312 359 | 154 163 287 305 | 64 92 190 291 |
| 26 60 148 224 | 39 186 288 301 | 83 195 206 264 | 4 51 121 215 |
| 59 157 188 224 | 29 188 211 367 | 45 209 255 311 | 119 171 229 253 |
| 139 220 320 349 | 269 298 391 397 | 54 182 261 302 | 65 357 363 370 |
| 83 172 197 280 | 35 50 66 219 | 5 121 256 311 | 6 189 316 347 |
| 27 131 360 396 | 22 27 149 215 | 14 176 272 383 | 74 135 142 311 |
| 77 136 150 309 | 13 28 84 206 | 283 297 340 396 | 85 153 177 222 |
| 3 121 179 230 | 59 108 337 349 | 7 36 307 320 | 120 154 210 237 |
| 10 104 152 326 | 73 171 273 345 | 114 241 271 315 | 0 98 291 388 |
| 64 134 178 182 | 68 140 200 363 | 96 179 249 302 | 32 259 287 333 |
| 214 300 353 386 | 38 111 233 358 | 7 9 170 394 | 184 314 389 397 |
| 110 254 268 346 | 157 289 328 372 | 46 284 308 388 | 101 189 296 383 |
| 272 304 337 347 | 160 188 284 327 | 104 158 332 362 | 126 160 235 240 |
| 37 165 235 262 | 137 304 349 374 | 109 153 189 370 | 111 120 212 288 |
| 1 36 234 297 | 140 168 204 341 | 14 110 338 381 | 10 174 209 291 |
| 69 281 347 371 | 132 223 298 336 | 101 142 257 376 | 112 114 186 239 |
| 59 264 271 348 | 71 114 184 200 | 93 129 359 394 | 164 179 104 346 |
| 175 255 277 357 | 60 135 323 399 | 133 137 142 314 | 90 127 252 284 |
| 51 97 374 399 | 9 38 179 245 | 187 215 269 294 | 53 173 282 333 |
| 108 223 317 360 | 114 157 229 366 | 116 121 300 363 | 82 87 98 354 |
| 82 125 216 228 | 229 297 323 342 | 57 251 267 386 | 77 106 138 345 |
| 134 154 172 317 | 24 36 89 106 | 14 126 335 379 | 74 329 360 366 |
| 49 65 74 157 | 101 134 140 381 | 31 133 250 268 | 167 322 332 395 |
| 3 112 266 356 | 50 148 194 257 | 9 183 241 342 | 52 88 276 294 |
| 81 204 254 262 | 1 222 340 378 | 37 164 279 324 | 47 199 299 391 |
| 3 113 263 332 | 67 155 220 365 | 118 130 187 270 | 3 219 275 297 |
| 100 151 205 240 | 15 156 210 262 | 135 169 182 319 | 3 30 375 378 |
| 95 125 180 303 | 53 125 134 231 | 6 149 204 220 | 110 134 158 282 |
| 234 292 306 352 | 192 337 357 360 | 63 150 214 259 | 151 188 359 388 |
| 149 227 349 355 | 170 203 216 266 | 19 65 348 388 | 191 199 304 333 |
| 111 142 267 321 | 2 71 74 362 | 15 46 151 383 | 42 191 274 383 |
| 27 203 228 361 | 40 97 101 356 | 22 160 227 230 | 51 99 384 394 |
| 52 277 309 390 | 54 117 145 201 | 124 166 279 317 | 146 343 367 376 |
| 33 57 284 302 | 34 81 147 326 | 45 130 237 361 | 153 247 284 375 |
| 36 133 204 243 | 64 203 304 319 | 16 17 | 46 47 |
| 110 224 265 277 | 12 174 194 208 | 17 18 | 47 48 |
| 86 129 319 371 | 46 52 271 377 | 18 19 | 48 49 |
| 103 127 201 336 | 62 149 169 353 | 19 20 | 49 50 |
| 39 50 247 256 | 133 205 239 387 | 20 21 | 50 51 |
| 119 165 230 370 | 174 206 285 292 | 21 22 | 51 52 |

-continued

| | | | |
|---|---|---|---|
| 21 82 248 311 | 14 43 99 137 | 22 23 | 52 53 |
| 84 137 239 315 | 87 111 371 377 | 23 24 | 53 54 |
| 1 155 239 268 | 73 137 177 261 | 24 25 | 54 55 |
| 265 278 329 342 | 10 105 184 352 | 25 26 | 55 56 |
| 18 118 234 242 | 126 286 347 390 | 26 27 | 56 57 |
| 135 189 337 353 | 72 91 148 196 | 27 28 | 57 58 |
| 18 28 123 159 | 12 162 292 363 | 28 29 | 58 59 |
| 26 44 88 267 | 6 112 273 399 | 29 30 | 59 60 |
| 12 50 103 251 | 0 1 | 30 31 | 60 61 |
| 144 242 244 372 | 1 2 | 31 32 | 61 62 |
| 53 181 221 229 | 2 3 | 32 33 | 62 63 |
| 46 89 180 281 | 3 4 | 33 34 | 63 64 |
| 3 53 285 382 | 4 5 | 34 35 | 64 65 |
| 175 184 205 209 | 5 6 | 35 36 | 65 66 |
| 94 208 276 349 | 6 7 | 36 37 | 66 67 |
| 14 37 131 266 | 7 8 | 37 38 | 67 68 |
| 135 227 367 392 | 8 9 | 38 39 | 68 69 |
| 13 59 103 207 | 9 10 | 39 40 | 69 70 |
| 48 78 84 243 | 10 11 | 40 41 | 70 71 |
| 94 252 262 306 | 11 12 | 41 42 | 71 72 |
| 168 316 324 380 | 12 13 | 42 43 | 72 73 |
| 196 255 260 394 | 13 14 | 43 44 | 73 74 |
| 11 105 178 243 | 14 15 | 44 45 | 74 75 |
| 19 122 177 339 | 15 16 | 45 46 | 75 76 |
| 76 77 | 106 107 | 136 137 | 166 167 |
| 77 78 | 107 108 | 137 138 | 167 168 |
| 78 79 | 108 109 | 138 139 | 168 169 |
| 79 80 | 109 110 | 139 140 | 169 170 |
| 80 81 | 110 111 | 140 141 | 170 171 |
| 81 82 | 111 112 | 141 142 | 171 172 |
| 82 83 | 112 113 | 142 143 | 172 173 |
| 83 84 | 113 114 | 143 144 | 173 174 |
| 84 85 | 114 115 | 144 145 | 174 175 |
| 85 86 | 115 116 | 145 146 | 175 176 |
| 86 87 | 116 117 | 146 147 | 176 177 |
| 87 88 | 117 118 | 147 148 | 177 178 |
| 88 89 | 118 119 | 148 149 | 178 179 |
| 89 90 | 119 120 | 149 150 | 179 180 |
| 90 91 | 120 121 | 150 151 | 180 181 |
| 91 92 | 121 122 | 151 152 | 181 182 |
| 92 93 | 122 123 | 152 153 | 182 183 |
| 93 94 | 123 124 | 153 154 | 183 184 |
| 94 95 | 124 125 | 154 155 | 184 185 |
| 95 96 | 125 126 | 155 156 | 185 186 |
| 96 97 | 126 127 | 156 157 | 186 187 |
| 97 98 | 127 128 | 157 158 | 187 188 |
| 98 99 | 128 129 | 158 159 | 188 189 |
| 99 100 | 129 130 | 159 160 | 189 190 |
| 100 101 | 130 131 | 160 161 | 190 191 |
| 101 102 | 131 132 | 161 162 | 191 192 |
| 102 103 | 132 133 | 162 163 | 192 193 |
| 103 104 | 133 134 | 163 164 | 193 194 |
| 104 105 | 134 135 | 164 165 | 194 195 |
| 105 106 | 135 136 | 165 166 | 195 196 |
| 196 197 | 226 227 | 256 257 | 286 287 |
| 197 198 | 227 228 | 257 258 | 287 288 |
| 198 199 | 228 229 | 258 259 | 288 289 |
| 199 200 | 229 230 | 259 260 | 289 290 |
| 200 201 | 230 231 | 260 261 | 290 291 |
| 201 202 | 231 232 | 261 262 | 291 292 |
| 202 203 | 232 233 | 262 263 | 292 293 |
| 203 204 | 233 234 | 263 264 | 293 294 |
| 204 205 | 234 235 | 264 265 | 294 295 |
| 205 206 | 235 236 | 265 266 | 295 296 |
| 206 207 | 236 237 | 266 267 | 296 297 |
| 207 208 | 237 238 | 267 268 | 297 298 |
| 208 209 | 238 239 | 268 269 | 298 299 |
| 209 210 | 239 240 | 269 270 | 299 300 |
| 210 211 | 240 241 | 270 271 | 300 301 |
| 211 212 | 241 242 | 271 272 | 301 302 |
| 212 213 | 242 243 | 272 273 | 302 303 |
| 213 214 | 243 244 | 273 274 | 303 304 |
| 214 215 | 244 245 | 274 275 | 304 305 |
| 215 216 | 245 246 | 275 276 | 305 306 |
| 216 217 | 246 247 | 276 277 | 306 307 |
| 217 218 | 247 248 | 277 278 | 307 308 |
| 218 219 | 248 249 | 278 279 | 308 309 |
| 219 220 | 249 250 | 279 280 | 309 310 |
| 220 221 | 250 251 | 280 281 | 310 311 |

-continued

| | | | |
|---|---|---|---|
| 221 222 | 251 252 | 281 282 | 311 312 |
| 222 223 | 252 253 | 282 283 | 312 313 |
| 223 224 | 253 254 | 283 284 | 313 314 |
| 224 225 | 254 255 | 284 285 | 314 315 |
| 225 226 | 255 256 | 285 286 | 315 316 |
| 316 317 | 337 338 | 358 359 | 379 380 |
| 317 318 | 338 339 | 359 360 | 380 381 |
| 318 319 | 339 340 | 360 361 | 381 382 |
| 319 320 | 340 341 | 361 362 | 382 383 |
| 320 321 | 341 342 | 362 363 | 383 384 |
| 321 322 | 342 343 | 363 364 | 384 385 |
| 322 323 | 343 344 | 364 365 | 385 386 |
| 323 324 | 344 345 | 365 366 | 386 387 |
| 324 325 | 345 346 | 366 367 | 387 388 |
| 325 326 | 346 347 | 367 368 | 388 389 |
| 326 327 | 347 348 | 368 369 | 389 390 |
| 327 328 | 348 349 | 369 370 | 390 391 |
| 328 329 | 349 350 | 370 371 | 391 392 |
| 329 330 | 350 351 | 371 372 | 392 393 |
| 330 331 | 351 352 | 372 373 | 393 394 |
| 331 332 | 352 353 | 373 374 | 394 395 |
| 332 333 | 353 354 | 374 375 | 395 396 |
| 333 334 | 354 355 | 375 376 | 396 397 |
| 334 335 | 355 356 | 376 377 | 397 398 |
| 335 336 | 356 357 | 377 378 | 398 399 |
| 336 337 | 357 358 | 378 379 | 399. |

17. The system of claim 16, wherein:

said wireless signal is an orthogonal frequency division multiplexing (OFDM) signal.

18. The system of claim 16, wherein:

said first portion of said parity check matrix is a portion that includes columns of said parity check matrix having a column weight of 4.

19. An article comprising a computer readable storage medium having instructions stored thereon that, when executed by a computing platform, operate to:

matrix multiply input data by a transpose of a first portion of a parity check matrix, wherein said first portion of said parity check matrix includes at least half of said parity check matrix;

process a result of said matrix multiplication using differential encoding to generate coded data;

concatenate said input data and said coded data to form a code word; and generate and transmit a wireless signal that includes said code word;

wherein said parity check matrix, in list file form, is substantially as follows:

```
2000 400
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4 4
```

-continued 4 4 4 4 4 4 4 4 4 4 4 4 4 4 4 4 4 4 4 4 4 4 4 4 4 4 4 4 4 4 4 4 4 4 4 4 4 4 4 4 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2 2
2 2 2 2 2 2 2 2 2 2 2 2 2 2 2 2 2 2 2 2 2 2 2 1

| | | | |
|---|---|---|---|
| 143 225 316 323 | 66 146 243 265 | 9 106 200 336 | 90 144 228 350 |
| 92 140 191 358 | 22 140 157 180 | 22 37 150 270 | 170 206 321 395 |
| 69 315 329 343 | 120 208 313 321 | 3 110 326 367 | 72 138 254 300 |
| 6 121 205 284 | 290 350 370 382 | 235 276 290 335 | 25 196 201 279 |
| 58 66 254 337 | 56 94 184 215 | 82 187 193 297 | 56 59 362 379 |
| 1 47 178 395 | 84 119 337 344 | 43 183 297 379 | 28 121 170 277 |
| 129 151 212 228 | 2 156 244 398 | 194 239 243 293 | 61 273 351 386 |
| 71 76 232 328 | 239 254 331 342 | 50 288 342 388 | 116 248 337 369 |
| 62 109 190 201 | 107 149 250 295 | 26 87 247 283 | 87 146 183 278 |
| 111 162 190 227 | 73 221 295 362 | 67 127 132 136 | 42 96 318 361 |
| 189 272 288 302 | 75 97 242 279 | 146 264 321 323 | 32 176 312 361 |
| 14 49 147 334 | 32 197 244 313 | 210 275 319 346 | 69 258 310 389 |
| 33 53 213 238 | 245 248 276 296 | 57 160 252 261 | 1 84 182 300 |
| 53 219 368 379 | 59 230 322 347 | 26 54 170 197 | 45 124 161 396 |
| 126 149 188 339 | 17 246 291 364 | 120 218 229 341 | 15 76 99 101 |
| 108 118 182 393 | 125 157 227 390 | 44 53 124 323 | 62 248 354 375 |
| 0 37 160 295 | 122 205 279 348 | 0 113 315 358 | 78 258 262 311 |
| 158 200 335 356 | 61 298 340 380 | 110 144 246 298 | 181 265 364 368 |
| 11 20 229 397 | 12 31 256 328 | 89 91 99 346 | 60 168 227 254 |
| 77 86 212 250 | 119 163 178 217 | 21 32 216 393 | 162 231 270 377 |
| 79 193 262 336 | 61 129 185 200 | 37 170 209 342 | 14 102 139 158 |
| 43 104 125 376 | 34 38 104 295 | 49 58 357 399 | 28 79 155 318 |
| 55 114 134 293 | 119 289 349 377 | 18 23 31 373 | 28 40 63 236 |
| 240 283 299 333 | 50 314 322 367 | 159 172 195 366 | 163 181 258 279 |
| 0 24 57 100 | 28 48 248 382 | 213 335 337 378 | 158 176 273 334 |
| 46 84 322 341 | 32 41 128 201 | 1 103 159 277 | 80 236 256 380 |
| 5 43 45 221 | 91 115 220 368 | 96 159 209 387 | 74 156 214 358 |
| 29 217 274 301 | 45 151 196 265 | 102 165 234 378 | 176 229 251 283 |
| 81 93 116 278 | 152 190 198 317 | 173 245 356 376 | 19 104 114 162 |
| 93 174 213 231 | 157 212 242 275 | 57 230 240 314 | 141 284 291 358 |
| 64 201 251 385 | 2 40 249 283 | 1 89 153 166 | 77 123 157 361 |
| 76 134 278 370 | 195 280 299 345 | 25 32 264 342 | 141 154 215 338 |
| 71 93 182 398 | 142 151 220 395 | 265 276 321 324 | 55 294 296 298 |
| 38 174 250 377 | 70 121 252 382 | 57 211 274 360 | 80 109 272 364 |
| 19 116 357 372 | 52 244 279 297 | 12 291 311 348 | 43 206 287 363 |
| 81 91 164 307 | 22 131 256 349 | 34 220 258 282 | 81 175 206 261 |
| 180 186 241 251 | 47 52 339 346 | 52 58 109 379 | 31 94 275 317 |
| 10 123 141 279 | 70 76 259 276 | 177 267 306 350 | 195 252 303 349 |
| 44 64 157 270 | 72 270 335 348 | 82 299 320 395 | 9 81 102 317 |
| 160 243 290 373 | 93 147 255 312 | 139 251 364 381 | 20 219 285 316 |
| 39 217 262 324 | 92 112 259 388 | 42 118 178 194 | 219 281 304 354 |
| 19 185 312 389 | 9 18 61 308 | 73 100 198 286 | 33 121 319 351 |
| 211 271 277 291 | 3 137 139 257 | 68 249 292 376 | 21 157 191 260 |
| 19 148 155 324 | 165 217 345 354 | 13 216 221 256 | 0 88 303 307 |
| 24 94 124 314 | 78 134 263 280 | 127 138 177 398 | 13 23 62 268 |
| 3 85 193 349 | 186 213 227 303 | 20 69 239 264 | 13 173 279 320 |
| 68 175 202 253 | 68 194 294 346 | 3 126 132 163 | 117 189 253 392 |
| 139 160 337 377 | 35 225 284 312 | 66 88 169 271 | 32 40 57 350 |
| 21 224 249 398 | 117 188 340 346 | 88 197 201 387 | 57 123 148 368 |
| 113 122 206 327 | 258 299 306 331 | 1 51 135 149 | 18 96 164 326 |
| 7 10 156 245 | 83 194 207 349 | 257 294 331 356 | 84 103 107 359 |
| 140 182 192 235 | 43 141 175 329 | 204 260 288 294 | 92 338 350 355 |
| 161 291 324 387 | 0 68 170 262 | 45 144 185 383 | 16 70 242 338 |
| 31 232 237 350 | 25 36 153 309 | 173 310 329 362 | 20 74 141 179 |
| 30 184 235 387 | 57 62 273 323 | 15 165 305 348 | 159 246 248 365 |
| 136 226 269 327 | 7 19 75 264 | 27 66 85 182 | 207 292 387 399 |
| 4 93 136 167 | 21 254 259 366 | 47 235 238 246 | 38 148 303 347 |
| 47 148 309 348 | 8 97 156 172 | 230 276 293 367 | 68 113 296 389 |
| 73 225 252 290 | 9 185 313 330 | 118 150 267 324 | 12 257 286 325 |
| 44 213 361 386 | 55 219 253 393 | 68 82 309 398 | 50 287 294 327 |
| 79 319 361 381 | 86 120 185 233 | 72 154 226 231 | 149 259 356 367 |
| 74 251 339 356 | 41 136 191 242 | 76 135 151 384 | 3 12 178 309 |
| 100 105 246 293 | 194 265 303 393 | 39 48 80 309 | 63 92 166 368 |
| 68 101 191 285 | 256 285 310 399 | 0 178 305 353 | 97 190 199 363 |
| 32 103 323 355 | 103 247 275 378 | 88 136 196 321 | 13 86 92 308 |
| 122 188 228 305 | 115 218 225 285 | 37 95 222 300 | 132 141 221 322 |
| 6 77 291 397 | 98 196 217 328 | 23 343 358 369 | 213 257 348 396 |
| 91 147 294 325 | 20 33 64 196 | 108 217 273 322 | 60 122 240 313 |
| 14 27 48 222 | 111 134 194 204 | 26 287 306 343 | 157 215 274 397 |
| 11 81 110 360 | 76 116 140 238 | 8 18 136 152 | 11 41 164 274 |

-continued

| | | | |
|---|---|---|---|
| 10 50 357 393 | 189 298 326 381 | 110 240 245 334 | 67 76 92 104 |
| 35 89 248 252 | 235 317 320 333 | 225 255 278 310 | 19 192 305 344 |
| 6 55 319 345 | 127 301 348 376 | 63 168 170 303 | 23 35 125 224 |
| 107 116 223 271 | 51 286 309 377 | 8 17 255 314 | 152 163 352 385 |
| 168 240 261 384 | 17 70 139 187 | 28 92 98 200 | 40 161 165 329 |
| 54 204 295 351 | 54 180 184 344 | 112 201 244 392 | 113 215 245 378 |
| 3 51 146 299 | 85 311 318 327 | 134 216 344 383 | 80 168 262 382 |
| 74 184 307 361 | 263 312 364 369 | 21 97 115 396 | 81 136 165 239 |
| 9 202 272 387 | 97 149 198 336 | 28 69 120 380 | 2 42 248 323 |
| 106 198 281 329 | 31 141 151 285 | 34 259 267 314 | 111 127 157 330 |
| 36 105 225 236 | 72 163 187 311 | 55 72 87 223 | 79 125 239 341 |
| 90 139 183 299 | 24 54 249 297 | 43 180 185 252 | 147 172 187 397 |
| 152 160 292 354 | 64 143 322 360 | 23 113 133 277 | 230 245 277 352 |
| 11 115 227 236 | 53 73 122 256 | 258 285 347 350 | 49 202 350 381 |
| 152 202 211 373 | 100 138 214 226 | 246 253 318 399 | 34 56 167 242 |
| 4 173 346 374 | 265 348 373 378 | 12 78 90 369 | 36 58 61 83 |
| 132 197 238 279 | 42 62 113 174 | 17 93 96 102 | 107 110 133 251 |
| 16 94 150 222 | 29 313 349 358 | 109 162 318 360 | 100 245 295 330 |
| 241 344 375 386 | 154 179 217 268 | 22 83 151 290 | 16 71 175 397 |
| 31 121 161 231 | 164 289 380 392 | 141 191 240 266 | 106 206 229 236 |
| 9 33 197 350 | 109 165 236 312 | 25 90 138 390 | 177 308 371 387 |
| 87 197 233 312 | 92 141 193 238 | 81 113 265 382 | 89 122 207 362 |
| 100 111 129 368 | 190 243 267 275 | 88 142 210 283 | 3 166 190 305 |
| 184 278 289 346 | 95 143 203 393 | 10 40 43 140 | 155 171 289 336 |
| 76 177 227 356 | 130 213 264 308 | 2 195 268 328 | 34 37 293 301 |
| 11 132 246 314 | 102 133 217 226 | 117 240 257 374 | 143 189 255 338 |
| 46 93 103 309 | 69 88 116 295 | 298 332 350 365 | 38 75 137 166 |
| 62 92 124 366 | 79 181 242 313 | 132 233 270 303 | 88 150 183 380 |
| 73 83 105 136 | 174 254 304 321 | 16 251 266 370 | 230 253 315 373 |
| 69 134 200 366 | 70 129 283 385 | 41 45 60 99 | 53 184 258 263 |
| 179 324 366 386 | 18 79 296 345 | 182 197 276 331 | 17 79 261 286 |
| 72 82 188 192 | 14 25 34 52 | 40 257 262 322 | 94 293 302 397 |
| 100 120 189 375 | 31 88 212 226 | 148 208 332 352 | 170 218 358 376 |
| 244 252 318 329 | 26 53 123 165 | 127 159 253 290 | 61 246 287 292 |
| 3 105 116 203 | 101 108 248 328 | 273 289 325 341 | 61 162 245 303 |
| 280 282 288 365 | 49 115 190 395 | 95 145 231 297 | 25 286 333 355 |
| 38 196 330 369 | 23 119 139 282 | 70 110 225 313 | 159 241 263 354 |
| 20 31 113 381 | 27 206 209 324 | 50 112 166 302 | 134 186 305 327 |
| 56 173 205 390 | 203 221 332 356 | 68 97 128 218 | 33 38 283 301 |
| 2 30 165 366 | 181 190 288 379 | 90 264 269 280 | 17 44 159 398 |
| 41 75 169 302 | 38 73 249 368 | 22 132 258 368 | 108 167 174 374 |
| 210 271 330 334 | 45 49 264 394 | 65 124 129 325 | 90 105 172 257 |
| 60 109 199 348 | 89 112 218 316 | 95 105 111 385 | 93 165 180 353 |
| 27 89 214 388 | 144 186 297 343 | 109 233 250 302 | 137 289 296 386 |
| 77 79 83 289 | 152 177 233 237 | 8 33 80 318 | 241 273 276 359 |
| 119 236 323 383 | 74 171 223 334 | 51 253 281 288 | 44 94 211 286 |
| 1 44 271 372 | 4 16 44 89 | 209 237 346 391 | 166 184 204 226 |
| 25 42 104 215 | 103 165 177 358 | 12 198 221 269 | 98 281 357 389 |
| 144 153 357 362 | 53 217 342 383 | 9 141 229 306 | 41 107 187 298 |
| 133 153 273 383 | 58 88 126 370 | 0 114 219 300 | 19 47 379 399 |
| 152 174 269 355 | 4 214 243 383 | 242 289 318 335 | 1 16 272 296 |
| 107 193 210 320 | 5 96 155 354 | 41 90 163 215 | 107 203 283 322 |
| 194 298 317 331 | 7 61 214 237 | 65 80 99 167 | 77 245 266 390 |
| 22 112 139 222 | 90 241 261 367 | 269 296 303 356 | 29 166 345 364 |
| 147 152 221 365 | 39 161 202 206 | 45 106 232 346 | 61 229 356 361 |
| 20 48 130 353 | 101 132 135 250 | 86 195 293 391 | 70 105 229 250 |
| 58 100 125 172 | 117 191 213 352 | 140 193 245 321 | 268 334 344 368 |
| 78 82 283 393 | 116 328 345 395 | 159 309 314 334 | 46 141 273 298 |
| 7 299 327 334 | 128 159 161 207 | 17 117 315 379 | 157 331 374 385 |
| 47 82 117 126 | 111 306 363 373 | 87 120 206 267 | 172 223 237 258 |
| 86 100 337 379 | 174 256 368 381 | 67 116 188 349 | 15 93 128 250 |
| 299 347 372 375 | 18 104 115 317 | 63 232 338 365 | 94 261 312 341 |
| 150 156 299 302 | 102 115 140 394 | 178 272 327 392 | 167 186 202 372 |
| 145 252 294 377 | 91 96 128 327 | 19 35 204 386 | 8 29 355 393 |
| 155 218 250 392 | 97 99 300 385 | 194 235 289 345 | 36 126 155 373 |
| 131 172 250 278 | 40 150 229 316 | 29 50 154 315 | 145 195 227 333 |
| 17 64 107 195 | 124 315 322 359 | 22 47 353 387 | 45 206 344 369 |
| 26 55 142 181 | 21 221 286 301 | 0 137 143 167 | 8 166 301 397 |
| 106 181 327 342 | 27 88 147 216 | 21 162 195 339 | 11 47 141 184 |
| 101 103 340 368 | 10 124 128 309 | 24 225 233 338 | 7 112 256 377 |
| 44 196 198 280 | 57 131 209 296 | 177 225 232 281 | 108 300 310 312 |
| 39 148 192 385 | 230 237 264 371 | 77 149 241 310 | 208 218 364 378 |
| 37 130 182 207 | 28 118 231 283 | 319 325 363 374 | 53 114 278 291 |
| 57 242 262 316 | 5 114 230 309 | 77 251 308 379 | 131 138 201 365 |
| 20 171 259 396 | 122 189 204 251 | 183 203 290 330 | 225 279 371 378 |
| 257 288 338 361 | 74 151 203 218 | 158 246 275 352 | 122 275 376 395 |
| 12 290 362 367 | 69 270 288 359 | 78 99 210 238 | 169 217 239 357 |
| 153 236 304 330 | 22 49 291 383 | 222 271 380 393 | 18 65 128 288 |
| 12 144 261 329 | 80 90 174 249 | 79 107 201 351 | 6 62 86 198 |

-continued

| | | | |
|---|---|---|---|
| 33 92 106 173 | 182 310 314 318 | 66 90 275 287 | 37 80 119 211 |
| 68 89 159 308 | 115 254 336 399 | 65 219 247 398 | 0 46 139 339 |
| 9 23 41 301 | 42 63 135 343 | 16 203 207 237 | 0 30 216 306 |
| 109 160 278 387 | 46 232 385 391 | 101 216 333 357 | 82 152 277 367 |
| 138 235 241 356 | 24 27 171 183 | 2 39 326 373 | 23 178 350 366 |
| 225 256 321 332 | 237 293 322 352 | 51 151 305 341 | 121 212 243 384 |
| 32 42 253 275 | 81 90 223 363 | 6 25 30 130 | 257 284 326 382 |
| 95 199 219 225 | 71 85 128 380 | 2 91 146 227 | 57 138 311 343 |
| 295 318 322 377 | 181 211 228 339 | 133 176 282 305 | 20 55 131 215 |
| 78 343 373 377 | 62 89 163 295 | 22 187 205 372 | 99 127 231 344 |
| 79 89 131 254 | 43 77 113 143 | 102 160 180 258 | 156 176 301 313 |
| 61 74 304 382 | 125 149 196 218 | 164 197 311 398 | 41 146 247 290 |
| 30 70 168 253 | 83 147 183 279 | 75 119 186 254 | 49 52 61 76 |
| 64 156 306 332 | 62 145 180 397 | 6 15 65 396 | 24 74 310 326 |
| 162 197 255 275 | 84 280 331 360 | 30 108 341 399 | 56 196 212 332 |
| 33 71 91 112 | 114 190 281 359 | 217 276 326 347 | 76 205 335 385 |
| 13 132 247 391 | 69 129 168 187 | 160 237 274 285 | 75 101 209 349 |
| 22 208 226 392 | 119 144 180 249 | 173 248 262 348 | 28 172 242 294 |
| 56 60 158 164 | 7 47 218 308 | 52 65 218 351 | 18 71 267 297 |
| 20 105 120 199 | 217 251 269 390 | 135 140 253 366 | 84 115 233 384 |
| 133 232 236 341 | 189 200 275 372 | 5 81 176 260 | 63 139 216 325 |
| 90 107 293 370 | 157 218 296 363 | 58 215 326 364 | 23 64 310 348 |
| 17 32 254 263 | 52 110 151 319 | 76 87 102 315 | 63 130 188 352 |
| 8 173 238 266 | 30 131 153 174 | 98 131 259 332 | 23 45 160 165 |
| 30 167 169 391 | 28 32 182 198 | 15 30 35 55 | 42 114 382 399 |
| 43 213 328 362 | 56 263 316 328 | 0 122 269 346 | 25 207 339 365 |
| 73 231 244 282 | 87 168 275 343 | 38 162 311 373 | 16 334 374 398 |
| 71 221 245 253 | 24 31 131 148 | 143 313 329 340 | 86 251 274 277 |
| 215 225 258 335 | 166 203 208 231 | 80 260 316 348 | 157 166 297 316 |
| 46 87 263 384 | 126 170 224 369 | 44 158 220 292 | 171 200 230 265 |
| 81 96 282 338 | 20 78 193 213 | 117 241 295 363 | 34 107 325 364 |
| 192 222 306 353 | 123 180 253 323 | 187 321 355 378 | 71 220 227 330 |
| 8 115 292 305 | 208 229 271 386 | 167 226 281 351 | 177 263 277 344 |
| 36 170 186 260 | 1 52 116 383 | 0 200 309 384 | 75 138 262 293 |
| 10 85 212 300 | 13 55 71 106 | 36 171 193 328 | 189 300 366 377 |
| 5 129 198 365 | 7 306 347 364 | 107 178 228 240 | 147 175 296 320 |
| 19 107 153 308 | 145 163 197 228 | 80 146 156 375 | 2 51 145 208 |
| 10 57 98 215 | 66 97 212 320 | 75 90 290 312 | 126 271 310 351 |
| 144 197 277 360 | 90 111 126 301 | 176 342 351 390 | 10 47 192 259 |
| 28 35 115 289 | 113 177 226 273 | 6 45 123 126 | 122 196 210 329 |
| 54 108 270 279 | 96 172 181 218 | 69 241 268 274 | 63 162 235 268 |
| 23 82 144 396 | 17 124 154 373 | 158 324 371 399 | 25 45 218 310 |
| 78 93 95 275 | 87 285 306 376 | 62 232 264 373 | 67 336 354 393 |
| 145 169 211 278 | 83 163 173 299 | 103 106 146 344 | 16 278 347 381 |
| 29 163 300 320 | 65 87 245 333 | 134 268 295 398 | 14 39 209 395 |
| 33 147 219 391 | 161 267 284 293 | 120 220 250 354 | 21 55 85 304 |
| 199 214 265 280 | 1 29 54 379 | 115 208 355 398 | 128 135 194 325 |
| 62 133 156 219 | 141 170 183 232 | 74 190 343 352 | 116 159 258 341 |
| 31 34 72 115 | 5 40 167 238 | 258 325 332 371 | 125 132 210 219 |
| 246 260 267 286 | 15 44 95 239 | 14 256 347 353 | 60 67 150 203 |
| 7 266 309 337 | 13 75 152 188 | 24 33 122 234 | 18 60 167 328 |
| 24 69 142 394 | 216 224 305 331 | 98 272 300 342 | 55 112 179 381 |
| 98 138 228 351 | 29 93 197 381 | 210 221 268 337 | 288 317 324 389 |
| 72 181 336 355 | 21 222 282 284 | 8 94 154 347 | 43 320 334 382 |
| 12 47 160 172 | 175 193 361 372 | 195 285 321 327 | 5 29 145 281 |
| 84 178 230 343 | 54 69 298 308 | 12 51 54 354 | 25 124 232 345 |
| 80 238 321 376 | 93 169 209 328 | 16 41 149 389 | 11 119 339 359 |
| 170 213 331 367 | 39 59 334 391 | 55 66 206 297 | 5 36 231 316 |
| 12 136 274 326 | 108 254 340 376 | 129 202 214 285 | 15 138 354 389 |
| 13 51 96 147 | 141 246 264 388 | 73 96 104 310 | 25 82 136 180 |
| 23 264 334 346 | 96 267 362 392 | 55 200 270 318 | 20 103 167 266 |
| 29 122 183 356 | 131 234 291 330 | 58 120 150 217 | 112 292 359 371 |
| 78 287 330 349 | 4 168 220 235 | 58 279 339 397 | 184 201 240 328 |
| 42 69 131 198 | 130 195 216 367 | 60 180 247 308 | 77 160 307 339 |
| 36 43 189 216 | 108 148 290 302 | 48 127 213 356 | 74 147 280 389 |
| 44 142 195 344 | 85 214 362 395 | 62 128 291 329 | 127 149 358 387 |
| 40 147 260 330 | 48 100 118 346 | 26 35 127 323 | 50 59 117 185 |
| 125 325 379 387 | 91 104 355 358 | 77 144 286 296 | 11 189 212 220 |
| 123 135 226 372 | 91 121 295 324 | 146 187 293 319 | 261 271 290 396 |
| 83 86 149 386 | 3 16 308 340 | 198 219 343 380 | 190 225 298 369 |
| 26 95 121 163 | 143 157 307 395 | 148 188 256 304 | 16 140 227 352 |
| 30 54 178 315 | 36 77 116 340 | 171 189 266 341 | 118 183 262 383 |
| 136 301 341 365 | 3 98 101 125 | 94 108 244 288 | 17 218 260 350 |
| 21 59 265 299 | 39 151 364 377 | 16 42 200 250 | 50 56 278 351 |
| 111 154 282 297 | 194 227 231 267 | 2 64 193 399 | 15 36 150 280 |
| 6 74 290 349 | 59 200 206 389 | 129 172 276 379 | 18 107 151 176 |
| 121 142 174 236 | 21 106 287 389 | 26 176 234 319 | 22 188 244 337 |
| 108 129 152 261 | 33 268 340 387 | 118 135 205 312 | 72 186 302 350 |
| 152 164 205 377 | 140 150 395 398 | 115 176 290 359 | 65 145 221 239 |

-continued

| | | | |
|---|---|---|---|
| 144 281 332 335 | 88 352 360 367 | 9 143 188 374 | 52 117 331 393 |
| 92 244 315 326 | 55 91 145 168 | 96 186 247 353 | 7 37 265 285 |
| 66 128 170 221 | 126 130 181 323 | 30 72 320 388 | 56 283 338 382 |
| 21 109 174 397 | 34 120 227 316 | 17 137 186 193 | 78 217 337 351 |
| 5 154 201 239 | 237 337 355 394 | 34 229 265 284 | 6 247 249 370 |
| 80 183 261 293 | 34 186 219 313 | 129 207 282 287 | 1 161 241 255 |
| 18 143 335 392 | 280 330 340 375 | 68 118 275 305 | 101 166 183 220 |
| 13 139 155 230 | 76 230 354 378 | 153 172 249 307 | 99 198 326 335 |
| 145 156 300 327 | 5 178 293 297 | 106 179 212 378 | 105 234 340 384 |
| 118 153 171 366 | 142 223 234 381 | 22 48 105 347 | 60 233 242 397 |
| 15 152 331 364 | 48 239 260 399 | 98 137 346 379 | 207 215 223 293 |
| 161 171 307 317 | 58 270 336 360 | 41 98 165 232 | 233 279 351 380 |
| 49 56 127 185 | 24 123 271 347 | 54 63 99 123 | 83 106 188 311 |
| 104 168 283 305 | 12 76 137 280 | 81 213 315 394 | 97 185 361 392 |
| 199 202 343 399 | 107 226 302 367 | 38 66 87 191 | 14 26 72 304 |
| 15 164 192 273 | 175 186 208 366 | 71 121 294 396 | 51 162 194 387 |
| 62 199 222 228 | 65 183 369 376 | 109 200 345 375 | 94 245 273 287 |
| 67 94 166 256 | 60 169 292 350 | 33 70 217 266 | 26 177 205 314 |
| 85 227 250 321 | 44 169 240 362 | 11 111 210 240 | 14 92 385 389 |
| 111 211 366 390 | 14 212 392 398 | 131 237 298 384 | 30 110 179 321 |
| 27 71 110 327 | 91 105 300 382 | 103 183 281 286 | 86 133 234 284 |
| 99 257 359 389 | 4 79 232 370 | 5 224 263 358 | 54 58 72 289 |
| 124 295 372 397 | 21 75 158 347 | 197 199 247 382 | 22 145 269 373 |
| 12 43 117 356 | 331 341 343 386 | 18 228 332 344 | 81 172 211 381 |
| 65 117 136 354 | 0 103 163 270 | 16 26 57 68 | 59 246 252 255 |
| 39 67 191 212 | 7 95 171 326 | 2 158 259 384 | 34 113 207 286 |
| 80 166 176 358 | 16 24 49 133 | 128 181 371 398 | 69 100 222 231 |
| 99 208 353 361 | 58 242 363 390 | 98 179 247 319 | 14 150 387 396 |
| 32 46 104 222 | 8 236 254 290 | 41 71 138 326 | 17 73 228 248 |
| 4 25 72 203 | 50 83 140 370 | 175 244 301 317 | 29 193 232 259 |
| 2 124 130 262 | 233 258 340 364 | 81 145 226 371 | 40 148 359 374 |
| 28 113 210 232 | 63 289 292 313 | 125 202 226 309 | 38 281 316 327 |
| 66 77 158 268 | 231 245 336 342 | 115 169 276 298 | 70 87 100 395 |
| 61 98 202 330 | 35 38 246 299 | 192 268 296 391 | 26 231 295 369 |
| 47 67 181 247 | 104 246 249 281 | 31 167 220 223 | 214 234 269 288 |
| 51 204 209 307 | 161 248 285 325 | 39 241 358 382 | 77 154 320 365 |
| 125 198 289 301 | 13 21 192 220 | 67 112 159 236 | 27 76 86 155 |
| 136 214 216 263 | 82 89 200 209 | 71 180 208 266 | 65 139 175 240 |
| 97 270 314 338 | 8 264 313 368 | 59 143 248 394 | 33 130 223 286 |
| 78 127 215 226 | 11 26 242 286 | 99 128 223 388 | 215 271 317 344 |
| 27 242 348 357 | 37 248 303 388 | 6 192 221 351 | 8 47 113 153 |
| 94 181 191 363 | 64 187 324 392 | 129 238 257 378 | 194 233 361 377 |
| 7 91 93 348 | 209 216 230 243 | 29 192 252 392 | 88 202 284 394 |
| 60 193 267 333 | 73 241 250 260 | 6 110 177 269 | 29 118 285 380 |
| 185 237 272 381 | 181 187 235 239 | 29 79 205 241 | 96 154 312 383 |
| 15 52 166 225 | 63 193 300 329 | 233 246 325 331 | 19 250 318 359 |
| 27 100 126 275 | 291 332 354 396 | 11 211 321 384 | 32 282 289 334 |
| 70 96 163 333 | 19 103 260 383 | 144 282 337 386 | 56 272 294 303 |
| 11 175 273 282 | 5 303 328 375 | 33 79 327 385 | 10 68 72 210 |
| 184 261 382 386 | 49 114 243 360 | 38 156 251 280 | 159 276 311 392 |
| 202 204 315 342 | 60 87 303 370 | 130 209 249 266 | 15 42 105 267 |
| 66 102 195 207 | 138 190 248 283 | 43 161 250 322 | 4 23 202 388 |
| 97 243 272 301 | 78 97 139 144 | 7 168 182 185 | 23 61 260 307 |
| 92 128 156 304 | 177 180 244 272 | 15 45 189 286 | 42 124 355 380 |
| 68 313 385 390 | 44 123 243 287 | 191 205 301 305 | 124 259 374 386 |
| 13 32 49 271 | 122 211 304 388 | 155 235 282 299 | 136 140 207 317 |
| 4 80 123 277 | 70 117 278 332 | 40 114 194 372 | 9 278 280 325 |
| 89 135 243 375 | 31 85 343 394 | 249 263 323 372 | 4 19 59 360 |
| 88 372 381 388 | 47 133 244 312 | 36 214 252 380 | 21 79 94 356 |
| 66 108 222 274 | 20 144 299 368 | 176 201 258 373 | 26 158 345 353 |
| 28 59 164 167 | 25 84 335 395 | 102 208 340 379 | 95 172 261 374 |
| 201 204 313 324 | 102 199 213 283 | 85 161 240 262 | 27 119 364 373 |
| 73 311 388 397 | 64 164 169 224 | 5 17 199 339 | 35 245 335 374 |
| 109 186 243 261 | 50 152 224 276 | 150 230 306 341 | 139 162 184 228 |
| 116 125 276 398 | 42 184 390 398 | 46 123 204 318 | 53 84 214 363 |
| 58 185 287 293 | 1 73 349 396 | 71 130 143 271 | 17 153 242 386 |
| 40 203 279 314 | 238 317 354 385 | 208 268 365 396 | 30 137 274 313 |
| 46 50 86 255 | 46 70 296 379 | 257 263 336 395 | 68 169 256 369 |
| 23 48 109 120 | 156 247 278 334 | 218 267 334 360 | 30 119 206 394 |
| 236 297 325 333 | 130 235 319 390 | 53 74 255 302 | 224 325 365 380 |
| 123 155 320 384 | 0 108 120 213 | 104 175 302 311 | 50 178 188 274 |
| 36 67 169 274 | 11 93 146 235 | 228 338 360 369 | 256 169 225 |
| 54 102 191 239 | 96 255 374 376 | 8 35 112 394 | 43 75 167 296 |
| 8 109 198 391 | 85 146 204 366 | 39 130 336 365 | 28 131 274 304 |
| 143 176 238 370 | 146 254 365 391 | 13 170 198 378 | 107 263 309 385 |
| 39 41 105 208 | 114 148 151 373 | 56 156 162 181 | 101 238 310 395 |
| 126 197 342 357 | 60 121 145 343 | 47 95 104 272 | 35 58 238 345 |
| 9 40 191 384 | 112 195 277 296 | 9 291 333 362 | 43 61 106 391 |
| 51 148 207 270 | 29 302 310 334 | 121 128 193 322 | 86 113 161 390 |

-continued

| | | | |
|---|---|---|---|
| 35 316 329 376 | 196 341 352 391 | 17 164 229 252 | 4 81 95 119 |
| 37 161 224 306 | 61 63 333 350 | 27 132 134 179 | 135 138 200 301 |
| 14 53 98 269 | 42 130 307 331 | 173 216 220 247 | 11 32 294 357 |
| 179 207 236 269 | 25 190 224 282 | 246 306 375 384 | 10 73 84 173 |
| 10 163 205 369 | 57 238 375 393 | 75 160 187 263 | 25 48 97 145 |
| 31 92 162 396 | 5 158 186 355 | 171 236 329 389 | 7 223 280 366 |
| 85 268 314 345 | 83 110 385 399 | 58 178 196 380 | 83 137 247 276 |
| 1 31 249 319 | 48 154 166 308 | 171 203 256 370 | 31 56 117 325 |
| 35 56 281 333 | 2 75 288 340 | 5 134 277 330 | 211 281 307 358 |
| 137 199 223 376 | 86 223 248 264 | 110 153 320 336 | 49 118 211 372 |
| 52 320 338 362 | 67 135 158 350 | 24 93 369 383 | 70 179 221 371 |
| 65 224 307 390 | 80 133 345 351 | 35 100 244 361 | 38 260 266 388 |
| 146 310 346 384 | 51 195 265 335 | 327 345 369 396 | 142 222 253 335 |
| 101 138 193 307 | 63 117 159 196 | 27 37 185 277 | 83 88 180 363 |
| 234 314 342 394 | 13 16 37 143 | 257 259 321 362 | 153 371 374 393 |
| 19 109 127 214 | 70 95 306 391 | 23 253 280 370 | 142 161 286 312 |
| 40 80 132 196 | 178 187 249 316 | 13 44 99 224 | 34 111 221 243 |
| 183 213 229 249 | 37 52 162 307 | 57 69 114 224 | 40 66 91 391 |
| 105 228 232 238 | 173 211 237 344 | 70 154 185 352 | 55 120 165 209 |
| 64 278 290 357 | 41 114 210 233 | 34 269 338 367 | 4 28 46 292 |
| 20 116 173 251 | 102 202 287 354 | 77 170 234 326 | 149 222 244 357 |
| 97 261 308 393 | 136 185 223 303 | 138 171 192 269 | 190 339 362 364 |
| 20 100 146 165 | 86 265 287 355 | 173 192 284 371 | 10 67 187 338 |
| 67 84 164 376 | 11 66 131 255 | 68 155 164 353 | 2 132 168 263 |
| 155 260 300 352 | 124 147 319 392 | 4 22 201 212 | 9 63 294 305 |
| 116 118 147 233 | 46 67 152 380 | 206 234 259 270 | 26 60 148 224 |
| 61 174 328 371 | 64 82 111 312 | 35 168 176 389 | 59 157 188 224 |
| 30 60 155 368 | 78 123 264 317 | 103 162 351 370 | 139 220 320 349 |
| 39 142 169 232 | 24 45 85 295 | 49 59 102 212 | 69 202 336 385 |
| 54 76 318 358 | 118 141 244 255 | 155 192 270 287 | 20 92 313 331 |
| 44 79 316 392 | 101 199 253 359 | 173 315 372 382 | 77 136 150 309 |
| 104 177 254 335 | 18 41 259 368 | 41 49 117 320 | 3 121 179 230 |
| 4 199 234 308 | 122 125 185 324 | 45 82 120 133 | 10 104 152 326 |
| 76 139 192 332 | 58 294 318 365 | 6 42 195 295 | 64 134 178 182 |
| 1 252 322 331 | 84 210 216 235 | 171 201 344 377 | 214 300 353 386 |
| 89 217 352 378 | 54 142 147 355 | 94 179 205 344 | 110 254 268 346 |
| 83 156 175 211 | 73 91 174 353 | 32 144 219 315 | 272 304 337 347 |
| 75 132 341 364 | 15 48 292 323 | 226 257 333 386 | 37 165 235 262 |
| 78 106 204 272 | 4 62 67 126 | 24 102 182 375 | 1 36 234 297 |
| 65 159 214 284 | 109 129 191 203 | 49 86 123 175 | 69 281 347 371 |
| 141 161 342 353 | 143 154 168 205 | 62 151 266 298 | 59 264 271 348 |
| 336 375 381 397 | 24 75 127 304 | 272 323 339 367 | 175 255 277 357 |
| 143 260 291 302 | 34 142 182 363 | 99 160 273 330 | 51 97 374 399 |
| 84 298 339 375 | 10 198 303 308 | 194 274 324 368 | 108 223 317 360 |
| 219 234 357 374 | 146 258 273 361 | 51 127 158 191 | 82 125 216 228 |
| 0 118 292 328 | 113 132 220 359 | 2 98 164 393 | 134 154 172 317 |
| 19 119 226 387 | 39 179 252 274 | 90 108 149 315 | 49 65 74 157 |
| 115 167 294 319 | 6 176 199 318 | 8 122 129 299 | 3 112 266 356 |
| 53 222 233 236 | 33 55 95 124 | 8 48 64 210 | 81 204 254 262 |
| 18 52 63 182 | 134 228 283 329 | 56 106 207 240 | 3 113 263 332 |
| 79 102 148 311 | 75 175 339 371 | 48 87 212 340 | 100 151 205 240 |
| 140 270 351 369 | 78 89 202 322 | 38 231 288 394 | 95 125 180 303 |
| 91 255 289 389 | 85 197 310 390 | 137 353 378 393 | 234 292 306 352 |
| 163 285 330 338 | 59 112 305 323 | 119 150 272 355 | 149 227 349 355 |
| 237 251 312 359 | 154 163 287 305 | 64 92 190 291 | 111 142 267 321 |
| 39 186 288 301 | 83 195 206 264 | 4 51 121 215 | 27 203 228 361 |
| 29 188 211 367 | 45 209 255 311 | 119 171 229 253 | 52 277 309 390 |
| 269 298 391 397 | 54 182 261 302 | 65 357 363 370 | 33 57 284 302 |
| 85 95 292 307 | 128 190 241 384 | 83 172 197 280 | 35 50 66 219 |
| 72 150 266 314 | 7 48 66 82 | 27 131 360 396 | 22 27 149 215 |
| 13 28 84 206 | 283 297 340 396 | 85 153 177 222 | 86 129 319 371 |
| 59 108 337 349 | 7 36 307 320 | 120 154 210 237 | 103 127 201 336 |
| 73 171 273 345 | 114 241 271 315 | 0 98 291 388 | 39 50 247 256 |
| 68 140 200 363 | 96 179 249 302 | 32 259 287 333 | 119 165 230 370 |
| 38 111 233 358 | 7 9 170 394 | 184 314 389 397 | 21 82 248 311 |
| 157 289 328 372 | 46 284 308 388 | 101 189 296 383 | 84 137 239 315 |
| 160 188 284 327 | 104 158 332 362 | 126 160 235 240 | 1 155 239 268 |
| 137 304 349 374 | 109 153 189 370 | 111 120 212 288 | 265 278 329 342 |
| 140 168 204 341 | 14 110 338 381 | 10 174 209 291 | 18 118 234 242 |
| 132 223 298 336 | 101 142 257 376 | 112 114 186 239 | 135 189 337 353 |
| 71 114 184 200 | 93 129 359 394 | 164 179 304 346 | 18 28 123 159 |
| 60 135 323 399 | 133 137 142 314 | 90 127 252 284 | 26 44 88 267 |
| 9 38 179 245 | 187 215 269 294 | 53 173 282 333 | 12 50 103 251 |
| 114 157 229 366 | 116 121 300 363 | 82 87 98 354 | 144 242 244 372 |
| 229 297 323 342 | 57 251 267 386 | 77 106 138 345 | 53 181 221 229 |
| 24 36 89 106 | 14 126 335 379 | 74 329 360 366 | 46 89 180 281 |
| 101 134 140 381 | 31 133 250 268 | 167 322 332 395 | 3 53 285 382 |
| 50 148 194 257 | 9 183 241 342 | 52 88 276 294 | 175 184 205 209 |
| 1 222 340 378 | 37 164 279 324 | 47 199 299 391 | 94 208 276 349 |

-continued

| | | | |
|---|---|---|---|
| 67 155 220 365 | 118 130 187 270 | 3 219 275 297 | 14 37 131 266 |
| 15 156 210 262 | 135 169 182 319 | 3 30 375 378 | 135 227 367 392 |
| 53 125 134 231 | 6 149 204 220 | 110 134 158 282 | 13 59 103 207 |
| 192 337 357 360 | 63 150 214 259 | 151 188 359 388 | 48 78 84 243 |
| 170 203 216 266 | 19 65 348 388 | 191 199 304 333 | 94 252 262 306 |
| 2 71 74 362 | 15 46 151 383 | 42 191 274 383 | 168 316 324 380 |
| 40 97 101 356 | 22 160 227 230 | 51 99 384 394 | 196 255 260 394 |
| 54 117 145 201 | 124 166 279 317 | 146 343 367 376 | 11 105 178 243 |
| 34 81 147 326 | 45 130 237 361 | 153 247 284 375 | 19 122 177 339 |
| 5 121 256 311 | 6 189 316 347 | 36 133 204 243 | 64 203 304 319 |
| 14 176 272 383 | 74 135 142 311 | 110 224 265 277 | 12 174 194 208 |
| 46 52 271 377 | 18 19 | 48 49 | 78 79 |
| 62 149 169 353 | 19 20 | 49 50 | 79 80 |
| 133 205 239 387 | 20 21 | 50 51 | 80 81 |
| 174 206 285 292 | 21 22 | 51 52 | 81 82 |
| 14 43 99 137 | 22 23 | 52 53 | 82 83 |
| 87 111 371 377 | 23 24 | 53 54 | 83 84 |
| 73 137 177 261 | 24 25 | 54 55 | 84 85 |
| 10 105 184 352 | 25 26 | 55 56 | 85 86 |
| 126 286 347 390 | 26 27 | 56 57 | 86 87 |
| 72 91 148 196 | 27 28 | 57 58 | 87 88 |
| 12 162 292 363 | 28 29 | 58 59 | 88 89 |
| 6 112 273 399 | 29 30 | 59 60 | 89 90 |
| 0 1 | 30 31 | 60 61 | 90 91 |
| 1 2 | 31 32 | 61 62 | 91 92 |
| 2 3 | 32 33 | 62 63 | 92 93 |
| 3 4 | 33 34 | 63 64 | 93 94 |
| 4 5 | 34 35 | 64 65 | 94 95 |
| 5 6 | 35 36 | 65 66 | 95 96 |
| 6 7 | 36 37 | 66 67 | 96 97 |
| 7 8 | 37 38 | 67 68 | 97 98 |
| 8 9 | 38 39 | 68 69 | 98 99 |
| 9 10 | 39 40 | 69 70 | 99 100 |
| 10 11 | 40 41 | 70 71 | 100 101 |
| 11 12 | 41 42 | 71 72 | 101 102 |
| 12 13 | 42 43 | 72 73 | 102 103 |
| 13 14 | 43 44 | 73 74 | 103 104 |
| 14 15 | 44 45 | 74 75 | 104 105 |
| 15 16 | 45 46 | 75 76 | 105 106 |
| 16 17 | 46 47 | 76 77 | 106 107 |
| 17 18 | 47 48 | 77 78 | 107 108 |
| 108 109 | 138 139 | 168 169 | 198 199 |
| 109 110 | 139 140 | 169 170 | 199 200 |
| 110 111 | 140 141 | 170 171 | 200 201 |
| 111 112 | 141 142 | 171 172 | 201 202 |
| 112 113 | 142 143 | 172 173 | 202 203 |
| 113 114 | 143 144 | 173 174 | 203 204 |
| 114 115 | 144 145 | 174 175 | 204 205 |
| 115 116 | 145 146 | 175 176 | 205 206 |
| 116 117 | 146 147 | 176 177 | 206 207 |
| 117 118 | 147 148 | 177 178 | 207 208 |
| 118 119 | 148 149 | 178 179 | 208 209 |
| 119 120 | 149 150 | 179 180 | 209 210 |
| 120 121 | 150 151 | 180 181 | 210 211 |
| 121 122 | 151 152 | 181 182 | 211 212 |
| 122 123 | 152 153 | 182 183 | 212 213 |
| 123 124 | 153 154 | 183 184 | 213 214 |
| 124 125 | 154 155 | 184 185 | 214 215 |
| 125 126 | 155 156 | 185 186 | 215 216 |
| 126 127 | 156 157 | 186 187 | 216 217 |
| 127 128 | 157 158 | 187 188 | 217 218 |
| 128 129 | 158 159 | 188 189 | 218 219 |
| 129 130 | 159 160 | 189 190 | 219 220 |
| 130 131 | 160 161 | 190 191 | 220 221 |
| 131 132 | 161 162 | 191 192 | 221 222 |
| 132 133 | 162 163 | 192 193 | 222 223 |
| 133 134 | 163 164 | 193 194 | 223 224 |
| 134 135 | 164 165 | 194 195 | 224 225 |
| 135 136 | 165 166 | 195 196 | 225 226 |
| 136 137 | 166 167 | 196 197 | 226 227 |
| 137 138 | 167 168 | 197 198 | 227 228 |
| 228 229 | 258 259 | 288 289 | 318 319 |
| 229 230 | 259 260 | 289 290 | 319 320 |
| 230 231 | 260 261 | 290 291 | 320 321 |
| 231 232 | 261 262 | 291 292 | 321 322 |
| 232 233 | 262 263 | 292 293 | 322 323 |
| 233 234 | 263 264 | 293 294 | 323 324 |
| 234 235 | 264 265 | 294 295 | 324 325 |
| 235 236 | 265 266 | 295 296 | 325 326 |

-continued

| | | | |
|---|---|---|---|
| 236 237 | 266 267 | 296 297 | 326 327 |
| 237 238 | 267 268 | 297 298 | 327 328 |
| 238 239 | 268 269 | 298 299 | 328 329 |
| 239 240 | 269 270 | 299 300 | 329 330 |
| 240 241 | 270 271 | 300 301 | 330 331 |
| 241 242 | 271 272 | 301 302 | 331 332 |
| 242 243 | 272 273 | 302 303 | 332 333 |
| 243 244 | 273 274 | 303 304 | 333 334 |
| 244 245 | 274 275 | 304 305 | 334 335 |
| 245 246 | 275 276 | 305 306 | 335 336 |
| 246 247 | 276 277 | 306 307 | 336 337 |
| 247 248 | 277 278 | 307 308 | 337 338 |
| 248 249 | 278 279 | 308 309 | 338 339 |
| 249 250 | 279 280 | 309 310 | 339 340 |
| 250 251 | 280 281 | 310 311 | 340 341 |
| 251 252 | 281 282 | 311 312 | 341 342 |
| 252 253 | 282 283 | 312 313 | 342 343 |
| 253 254 | 283 284 | 313 314 | 343 344 |
| 254 255 | 284 285 | 314 315 | 344 345 |
| 255 256 | 285 286 | 315 316 | 345 346 |
| 256 257 | 286 287 | 316 317 | 346 347 |
| 257 258 | 287 288 | 317 318 | 347 348 |
| 348 349 | 362 363 | 376 377 | 390 391 |
| 349 350 | 363 364 | 377 378 | 391 392 |
| 350 351 | 364 365 | 378 379 | 392 393 |
| 351 352 | 365 366 | 379 380 | 393 394 |
| 352 353 | 366 367 | 380 381 | 394 395 |
| 353 354 | 367 368 | 381 382 | 395 396 |
| 354 355 | 368 369 | 382 383 | 396 397 |
| 355 356 | 369 370 | 383 384 | 397 398 |
| 356 357 | 370 371 | 384 385 | 398 399 |
| 357 358 | 371 372 | 385 386 | 399. |
| 358 359 | 372 373 | 386 387 | |
| 359 360 | 373 374 | 387 388 | |
| 360 361 | 374 375 | 388 389 | |
| 361 362 | 375 376 | 389 390 | |

20. The article of claim 19, wherein:

said wireless signal is an orthogonal frequency division multiplexing (OFDM) signal.

21. The article of claim 19, wherein said instructions, when executed by the computing platform, further operate to:

access a storage medium having at least a portion of said parity check matrix stored thereon before matrix multiplying.

22. The article of claim 19, wherein:

said first portion of said parity check matrix is a portion that includes columns of said parity check matrix having a column weight of 4.

23. The article of claim 19, wherein:

said parity check matrix defines a (2000, 1600) LDPC code.

* * * * *

UNITED STATES PATENT AND TRADEMARK OFFICE

CERTIFICATE OF CORRECTION

PATENT NO. : 7,665,008 B2
APPLICATION NO. : 10/815133
DATED : February 16, 2010
INVENTOR(S) : Xia et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1015 days.

Signed and Sealed this

Twenty-eighth Day of December, 2010

David J. Kappos

*Director of the United States Patent and Trademark Office*